(12) United States Patent
Chen et al.

(10) Patent No.: US 12,733,533 B2
(45) Date of Patent: Sep. 8, 2026

(54) INTEGRATED CIRCUIT PACKAGE AND METHOD OF FORMING THEREOF

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Ying-Ju Chen, Tuku Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 244 days.

(21) Appl. No.: 18/356,538

(22) Filed: Jul. 21, 2023

(65) Prior Publication Data

US 2024/0021554 A1 Jan. 18, 2024

Related U.S. Application Data

(62) Division of application No. 17/361,924, filed on Jun. 29, 2021, now Pat. No. 11,862,590.

(Continued)

(51) Int. Cl.
*H01L 25/065* (2023.01)
*H01L 21/56* (2006.01)
(Continued)

(52) U.S. Cl.
CPC ............ *H01L 24/08* (2013.01); *H01L 21/565* (2013.01); *H01L 24/80* (2013.01);
(Continued)

(58) Field of Classification Search
CPC ....... H01L 24/08; H01L 21/565; H01L 24/80; H01L 25/0652; H01L 25/0657; H01L 25/18; H01L 25/50; H01L 2224/08145; H01L 2224/80895; H01L 2224/80896; H01L 2225/06541; H01L 2924/1431; H01L 2924/1434; H01L 23/3128
See application file for complete search history.

(56) References Cited

U.S. PATENT DOCUMENTS

2018/0190638 A1 7/2018 Chen et al.
2018/0254260 A1 9/2018 Wei et al.
(Continued)

FOREIGN PATENT DOCUMENTS

CN 108695176 A 10/2018
DE 102017124071 A1 3/2019
(Continued)

*Primary Examiner* — Thanh Y. Tran
(74) *Attorney, Agent, or Firm* — Slater Matsil, LLP

(57) ABSTRACT

A semiconductor package includes a redistribution structure, a first device and a second device attached to the redistribution structure, the first device including: a first die, a support substrate bonded to a first surface of the first die, and a second die bonded to a second surface of the first die opposite the first surface, where a total height of the first die and the second die is less than a first height of the second device, and where a top surface of the substrate is at least as high as a top surface of the second device, and an encapsulant over the redistribution structure and surrounding the first device and the second device.

20 Claims, 55 Drawing Sheets

Related U.S. Application Data

(60) Provisional application No. 63/174,622, filed on Apr. 14, 2021.

(51) Int. Cl.

| | |
|---|---|
| ***H01L 23/00*** | (2006.01) |
| ***H01L 25/00*** | (2006.01) |
| ***H01L 25/18*** | (2023.01) |

(52) U.S. Cl.

CPC ...... *H01L 25/0652* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06541* (2013.01); *H01L 2225/06586* (2013.01); *H01L 2225/06589* (2013.01); *H01L 2924/1431* (2013.01); *H01L 2924/1434* (2013.01)

(56) References Cited

U.S. PATENT DOCUMENTS

| | | | |
|---|---|---|---|
| 2018/0294212 | A1 | 10/2018 | Chen et al. |
| 2019/0067152 | A1 | 2/2019 | Wuu et al. |
| 2019/0259695 | A1* | 8/2019 | Gandhi ............... H01L 25/0652 |
| 2020/0303341 | A1 | 9/2020 | Kim et al. |
| 2020/0402877 | A1 | 12/2020 | Yu et al. |
| 2020/0411473 | A1 | 12/2020 | Chen et al. |
| 2021/0043608 | A1 | 2/2021 | Yu et al. |
| 2021/0057332 | A1 | 2/2021 | Chen et al. |
| 2021/0082894 | A1 | 3/2021 | Chen et al. |
| 2021/0151388 | A1* | 5/2021 | Choi ................. H01L 23/49838 |
| 2021/0225750 | A1 | 7/2021 | Yu et al. |
| 2021/0366878 | A1 | 11/2021 | Byun et al. |
| 2021/0375827 | A1 | 12/2021 | Chen et al. |

FOREIGN PATENT DOCUMENTS

| | | | |
|---|---|---|---|
| KR | 20180054440 | A | 5/2018 |
| KR | 20200069064 | A | 6/2020 |

* cited by examiner 259
252
262
260
254
251
253

280
256
253
254
259
252
262
252
276
222
258
260
254
253
H8

INTEGRATED CIRCUIT PACKAGE AND METHOD OF FORMING THEREOF

PRIORITY CLAIM AND CROSS-REFERENCE

This application is a divisional of U.S. application Ser. No. 17/361,924, filed on Jun. 29, 2021, which claims priority to U.S. Provisional Application No. 63/174,622, filed on Apr. 14, 2021 and entitled "Semiconductor Package and Manufacturing Method Thereof," which applications are hereby incorporated by reference herein as if reproduced in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
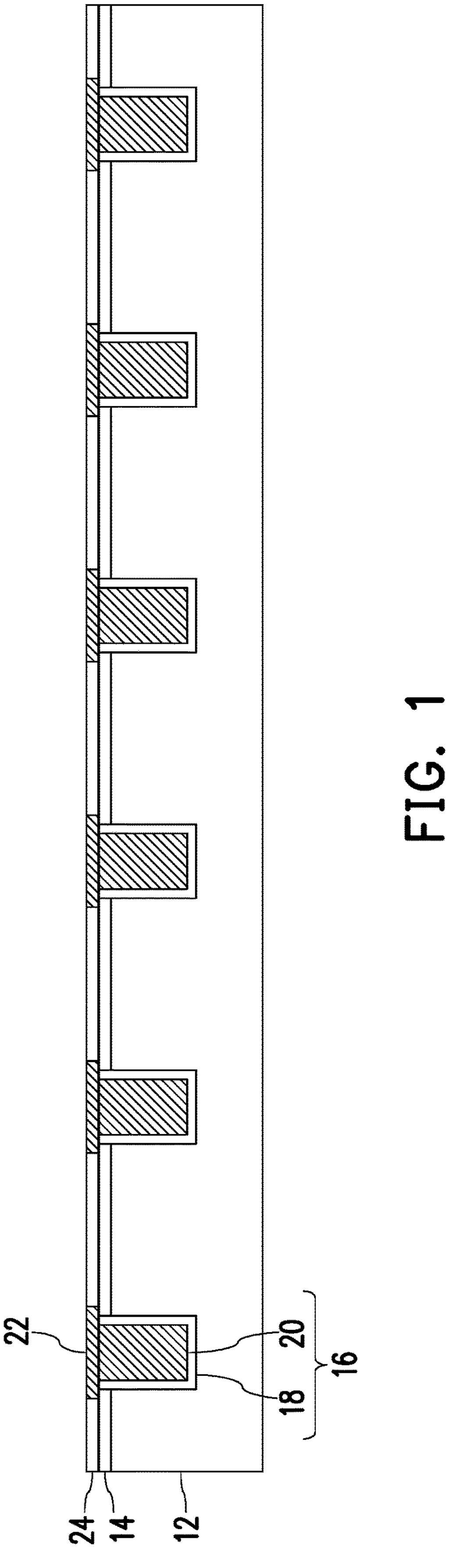
FIG. 1 illustrates a cross-sectional view of an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods applied to, but not limited to, the formation of an integrated circuit package that includes a first integrated circuit device bonded to a second integrated circuit device (e.g., to form a logic device), and a memory device. A total thickness of the first integrated circuit device and the second integrated circuit device is smaller than a thickness of the memory device, and the integrated circuit package further includes a support substrate over the first integrated circuit device and the second integrated circuit device. The total thickness of the first integrated circuit device, the second integrated circuit device and the support substrate is equal to or greater than the thickness of the memory device. Advantageous features of one or more embodiments disclosed herein may include allowing for a more even surface that can be used to implement thermal solutions (e.g. a heat spreader may be attached to top surfaces of the support substrate and the memory device) and help improve heat dissipation efficiency in the integrated circuit package. In addition, the support substrate used can be of any thickness to accommodate different types of memory devices that may have different thicknesses.

FIG. 1 is a cross-sectional view of an integrated circuit device 10, in accordance with some embodiments. The integrated circuit device 10 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. The integrated circuit device 10 is formed in a wafer (not shown), which includes different device regions. In some embodiments, multiple wafers will be stacked to form a wafer stack, which is singulated in subsequent processing to form multiple die stacks. In some embodiments, a wafer is singulated to form a plurality of integrated circuit devices 10, which are stacked in subsequent processing to form multiple die stacks. The integrated circuit device 10 may be processed according to applicable manufacturing processes to form integrated circuits. For example, the integrated circuit device 10 may include a semiconductor substrate 12, an interconnect structure 14, conductive vias 16, die connectors 22, and a dielectric layer 24.

The semiconductor substrate 12 may be silicon, doped or undoped, or an active layer of a semiconductor-on-insulator (SOI) substrate. The semiconductor substrate 12 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 12 has an active surface (e.g., the surface facing upwards in FIG. 1), sometimes called a front side, and an inactive surface (e.g., the surface facing downwards in FIG. 1), sometimes called a back side.

Devices may be formed at the active surface of the semiconductor substrate 12. The devices may be active devices (e.g., transistors, diodes, etc.), capacitors, resistors, etc. The inactive surface may be free from devices. An inter-layer dielectric (ILD) is over the active surface of the semiconductor substrate 12. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

The interconnect structure 14 is over the active surface of the semiconductor substrate 12. The interconnect structure 14 interconnects the devices at the active surface of the semiconductor substrate 12 to form an integrated circuit. The interconnect structure 14 may be formed by, for example, metallization patterns in dielectric layers. The metallization patterns include metal lines and vias formed in one or more dielectric layers. The metallization patterns of the interconnect structure 14 are electrically coupled to the devices at the active surface of the semiconductor substrate 12.

The conductive vias 16 are formed extending into the interconnect structure 14 and/or the semiconductor substrate 12. The conductive vias 16 are electrically coupled to metallization patterns of the interconnect structure 14. As an example to form the conductive vias 16, recesses can be formed in the interconnect structure 14 and/or the semiconductor substrate 12 by, for example, etching, milling, laser techniques, a combination thereof, and/or the like. A thin dielectric material may be formed in the recesses, such as by using an oxidation technique. A barrier layer 18 may be conformally deposited in the openings, such as by CVD, atomic layer deposition (ALD), physical vapor deposition (PVD), thermal oxidation, a combination thereof, and/or the like. The barrier layer 18 may be formed from an oxide, a nitride, or an oxynitride, such as titanium nitride, titanium oxynitride, tantalum nitride, tantalum oxynitride, tungsten nitride, a combination thereof, and/or the like. A conductive material 20 may be deposited over the barrier layer 18 and in the openings. The conductive material 20 may be formed by an electro-chemical plating process, CVD, PVD, a combination thereof, and/or the like. Examples of conductive materials are copper, tungsten, aluminum, silver, gold, a combination thereof, and/or the like. Excess of the conductive material 20 and the barrier layer 18 is removed from the surface of the interconnect structure 14 and/or the semiconductor substrate 12 by, for example, a chemical-mechanical polish (CMP). Remaining portions of the barrier layer 18 and the conductive material 20 form the conductive vias 16.

In the embodiment illustrated, the conductive vias 16 are not yet exposed at the back side of the integrated circuit device 10. Rather, the conductive vias 16 are buried in the semiconductor substrate 12. As will be discussed in greater detail below, the conductive vias 16 will be exposed at the back side of the integrated circuit device 10 in subsequent processing. After exposure, the conductive vias 16 can be referred to as through-silicon vias or through-substrate vias (TSVs).

The die connectors 22 are at a front side of the integrated circuit device 10. The die connectors 22 may be conductive pillars, pads, or the like, to which external connections are made. The die connectors 22 are in and/or on the interconnect structure 14. The die connectors 22 can be formed of a metal, such as copper, titanium, aluminum, the like, or a combination thereof, and can be formed by, for example, plating, or the like.

The dielectric layer 24 is at the front side of the integrated circuit device 10. The dielectric layer 24 is in and/or on the interconnect structure 14. The dielectric layer 24 laterally encapsulates the die connectors 22, and the dielectric layer 24 is laterally coterminous (within process variations) with sidewalls of the integrated circuit device 10. The dielectric layer 24 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 24 may be formed, for example, by spin coating, lamination, chemical vapor deposition (CVD), or the like. In some embodiments, the dielectric layer 24 is formed after the die connectors 22, and may bury the die connectors 22 such that the top surface of the dielectric layer 24 is above the top surfaces of the die connectors 22. In some embodiments, the die connectors 22 after formed after the dielectric layer 24, such as by a damascene process, e.g., single damascene, dual damascene, or the like. After formation, the die connectors 22 and the dielectric layer 24 can be planarized using, e.g., a CMP process, an etch back process, the like, or combinations thereof. After planarization, the top surfaces of the die connectors 22 and dielectric layer 24 are coplanar (within process variations) and are exposed at the front side of the integrated circuit device 10. In another embodiment, the die connectors 22 are formed after the dielectric layer 24, such as by a plating process, and are raised connectors (e.g., microbumps) such that the top surfaces of the die connectors 22 extend above the top surface of the dielectric layer 24.

FIGS. 2A through 2F are cross-sectional views of intermediate steps during a process for forming a memory cube 50, in accordance with some embodiments. Unless specified otherwise, like reference numerals in FIGS. 2A through 2F (as well as subsequent Figures) represent like components in the embodiment shown in FIG. 1 formed by like processes. Accordingly, the process steps and applicable materials may not be repeated herein. As will be discussed in greater detail below, FIGS. 2A through 2F illustrate a process in which a memory cube 50 is formed by stacking multiple wafers that include first integrated circuit devices on a carrier substrate 52. The first integrated circuit devices may each have a structure similar to the integrated circuit device 10 discussed above with reference to FIG. 1, and in an embodiment may be memory devices. Subsequently, the first integrated circuit devices may also be referred to as memory devices 11. Stacking of wafers to form a memory cube 50 in one device region 52A of the carrier substrate 52 is illustrated, but it should be appreciated that the carrier substrate 52 may have any number of device regions, and a memory cube 50 may be formed in each device region. The memory cube 50 is formed in a top-down (or reverse) manner by wafer-on-wafer (WoW) stacking, where a wafer for the top layer of the memory cube 50 is provided, and wafers for underlying layers of the memory cube 50 are subsequently stacked on the top wafer. The wafer stack is singulated to form multiple memory cubes 50. The memory cubes 50 are tested after formation to reduce or prevent subsequent processing of known bad memory cubes 50.

Subsequently, the memory cube 50 may be used in the formation of a high bandwidth memory (HBM) device 100 (shown subsequently in FIG. 3D). Specifically, as will be discussed in greater detail below, the memory cube 50 can be further stacked on a second integrated circuit device to form a HBM device. The second integrated circuit device may have a structure similar to the integrated circuit device 10 discussed above with reference to FIG. 1, and in an embodiment may be a logic device. Subsequently, the second integrated circuit device may be referred to as logic device 13.

Figure 2A:
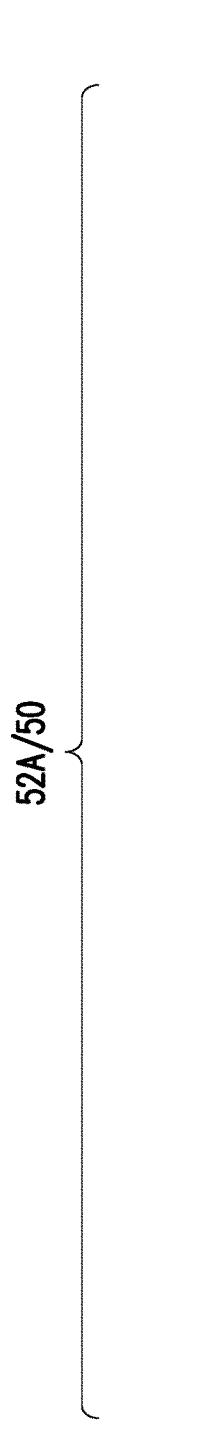
FIGS. 2A through 2F illustrate cross-sectional views of intermediate steps during a process for forming a memory cube, in accordance with some embodiments.
Figure 2A:
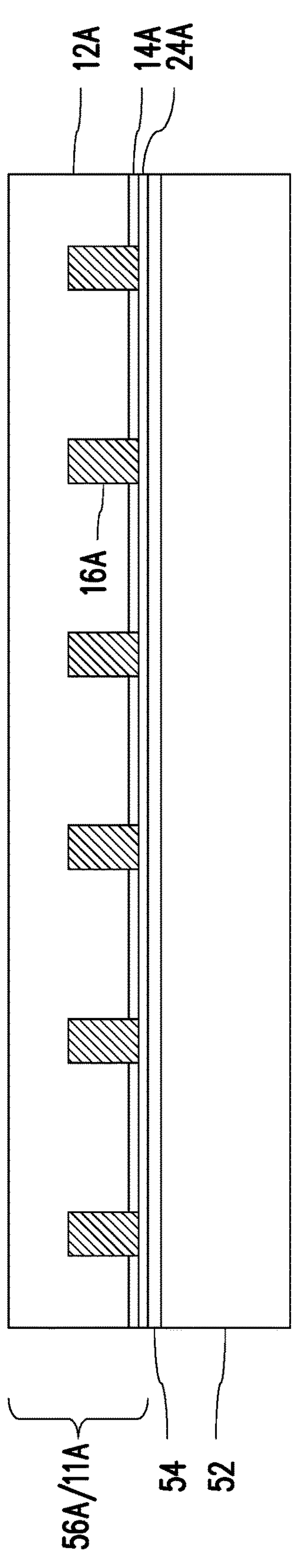

In FIG. 2A, a carrier substrate 52 is provided, and a release layer 54 is formed on the carrier substrate 52. The carrier substrate 52 may be a glass carrier substrate, a ceramic carrier substrate, or the like. The carrier substrate 52 may be a wafer, such that multiple memory cubes 50 can be formed on the carrier substrate 52 simultaneously.

The release layer 54 may be formed of a polymer-based material, which may be removed along with the carrier substrate 52 from the overlying structures that will be formed in subsequent steps. In some embodiments, the release layer 54 is an epoxy-based thermal-release material, which loses its adhesive property when heated, such as a light-to-heat-conversion (LTHC) release coating. In other embodiments, the release layer 54 may be an ultra-violet (UV) glue, which loses its adhesive property when exposed to UV lights. The release layer 54 may be dispensed as a liquid and cured, may be a laminate film laminated onto the carrier substrate 52, or may be the like. The top surface of the release layer 54 may be leveled and may have a high degree of planarity.

A wafer 56A is stacked on the carrier substrate 52. The wafer 56A comprises multiple integrated circuit devices, such as a memory device 11A in the device region 52A. The memory device 11A will be singulated in subsequent processing to be included in the memory cube 50. The memory device 11A includes a semiconductor substrate 12A, an interconnect structure 14A, conductive vias 16A, and a dielectric layer 24A, but does not include die connectors in the dielectric layer 24A at this step of processing. The wafer 56A is stacked face-down on the carrier substrate 52 so that a major surface of the dielectric layer 24A faces/contacts the carrier substrate 52. As will be discussed in greater detail below, the memory cube 50 is attached to another integrated circuit device after singulation. Reflowable connectors are used to attach the memory cube 50 to the other integrated circuit device. In some embodiments, die connectors may be formed in the dielectric layer 24A (see below, FIG. 2E). The die connectors are formed after wafer stacking is completed, to prevent damage to the die connectors during wafer stacking.

Figure 2B:
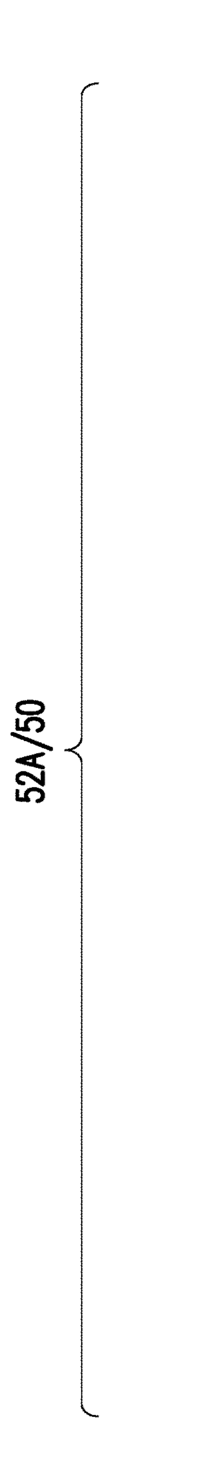
Figure 2B:
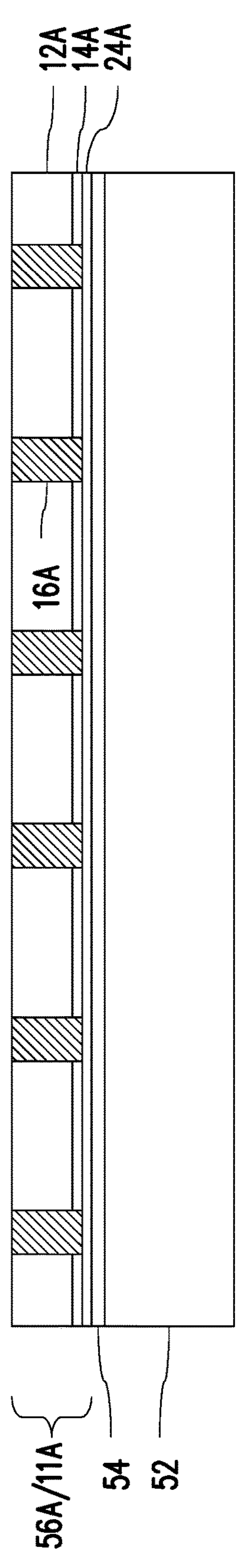

In FIG. 2B, the wafer 56A is thinned. The thinning may be by a CMP process, a grinding process, an etch back process, the like, or combinations thereof, and is performed on the inactive surface of the semiconductor substrate 12A. The thinning exposes the conductive vias 16A. After the thinning, surfaces of the conductive vias 16A and the inactive surface of the semiconductor substrate 12A are coplanar (within process variations). As such, the conductive vias 16A are exposed at the back side of the memory device 11A.

Figure 2C:
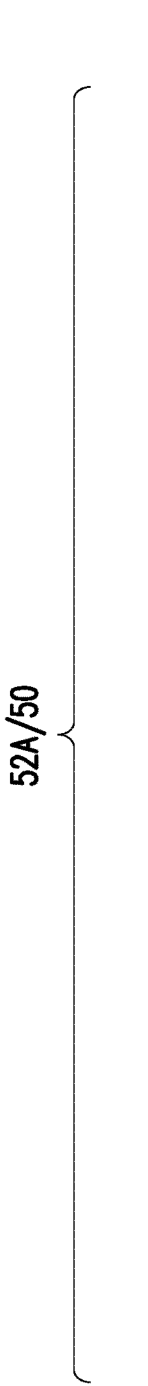
Figure 2C:
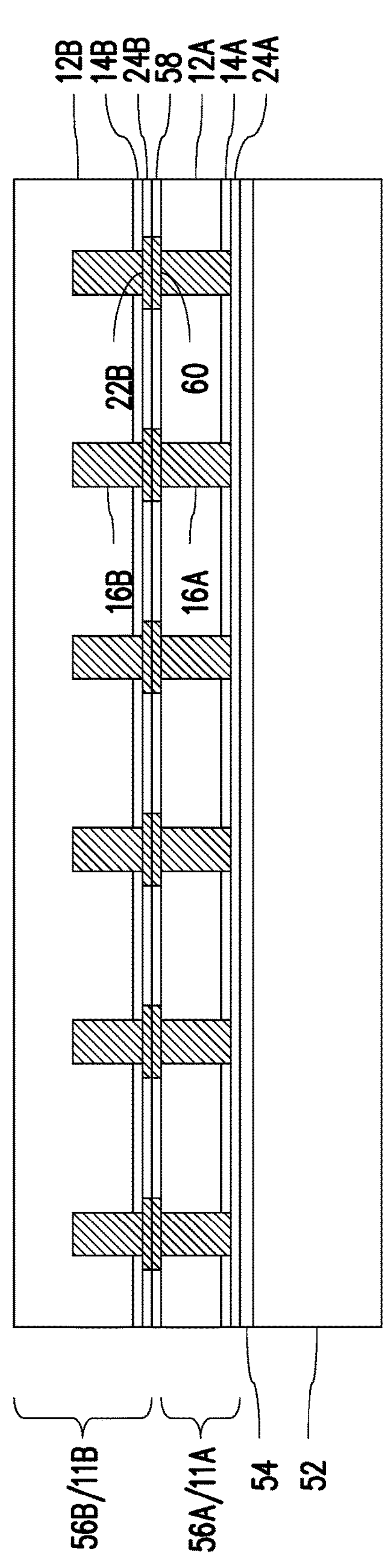

In FIG. 2C, a wafer 56B is stacked over the carrier substrate 52. In particular, the front side of the wafer 56B is attached to the back side of the wafer 56A. The wafer 56B comprises multiple integrated circuit devices, such as a memory device 11B in the device region 52A. The memory device 11B will be singulated in subsequent processing to be included in the memory cube 50. The memory device 11B includes a semiconductor substrate 12B, an interconnect structure 14B, conductive vias 16B, die connectors 22B, and a dielectric layer 24B.

The wafer 56A and the wafer 56B are back-to-face bonded, e.g., are directly bonded in a back-to-face manner by hybrid bonding, such that the back side of the wafer 56A is bonded to the front side of the wafer 56B. Specifically, dielectric-to-dielectric bonds and metal-to-metal bonds are formed between the wafer 56A and the wafer 56B. In the illustrated embodiment, a dielectric layer 58 and die connectors 60 are formed at the back side of the wafer 56A and are used for hybrid bonding.

The dielectric layer 58 is formed at the back side of the wafer 56A, such as on the semiconductor substrate 12A. The dielectric layer 58 is laterally coterminous (within process variations) with sidewalls of the memory device 11A. The dielectric layer 58 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 58 may be formed, for example, by spin coating, lamination, chemical vapor deposition (CVD), or the like. In some embodiments (discussed in greater detail below), the semiconductor substrate 12A is recessed before forming the dielectric layer 58 so that the dielectric layer 58 surrounds the conductive vias 16A.

The die connectors 60 are formed at the back side of the wafer 56A, and are in physical contact with the conductive vias 16A. The die connectors 60 may be conductive pillars, pads, or the like, to which external connections are made. The die connectors 60 can be formed of a metal, such as copper, aluminum, or the like, and can be formed by, for example, plating, or the like. The die connectors 60 are electrically connected to integrated circuits of the memory device 11A by the conductive vias 16A. After formation, the dielectric layer 58 and the die connectors 60 are planarized using, e.g., a CMP process, an etch back process, the like, or combinations thereof. After planarization, the top surfaces of the die connectors 60 and dielectric layer 58 are coplanar (within process variations) and are exposed at the back side of the wafer 56A.

The dielectric layer 58 is bonded to the dielectric layer 24B through dielectric-to-dielectric bonding, without using any adhesive material (e.g., die attach film), and the die connectors 60 are bonded to the die connectors 22B through metal-to-metal bonding, without using any eutectic material (e.g., solder). The bonding may include a pre-bonding and an annealing. During the pre-bonding, a small pressing force is applied to press the wafer 56B against the wafer 56A. The pre-bonding is performed at a low temperature, such as room temperature, such as a temperature in the range of 15° C. to 30° C., and after the pre-bonding, the dielectric layer 24B and the dielectric layer 58 are bonded to each other. The bonding strength is then improved in a subsequent annealing step, in which the dielectric layer 24B and the dielectric layer 58 are annealed at a high temperature, such as a temperature in the range of 140° C. to 500° C. After the annealing, bonds, such as fusions bonds, are formed bonding the dielectric layer 24B and the dielectric layer 58. For example, the bonds can be covalent bonds between the material of the dielectric layer 58 and the material of the dielectric layer 24B. The die connectors 22B and the die connectors 60 are connected to each other with a one-to-one correspondence. The die connectors 22B and the die connectors 60 may be in physical contact after the pre-bonding, or may expand to be brought into physical contact during the annealing. Further, during the annealing, the material of the die connectors 22B and the die connectors 60 (e.g., copper) intermingles, so that metal-to-metal bonds are also formed. Hence, the resulting bonds between the wafer 56A and the wafer 56B are hybrid bonds that include both dielectric-to-dielectric bonds and metal-to-metal bonds.

In another embodiment, the die connectors 60 are omitted. The dielectric layer 58 is bonded to the dielectric layer 24B through dielectric-to-dielectric bonding, without using any adhesive material (e.g., die attach film), and the conductive vias 16A are bonded to the die connectors 22B through metal-to-metal bonding, without using any eutectic material (e.g., solder).

In yet another embodiment, the dielectric layer 58 and the die connectors 60 are omitted. The semiconductor substrate 12A may be bonded to the dielectric layer 24B through dielectric-to-dielectric bonding, without using any adhesive material (e.g., die attach film), and the conductive vias 16A may be bonded to the die connectors 22B through metal-to-metal bonding, without using any eutectic material (e.g., solder). For example, an oxide, such as a native oxide, a thermal oxide, or the like, may be formed on the inactive surface of the semiconductor substrate 12A, and may be used for the dielectric-to-dielectric bonding.

Figure 2D:
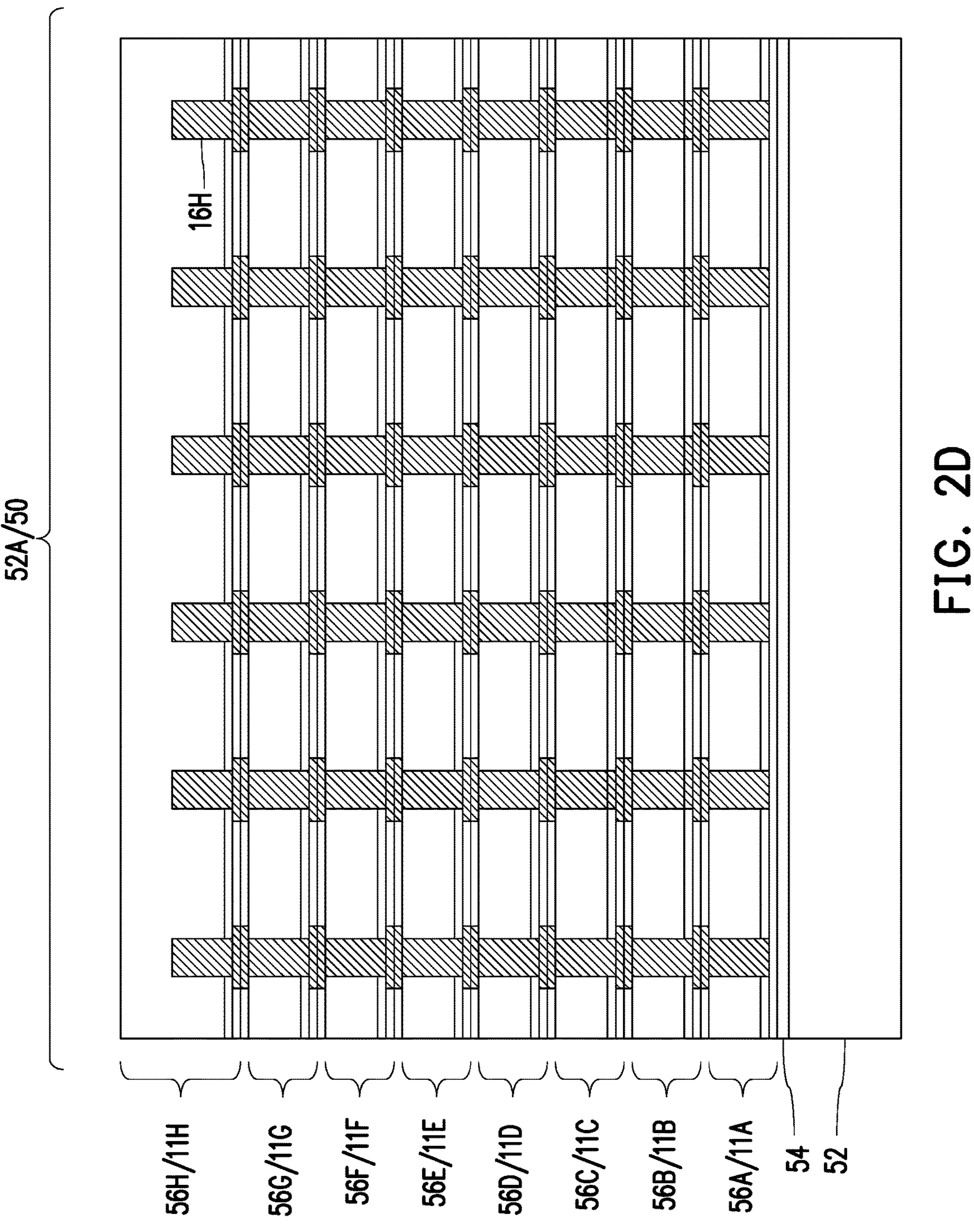

In FIG. 2D, the steps described above are repeated so that wafers 56C, 56D, 56E, 56F, 56G, 56H are stacked over the carrier substrate 52. The wafers 56C, 56D, 56E, 56F, 56G, 56H each comprise multiple integrated circuit devices, such as, respectively, memory devices 11C, 11D, 11E, 11F, 11G, 11H in the device region 52A. The memory devices 11C, 11D, 11E, 11F, 11G, 11H will be singulated in subsequent processing to be included in the memory cube 50. Each of the wafers 56C, 56D, 56E, 56F, 56G, 56H is directly bonded to, respectively, the wafers 56B, 56C, 56D, 56E, 56F, 56G in a back-to-face manner by hybrid bonding. The last wafer that is stacked, e.g., the wafer 56H, may not be thinned, such that conductive vias 16H of the wafer 56H remain electrically insulated.

Figure 2E:
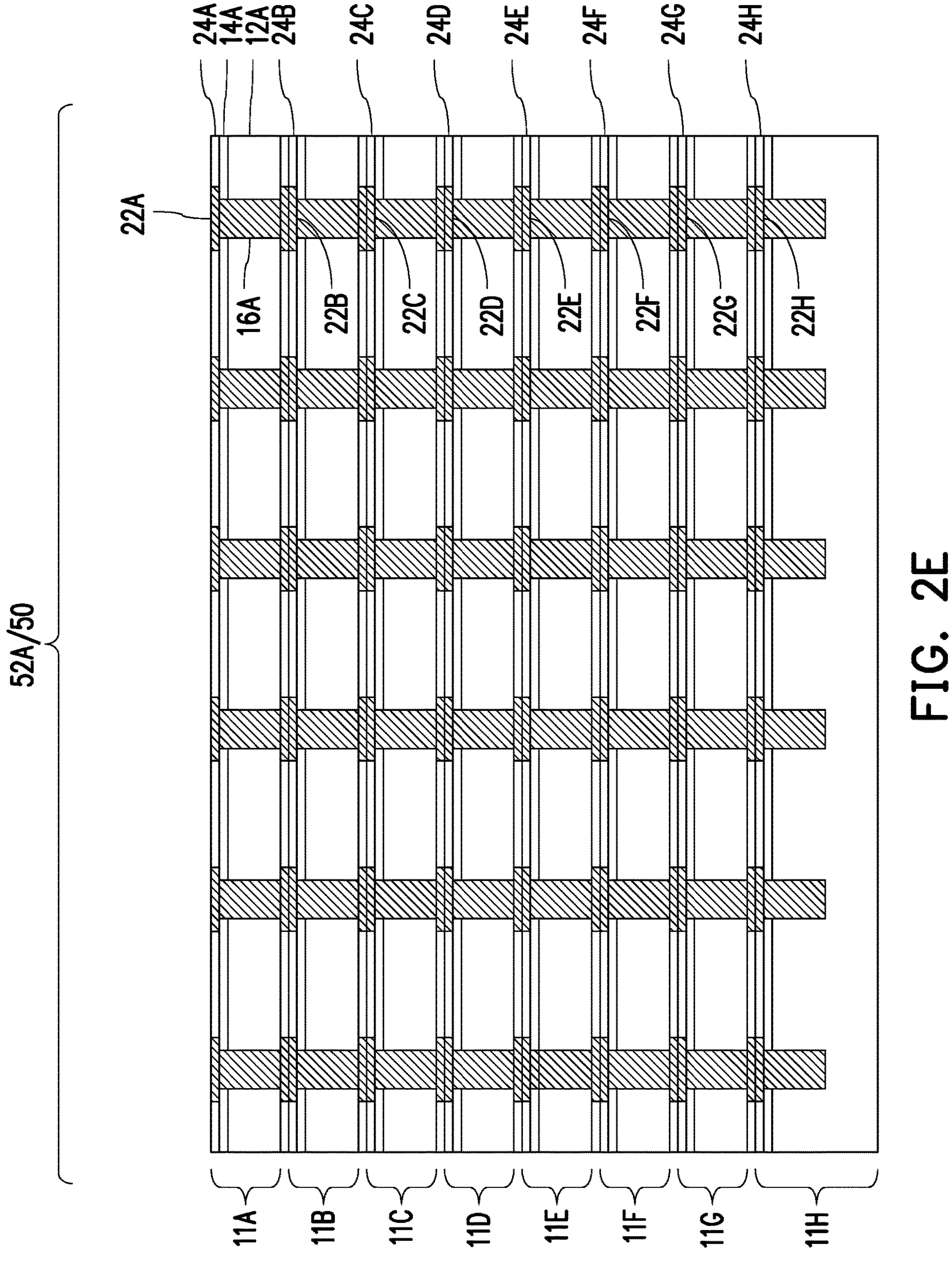

In FIG. 2E, a carrier substrate debonding is performed to detach (or "debond") the carrier substrate 52 from the wafer stack, e.g., the wafer 56A. In accordance with some embodiments, the debonding includes projecting a light such as a laser light or an UV light on the release layer 54 so that the release layer 54 decomposes under the heat of the light and the carrier substrate 52 can be removed. Removing the carrier substrate 52 exposes the major surface of the upper memory device (e.g., the memory device 11A) of the memory cube 50. The wafer stack is then flipped over and placed on a tape (not shown).

Die connectors 22A are then formed for the top layer of the memory cube 50, e.g., at a front side of the wafer 56A. The die connectors 22A are used to subsequently connect the memory cube to another device such as e.g. a wafer 102 (see below, FIG. 3C). The die connectors 22A may be formed of a similar material and by a similar method as the die connectors 60 as described above in respect to FIG. 2C. The die connectors 60 are electrically connected to integrated circuits of the memory device 11A by the conductive vias 16A. After formation, the dielectric layer 24A and the die connectors 22A are planarized using, e.g., a CMP process, an etch back process, the like, or combinations thereof. After planarization, the top surfaces of the die connectors 22A and dielectric layer 24A are coplanar (within process variations) and are exposed at the front side of the wafer 56A.

Figure 2F:
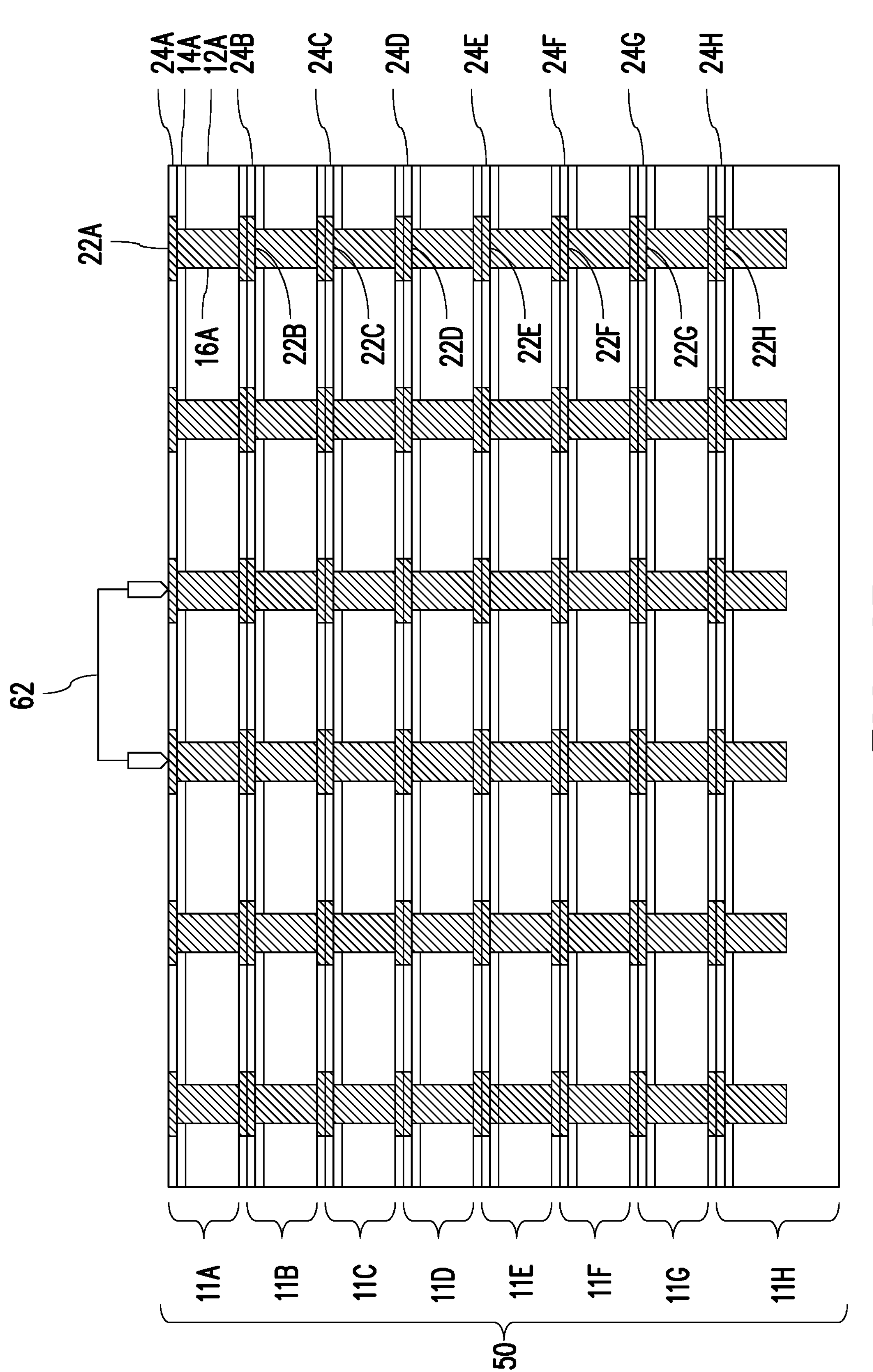

In FIG. 2F, a singulation process is performed along scribe line regions, e.g., between the device region 52A and adjacent device regions. The singulation may be by sawing, laser cutting, or the like. The singulation process can be performed before or after the die connectors 22A are formed. The singulation separates the device region 52A from adjacent device regions. The resulting, singulated memory cube 50 is from the device region 52A. The memory devices of the memory cube 50 are laterally coterminous (within process variations) after singulation.

It should be appreciated that the memory cube 50 may include any number of layers. In the embodiment shown, the memory cube 50 includes eight layers. In another embodiment, the memory cube 50 includes more or less than eight layers, such as two layers, four layers, sixteen layers, thirty two layers, or the like.

After formation of the memory cube 50 is complete (e.g., after formation of the die connectors 22A and singulation of the memory cube 50), the resulting memory cube 50 is tested by use of a probe 62. The probe 62 is physically and electrically connected to the die connectors 22A. The die connectors 22A are used to test the memory cube 50, such that only known good memory cubes are used for further processing. The testing may include testing of the functionality of the memory devices 11A, 11B, 11C, 11D, 11E, 11F, 11G, 11H, or may include testing for known open or short circuits that may be expected based on the design of the memory devices. During the testing, all of the memory devices of the memory cube 50 may be tested in a daisy-chain manner.

FIGS. 3A through 3D are cross-sectional views of intermediate steps during a process for forming a HBM device 100, in accordance with some embodiments. As will be discussed in greater detail below, FIGS. 3A through 3D illustrate a process in which the HBM device 100 is formed by stacking the memory cube 50 on a second integrated circuit device (e.g., the logic device 13L, see FIG. 3A). The second integrated circuit device is a bare die, which can be formed in a wafer 102. Formation of the HBM device 100 in one device region 102A of the wafer 102 is illustrated, but it should be appreciated that the wafer 102 may have any number of device regions, and a HBM device 100 may be formed in each device region.

Figure 3A:
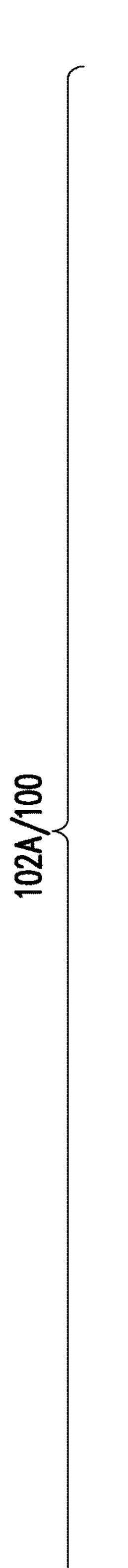
FIGS. 3A through 3D illustrate cross-sectional views of intermediate steps during a process for forming a HBM device, in accordance with some embodiments.
Figure 3A:
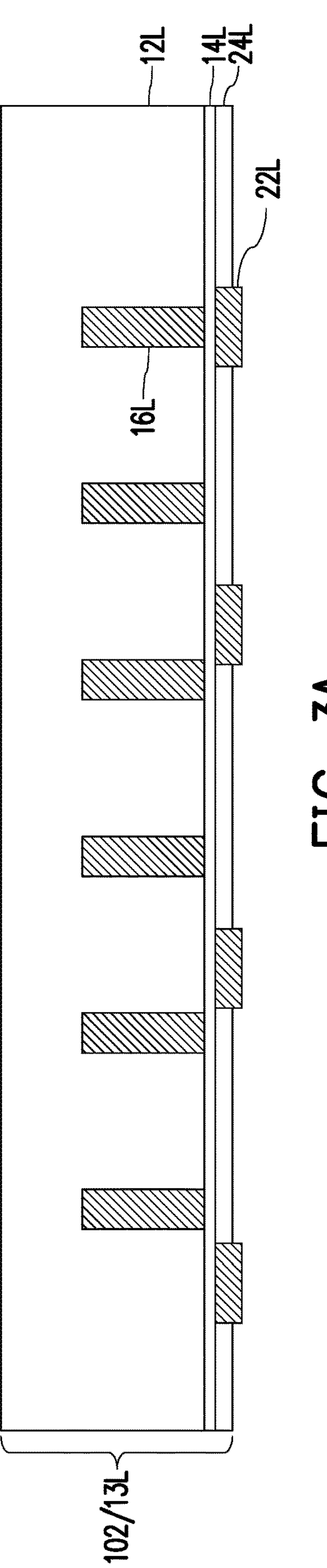

In FIG. 3A the wafer 102 is obtained. The wafer 102 comprises a logic device 13L in the device region 102A. The logic device 13L will be singulated in subsequent processing to be included in the HBM device 100. The logic device 13L can be an interface device, buffer device, controller device, or the like for the memory devices of the memory cube 50. In some embodiments, the logic device 13L provides the input/output (I/O) interface for the HBM device 100. The logic device 13L includes a semiconductor substrate 12L, an interconnect structure 14L, conductive vias 16L, die connectors 22L, and a dielectric layer 24L.

The die connectors 22L are used for connections to other devices, such as devices in an integrated circuit package in which the HBM device 100 can be implemented. In some embodiments, the die connectors 22L are conductive bumps that are suitable for use with reflowable connectors, such as microbumps, extending through the dielectric layer 24L. The die connectors 22L may have substantially vertical sidewalls (within process variations). In the illustrated embodiment, the die connectors 22L are formed through the dielectric layer 24L to couple the metallization patterns of the interconnect structure 14L. As an example to form the die connectors 22L, openings are formed in the dielectric layer 24L, and a seed layer is formed over the dielectric layer 24L and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the die connectors 22L. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the die connectors 22L.

Figure 3B:
Figure 3B:
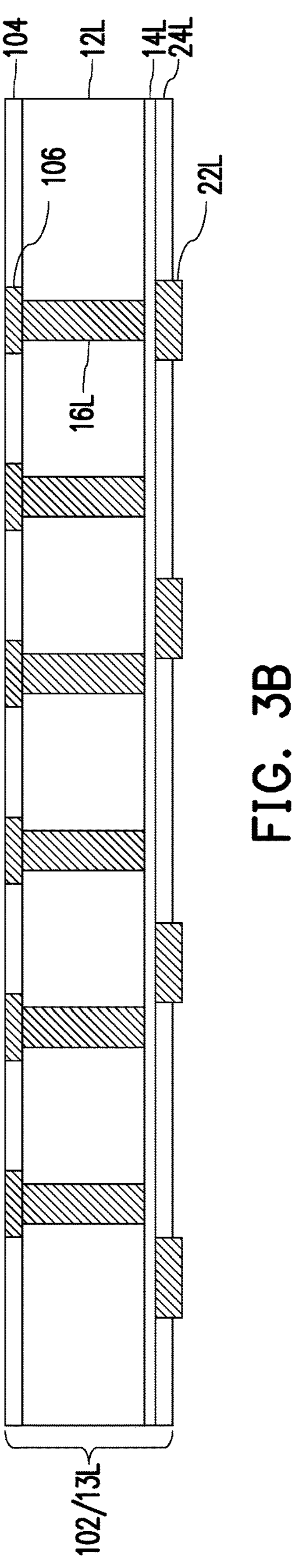

In FIG. 3B, the wafer 102 is thinned. The thinning may be by a CMP process, a grinding process, an etch back process, the like, or combinations thereof, and is performed on the inactive surface of the semiconductor substrate 12L. The thinning exposes the conductive vias 16L. After the thinning, surfaces of the conductive vias 16L and the inactive surface of the semiconductor substrate 12L are coplanar (within process variations). As such, the conductive vias 16L are exposed at the back side of the logic device 13L.

A dielectric layer 104 is then formed over the wafer 102, e.g., at the back side of the logic device 13L. The dielectric layer 104 may be formed of a similar material and by a similar method as the dielectric layer 58 described with respect to FIG. 2C. Die connectors 106 are then formed extending through the dielectric layer 104. The die connectors 106 may be formed of a similar material and by a similar method as the die connectors 22A described with respect to FIG. 2E. For example, the die connectors 106 may be conductive pillars, pads, or the like that are suitable for use with metal-to-metal bonding, without using any eutectic material (e.g., solder). The die connectors 106 are physically connected to the conductive vias 16L, and are electrically connected to integrated circuits of the logic device 13L by the conductive vias 16L.

Figure 3C:
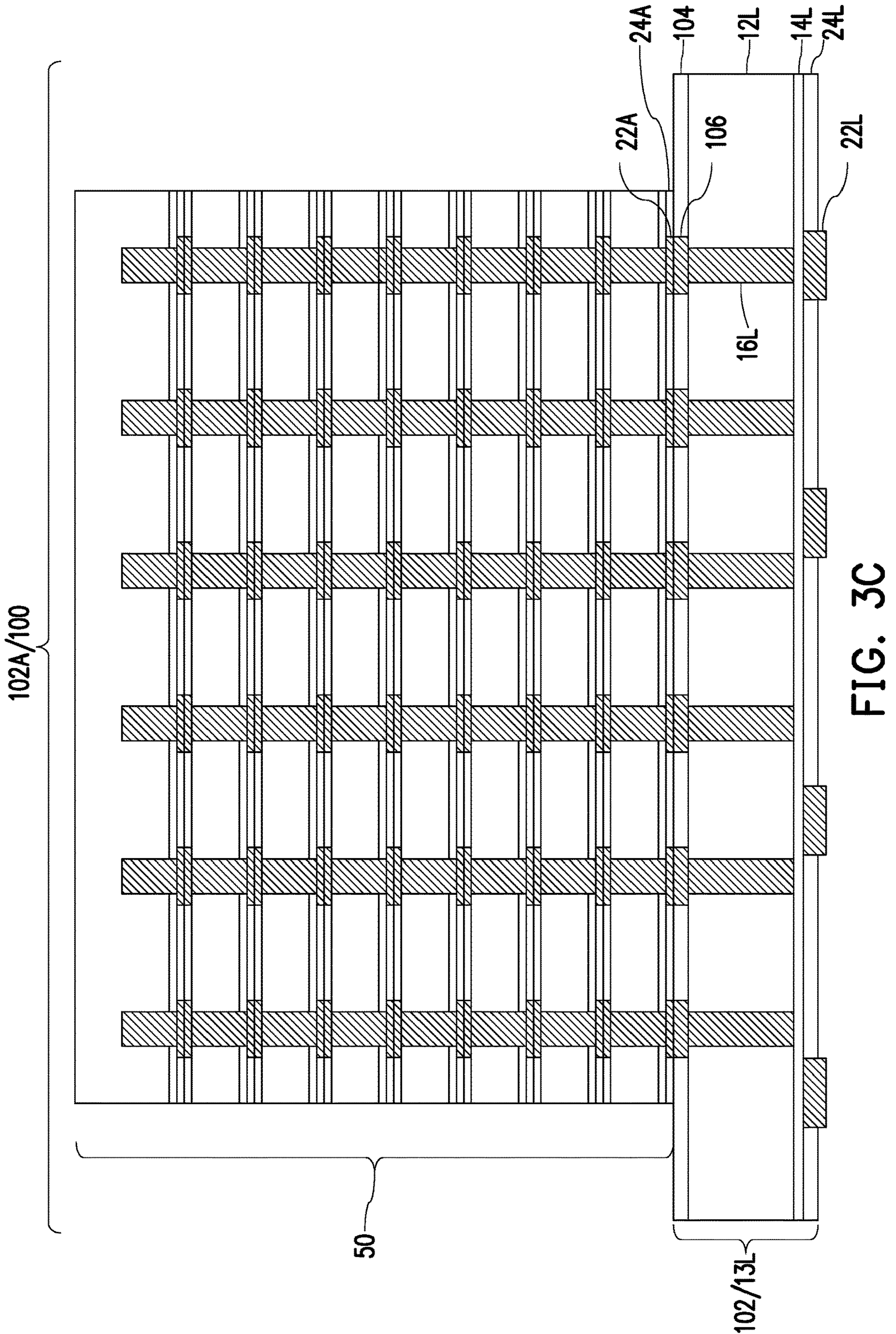

In FIG. 3C, a memory cube 50 is attached to the wafer 102, e.g., to the back side of the logic device 13L. The wafer 102 and the memory cube 50 are back-to-face bonded, e.g., are directly bonded in a back-to-face manner by hybrid bonding, such that the back side of the wafer 102 is bonded to the front side of the memory cube 50. Specifically, dielectric-to-dielectric bonds are formed between the dielectric layer 104 of the wafer 102 and the dielectric layer 24A of the memory cube 50, and metal-to-metal bonds are formed between the die connectors 106 of the wafer 102 and the die connectors 22A of the memory cube 50. The hybrid bonding of the wafer 102 and the memory cube 50 may be performed using similar methods as described above for the hybrid bonding of the wafer 56A and the wafer 56B in respect to FIG. 2C.

Figure 3D:
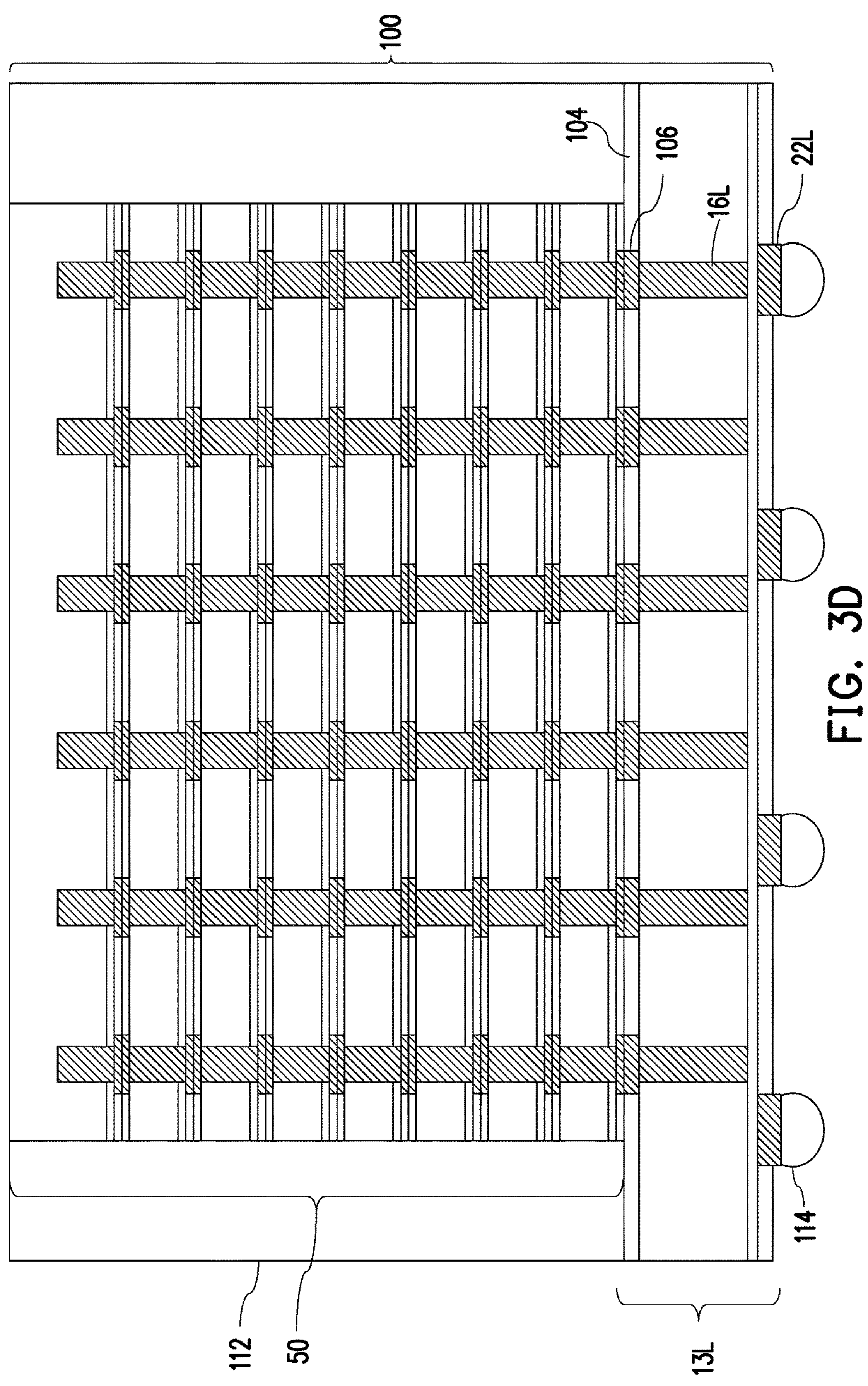

In FIG. 3D, an encapsulant 112 is formed on and around the various components. After formation, the encapsulant 112 encapsulates the memory cube 50 and contacts a top surface of the dielectric layer 104 and each memory device of the memory cube 50. The encapsulant 112 may be a molding compound, epoxy, or the like. The encapsulant 112 may be applied by compression molding, transfer molding, or the like, and may be formed over the wafer 102 such that the memory cube 50 is buried or covered. The encapsulant 112 may be applied in liquid or semi-liquid form and then subsequently cured. A planarization process is optionally performed on the encapsulant 112 to expose the memory cube 50. After the planarization process, top surfaces of the memory cube 50 and the encapsulant 112 are coplanar (within process variations). The planarization process may be, for example, a chemical-mechanical polish (CMP), a grinding process, or the like. In some embodiments, the planarization may be omitted, for example, if the memory cube 50 is already exposed.

A singulation process is then performed along scribe line regions, e.g., around the device region 102A. The singulation may be by sawing, laser cutting, or the like. The singulation process separates the device region 102A (comprising the logic device 13L) from adjacent device regions to form an HBM device 100 comprising the logic device 13L. The singulated logic device 13L has a greater width than each memory device of the memory cube 50. After singulation, the logic device 13L and the encapsulant 112 are laterally coterminous (within process variations).

Conductive connectors 114 are formed on the die connectors 22L. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may include a conductive material such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 114 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 114 may be formed before or after the singulation process. The conductive connectors 114 will be used for external connection (discussed further below).

Figure 4A:
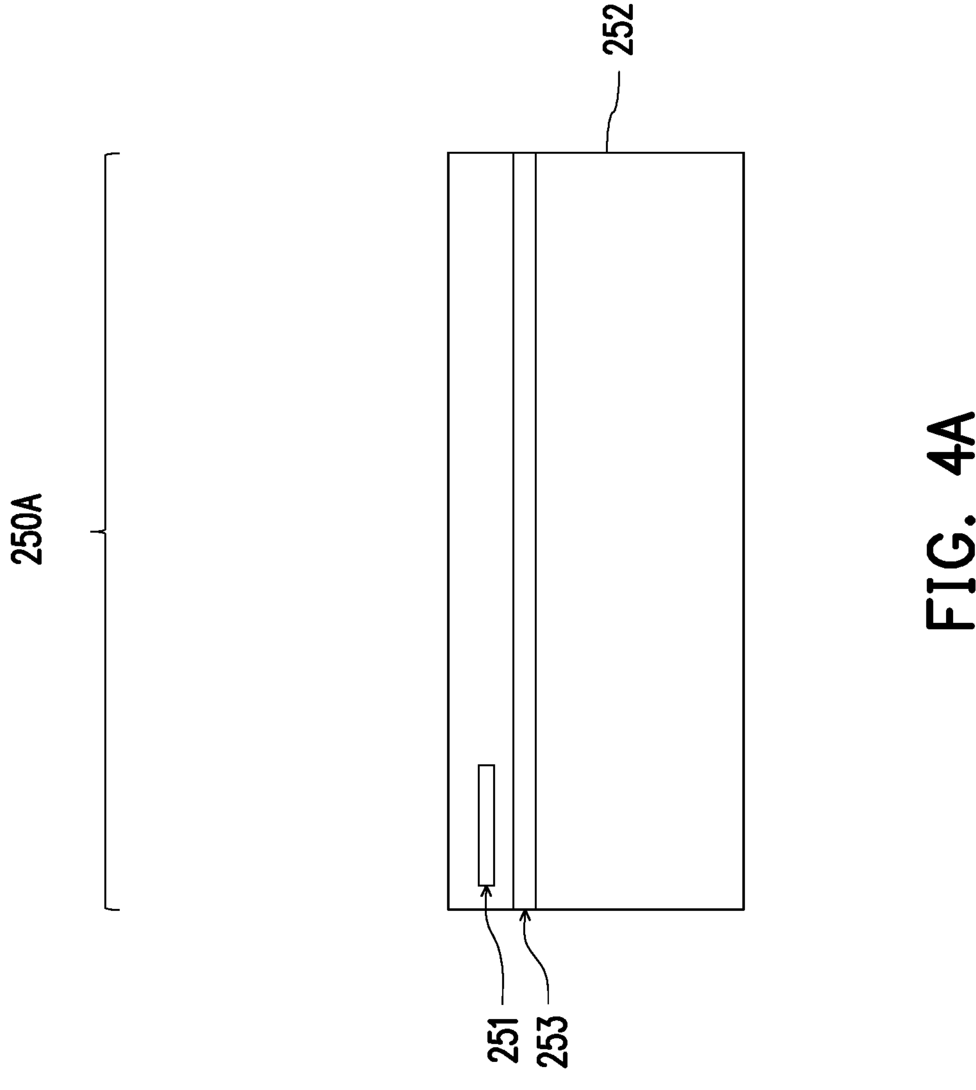
FIGS. 4A through 4I are cross-sectional views of intermediate steps during a process for forming an integrated circuit package 1000, in accordance with some embodiments.
Figure 4B:
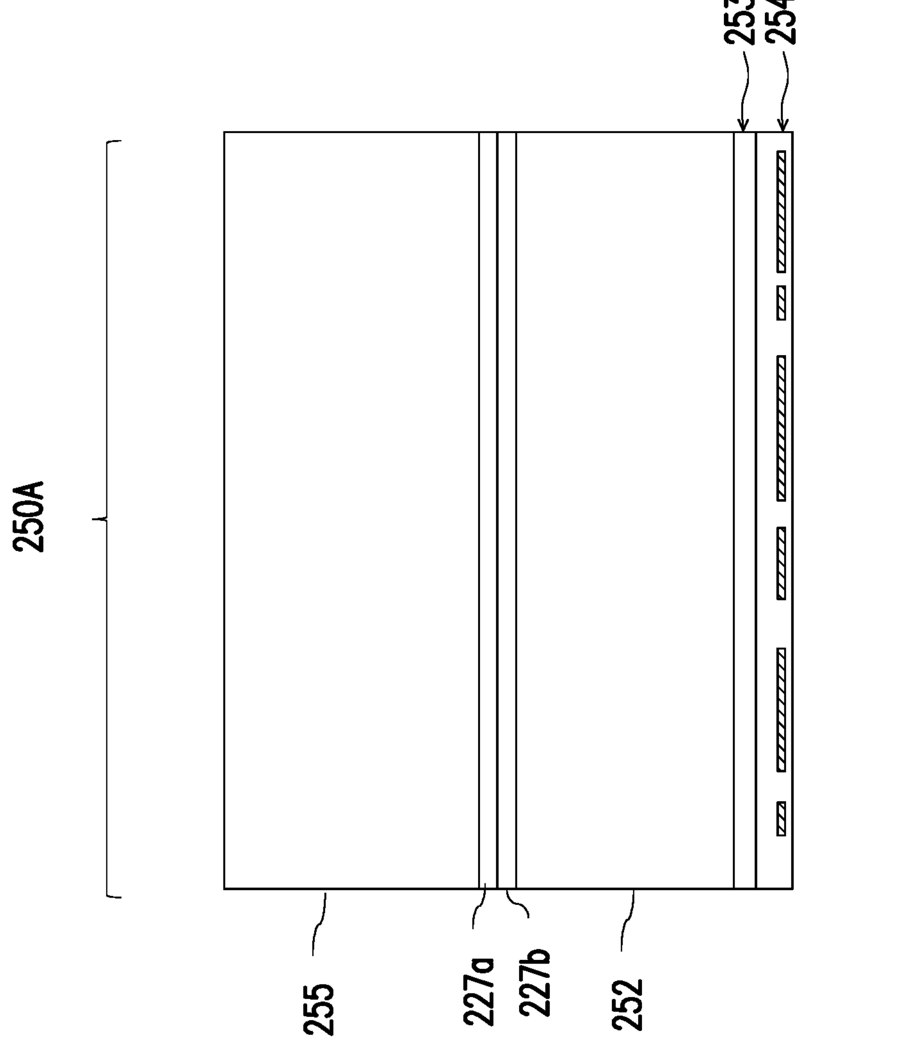
Figure 4C:
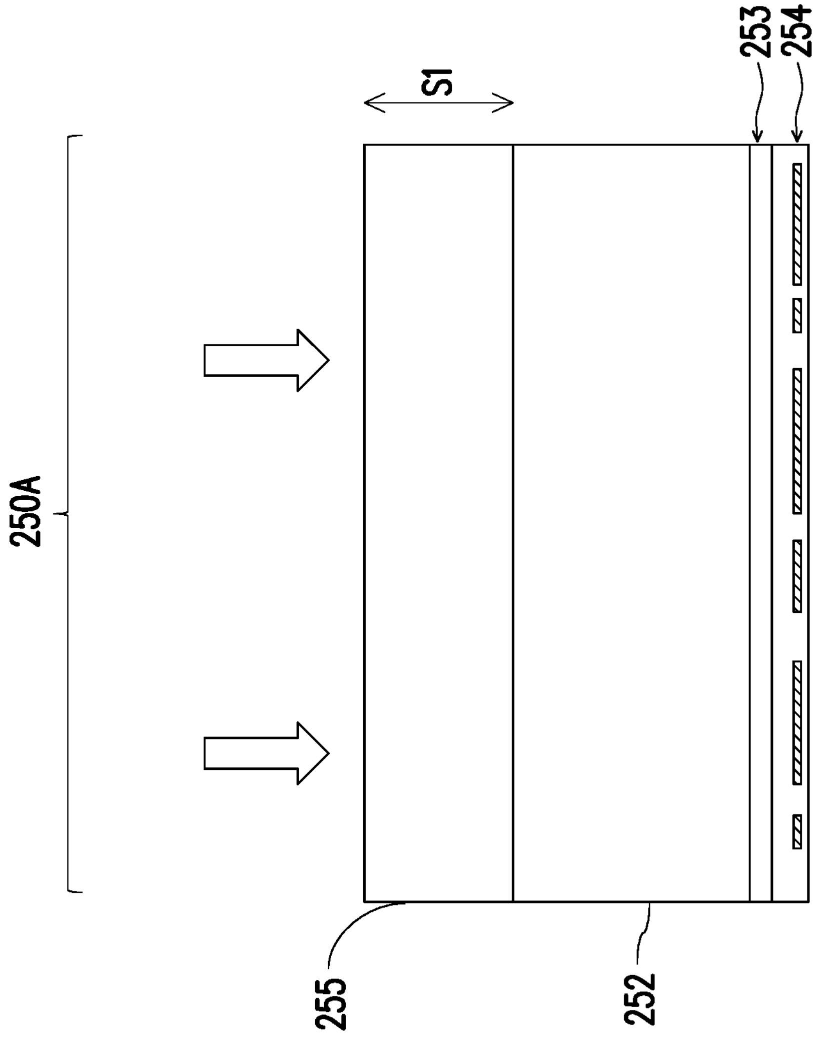
Figure 4D:
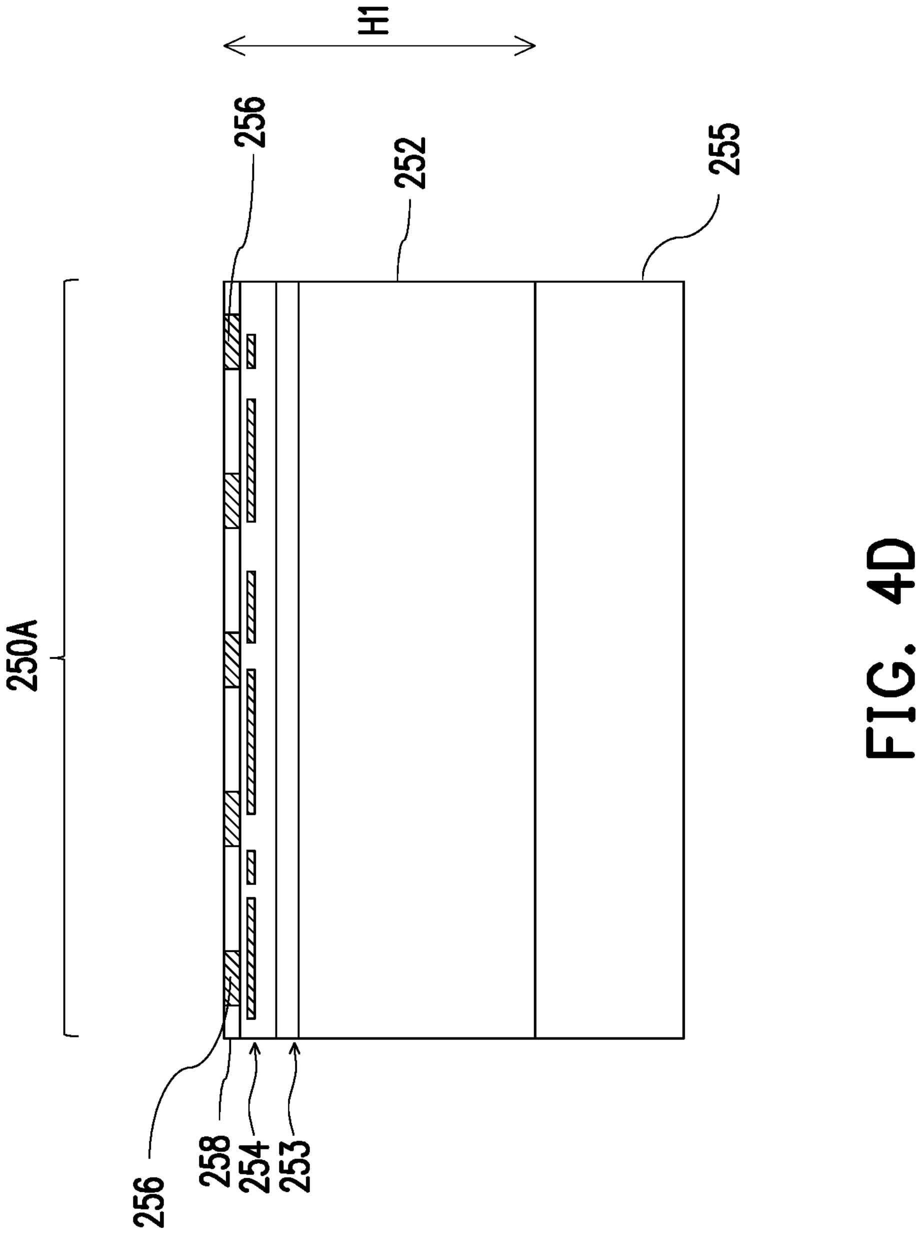
Figure 4E:
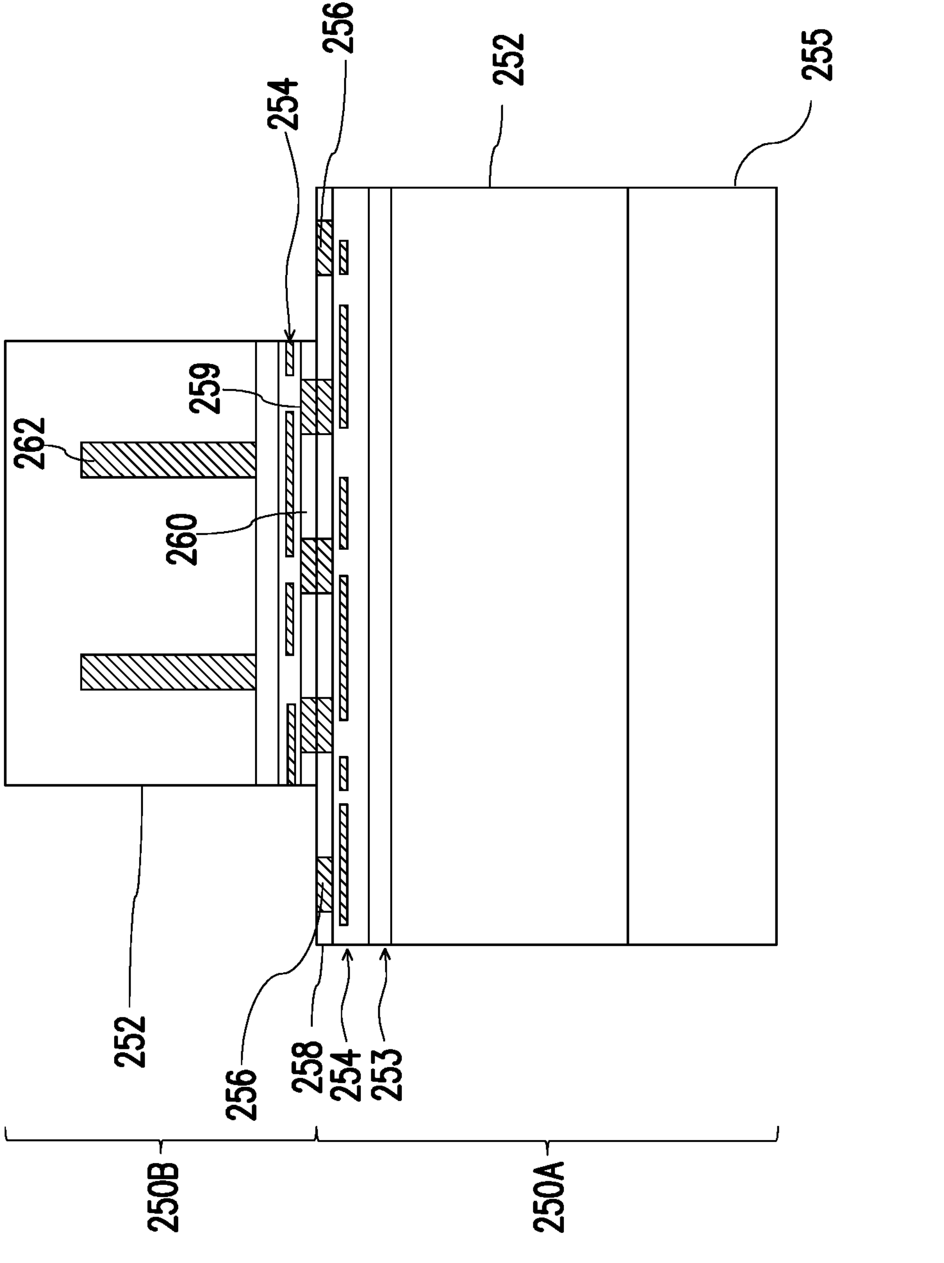
Figure 4F:
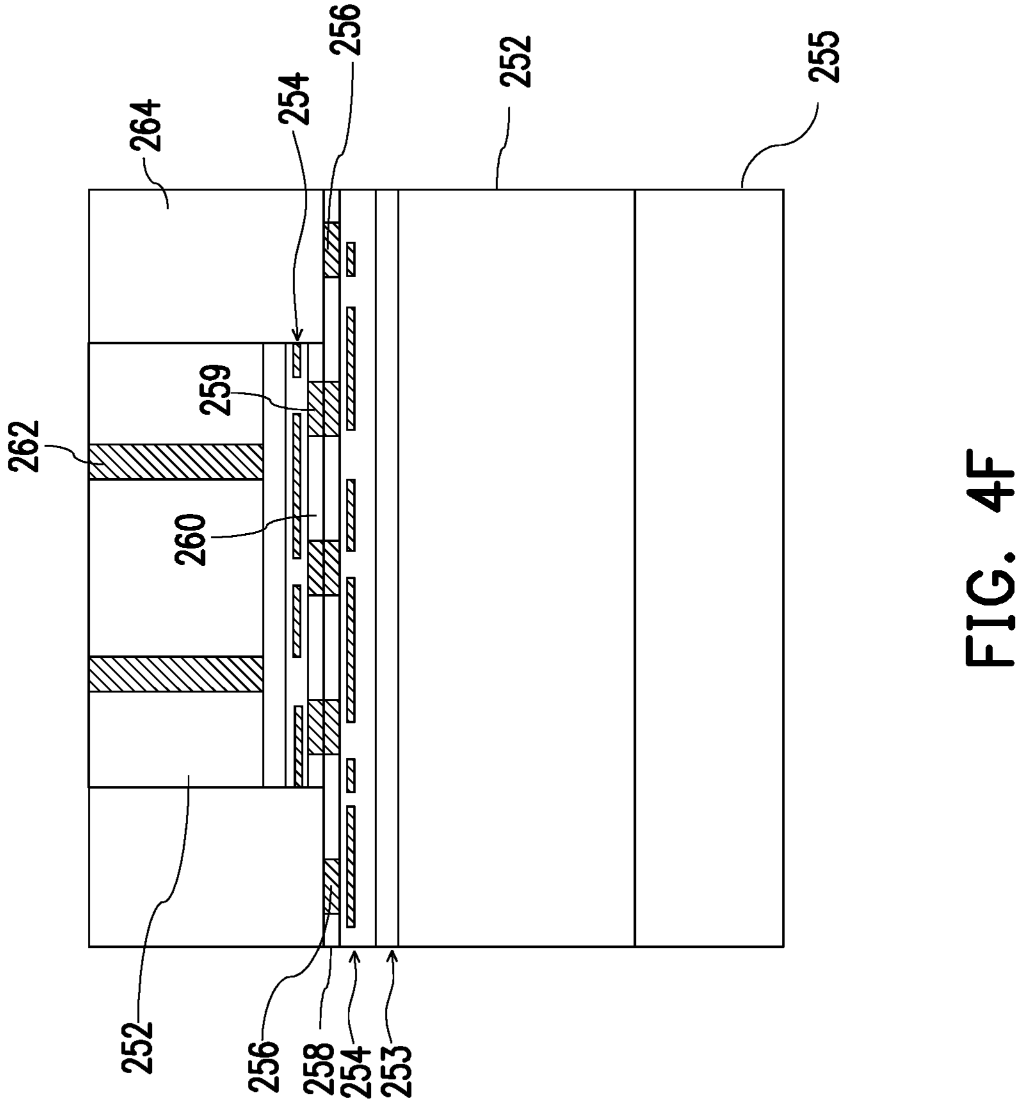
Figure 4G:
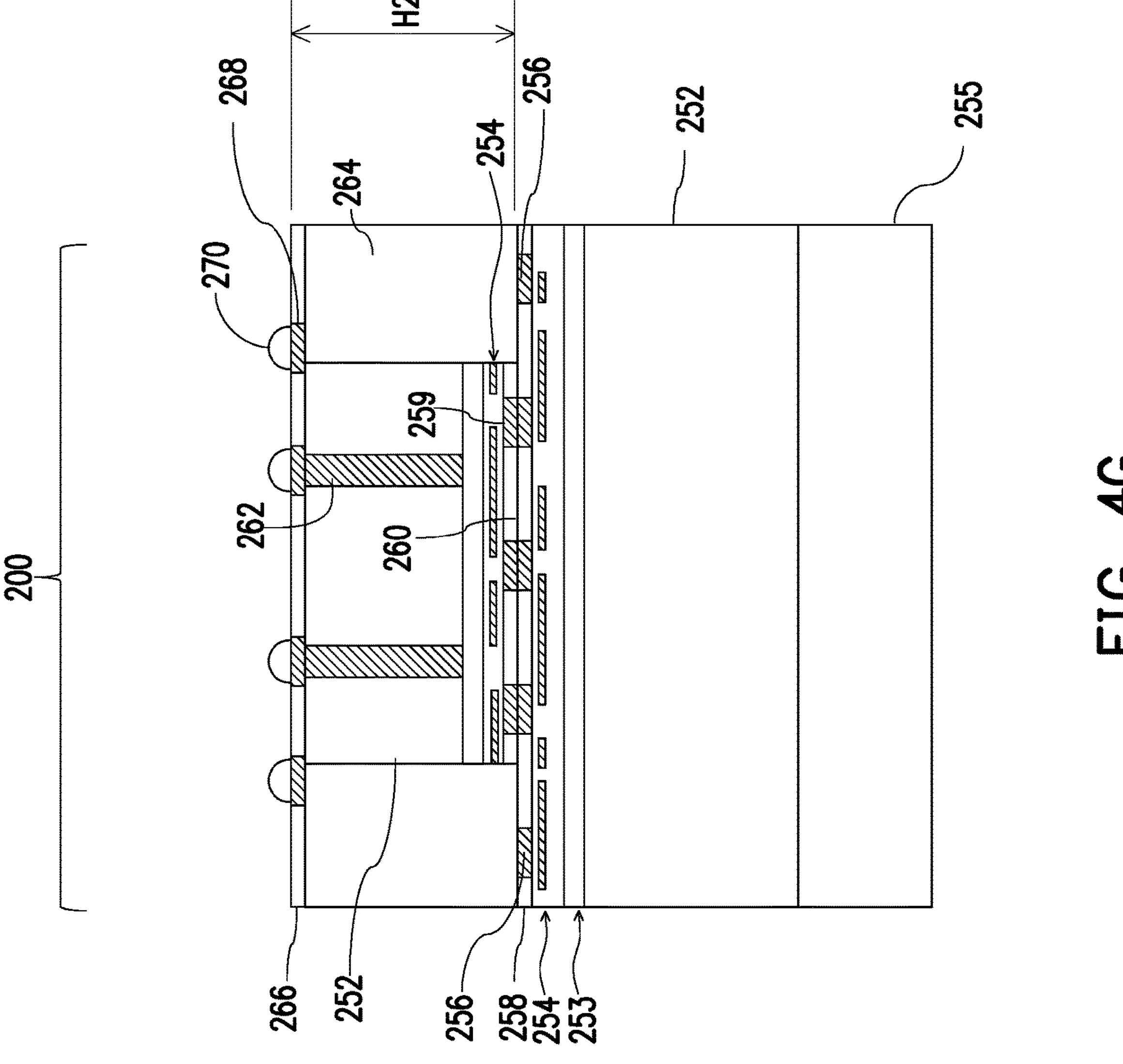

FIGS. 4A through 4I are cross-sectional views of intermediate steps during a process for forming an integrated circuit package 1000, in accordance with some embodiments. FIGS. 4A through 4D show cross-sectional views of the formation of a bottom wafer 250A. FIGS. 4E through 4G show cross-sectional views of intermediate steps in the formation of a stack 200. FIG. 4E shows the bonding of the bottom wafer 250A to a top die 250B, in accordance with embodiments. Each bottom wafer 250A may comprise a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof (e.g., a system-on-a-chip (SoC) die). The bottom wafer 250A may include different die regions that are singulated in subsequent steps to form a plurality of die regions.

In FIG. 4A, a semiconductor substrate 252, and an interconnect structure 254 over the semiconductor substrate 252 are shown. The semiconductor substrate 252 may be a substrate of silicon, doped or undoped, or an active layer of a semiconductor-on-insulator (SOI) substrate. The semiconductor substrate 252 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 252 has an active surface 253 (e.g., the surface facing upward in FIG. 4A) and an inactive surface (e.g., the surface facing downward in FIG. 4A). The active surface 253 may also be referred to as the active device layer 253. Devices are at the active surface 253 of the semiconductor substrate 252. The devices may be active devices (e.g., transistors, diodes, etc.), capacitors, resistors, etc. The inactive surface may be free from devices.

The interconnect structure 254 is over the active surface 253 of the semiconductor substrate 252, and is used to electrically connect the devices of the semiconductor substrate 252 to form an integrated circuit. The interconnect structure 254 may include one or more dielectric layer(s) and respective metallization layer(s) in the dielectric layer (s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 252. The metallization layer(s) may be formed of a conductive material, such as a metal, such as copper, cobalt, aluminum, gold, combinations thereof, or the like. The interconnect structure 254 may be formed by a damascene process, such as a single damascene process, a dual damascene process, or the like.

In some embodiments, a contact pad 251 may be formed in the interconnect structure 254 to which external connections are made to the interconnect structure 254 and the devices of the active layer 253. The contact pad 251 is disposed over the active surface 253. The contact pad 251 may comprise copper, aluminum (e.g., 28K aluminum), or another conductive material. The contact pad 251 may not be explicitly shown in subsequent figures.

In FIG. 4B, a support substrate 255 is bonded to the inactive surface of the semiconductor substrate 252. The support substrate 255 may include a bulk substrate or a wafer, and may be formed of a material such as silicon, ceramic, heat conductive glass, a metal such as copper or iron, or the like. The support substrate 255 may be free of any active or passive devices. In an embodiment, the support substrate 255 may include metallization layer(s) on a top surface of the support substrate 255. In some embodiments, the support substrate is formed of a material that produces a low amount of residue during CMP, such as silicon.

The support substrate 255 is bonded to the inactive surface of the semiconductor substrate 252 using a suitable technique such as fusion bonding, or the like. For example, in various embodiments, the support substrate 255 may be bonded to the semiconductor substrate 252 using bonding layers 227*a/b* on the surfaces of and support substrate 255 and the semiconductor substrate 252, respectively. In some embodiments, the bonding layers 227*a/b* may each comprise silicon oxide formed on the surfaces of the support substrate 255 and the semiconductor substrate 252, respectively by a deposition process, such as chemical vapor deposition (CVD), physical vapor deposition (PVD), or the like. In other embodiments, the bonding layers 227*a/b* may be formed by the thermal oxidation of silicon surfaces on the support substrate 255 and the semiconductor substrate 252, respectively.

Prior to bonding, at least one of the bonding layers 227*a/b* may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to one or both bonding layers 227*a/b*. The support substrate 255 is then aligned with the semiconductor substrate 252 and the two are pressed against each other to initiate a pre-bonding of the support substrate 255 to the semiconductor substrate 252. The pre-bonding may be performed at room temperature (between about 21 degrees and about 25 degrees). The bonding time may be shorter than about 1 minute, for example. After the pre-bonding, the semiconductor substrate 252 and the support substrate 255 are bonded to each other. The bonding process may be strengthened by a subsequent annealing step. For example, this may be done by heating the semiconductor substrate 252 and the support substrate 255 to a temperature in a range from 140° C. to 500° C. The bonding layers 227*a/b* may not be shown in subsequent figures.

FIG. 4C shows a thinning process applied to the support substrate 255 after the support substrate 255 and the semiconductor substrate 252 are bonded as shown previously in FIG. 4B. The thinning process may include grinding or CMP processes, or other acceptable processes performed on a surface of the support substrate 255 in order to reduce the thickness of the support substrate 255. After the thinning process, the support substrate 255 may have a first substrate height S1.

In FIG. 4D, conductive connectors 256 are shown which may be in and/or on the interconnect structure 254 of the bottom wafer 250A. For example, the conductive connectors 256 may be part of an upper metallization layer of the interconnect structure 254. The conductive connectors 256 can be formed of a metal, such as copper, aluminum, or the like, and can be formed by, for example, plating, or the like. The conductive connectors 256 may be conductive pillars, pads, or the like, to which external connections are made.

A dielectric layer 258 is in and/or on the interconnect structure 254. For example, the dielectric layer 258 may be an upper dielectric layer of the interconnect structure 254. The dielectric layer 258 laterally encapsulates the conductive connectors 256. The dielectric layer 258 may be an oxide, a nitride, a carbide, a polymer, the like, or a combination thereof. The dielectric layer 258 may be formed, for example, by spin coating, lamination, chemical vapor deposition (CVD), or the like. Initially, the dielectric layer 258 may bury the conductive connectors 256, such that the top surface of the dielectric layer 258 is above the top surfaces of the conductive connectors 256. The conductive connectors 256 may be exposed through the dielectric layer 258 by a removal process that can be applied to the various layers to remove excess materials over the conductive connectors 256. The removal process may be a planarization process such as a chemical mechanical polish (CMP), an etch-back, combinations thereof, or the like. After the planarization process, top surfaces of the die connectors 256 and the dielectric layer 258 are coplanar (within process variations). In an embodiment, a first height H1 between a top surface of the dielectric layer 258 and a bottom surface of the semiconductor substrate 252 is less than or equal to 780 μm.

In FIG. 4E, the top die 250B is bonded to the bottom wafer 250A to form a system-on-integrated-chip (SoIC) device. It should be appreciated that embodiments may be applied to other three-dimensional integrated circuit (3DIC) packages. The top die 250B may be formed in a wafer, which may include different die regions that are then singulated to form a plurality of top dies 250B. The top die 250B includes a semiconductor substrate 252, an interconnect structure 254, and may include an active surface 253, which are similar to those described for FIG. 4A. In addition, the top die 250B may comprise conductive connectors 259, and a dielectric layer 260 which may be in and/or on the interconnect structure 254 of the top die 250B. The conductive connectors 259 may be formed using like processes and like materials as the conductive connectors 256. The dielectric layer 260 may be formed using like processes and like materials as the dielectric layer 258.

In some embodiments, the top die 250B is a logic die, and the bottom wafer 250A is used as an interface to bridge the logic die to memory devices (e.g., memory devices 11 of the HBM device 100 shown in FIG. 4I), and to translate commands between the logic die and the memory devices. In some embodiments, the top die 250B and the bottom wafer 250A are bonded such that the active surfaces 253 are facing each other (e.g., are "face-to-face" bonded). Conductive vias 262 may be formed through the top die 250B to allow external connections to be made to the stack 200 (shown subsequently in FIG. 4G). The conductive vias 262 may be through-substrate vias (TSVs), such as through-silicon vias or the like. The conductive vias 262 extend through the semiconductor substrate 252 of the top die 250B, to be physically and electrically connected to the metallization layer(s) of the interconnect structure 254.

The bottom wafer 250A is bonded to the top die 250B, for example, using a hybrid bonding process that may be similar to that described previously for the bonding of wafer 56A to the wafer 56B in FIG. 2C above. The hybrid bonding process directly bonds the dielectric layer 258 of the bottom wafer 250A to the dielectric layer 260 of the top die 250B through fusion bonding. In an embodiment, the bond between the dielectric layer 258 and the dielectric layer 260 may be an oxide-to-oxide bond. The hybrid bonding process further directly bonds the conductive connectors 256 of the bottom wafer 250A and the conductive connectors 259 of the top die 250B through direct metal-to-metal bonding. Thus, the bottom wafer 250A and the top die 250B are electrically connected.

In FIG. 4F, insulating material 264 is formed over the bottom wafer 250A and the top die 250B. The insulating material 264 surrounds the top die 250B and may comprise a dielectric material such as a silicon oxide, or the like, formed by a CVD or PECVD process. A planarization step such as CMP, or the like, may then be performed to level top surfaces of the insulating material 264 with a top surface of the top die 250B. The planarization step may further expose the conductive vias 262 of the top die 250B.

FIG. 4G shows the formation of contact pads 268 and a dielectric layer 266 over the stack 200. The dielectric layer 266 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 266 may be formed, for example, by spin coating, lamination, chemical vapor deposition (CVD), or the like. The contact pads 268 may be used for connections to other devices. In some embodiments, the contact pads are conductive bumps that are suitable for use with reflowable connectors, such as microbumps, extending through the dielectric layer 266. In the illustrated embodiment, the contact pads 268 are formed through the dielectric layer 266. As an example to form the contact pads 268, openings are formed in the dielectric layer 266, and a seed layer is formed over the dielectric layer 266 and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the contact pads 268. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 268. In an embodiment, a second height H2 between a top surface of the dielectric layer 266 and a bottom surface of the dielectric layer 260 may be in a range from 15 μm to 30 μm.

After the formation of the contact pads 268, conductive connectors 270 are formed on the contact pads 268. The conductive connectors 270 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 270 may include a conductive material such as solder, copper, aluminum, gold, nickel, silver, palladium, tin, the like, or a combination thereof. In some embodiments, the conductive connectors 270 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 270 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Advantages can be achieved as a result of the formation of the integrated circuit package 1000 that includes the top die 250B bonded to the bottom wafer 250A (e.g., to form a logic device), and the HBM device 100. The integrated circuit package 1000 further includes the support substrate 255 over the top die 250B and the bottom wafer 250A. The total thickness of the top die 250B, the bottom wafer 250A and the support substrate 255 is equal to or greater than the thickness of the HBM device 100. These advantages include allowing for a more even surface that can be used to implement thermal solutions (e.g. a heat spreader may be attached to top surfaces of the support substrate 255 and the HBM device 100) to help improve heat dissipation efficiency in the integrated circuit package 1000. The support substrate 255 also functions as a heat spreader and dissipates heat from the stack 200. In addition, the support substrate 255 used can be of any thickness to accommodate different types of memory devices that may have different thicknesses.

Figure 4H:
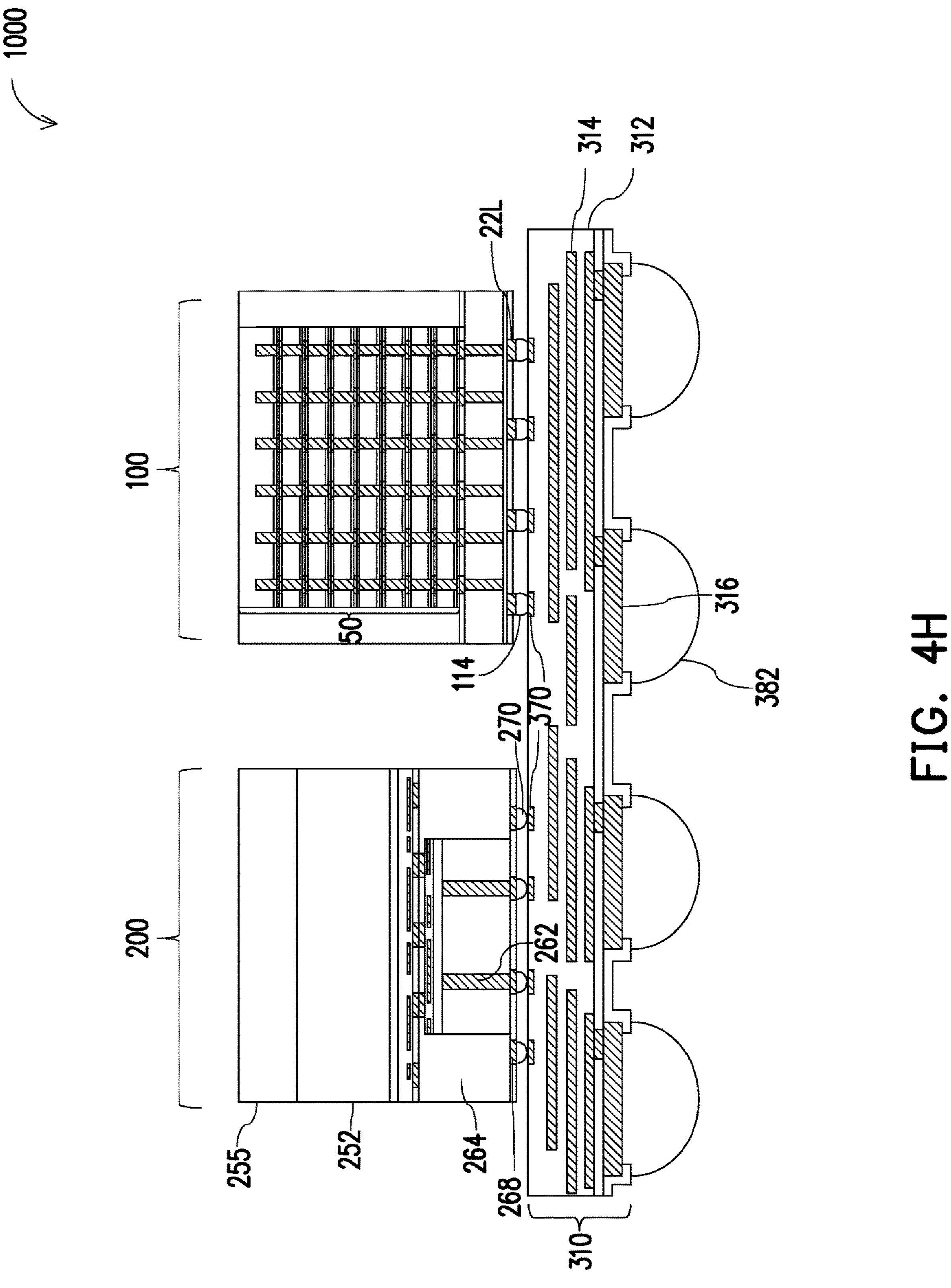

In FIG. 4H, the stack 200 and HBM device 100 are bonded to a structure 310 using the conductive connectors 270 and the conductive connectors 114, respectively. The structure 310 may comprise a redistribution structure. The structure 310 includes dielectric layers 312 and metallization layers 314 (sometimes referred to as redistribution layers or redistribution lines) among the dielectric layers 312. For example, the structure 310 may include a plurality of metallization layers 314 separated from each other by respective dielectric layers 312. The metallization layers 314 of the structure 310 are connected to the memory devices 11 of the HBM device 100, and the top die 250B and bottom wafer 250A of the stack 200 through the conductive connectors 114 and the conductive connectors 270, respectively. The conductive connectors 270 and the conductive connectors 114 may be bonded to redistribution lines 370 of the structure 310 by reflowing the conductive connectors 270 and the conductive connectors 114 using a flip chip bonding process.

In some embodiments, the dielectric layers 312 are formed of a polymer, which may be a photosensitive material such as PBO, polyimide, a BCB-based polymer, or the like, and may be patterned using a lithography mask. In other embodiments, the dielectric layers 312 are formed of a nitride such as silicon nitride; an oxide such as silicon oxide, PSG, BSG, BPSG; or the like. The dielectric layers 312 may be formed by spin coating, lamination, CVD, the like, or a combination thereof. The metallization layers 314 each include conductive vias and/or conductive lines. The conductive vias extend through the dielectric layers 312, and the conductive lines extend along the dielectric layers 312. The conductive vias and the conductive lines may comprise a conductive material that may be formed by plating, such as electroplating or electroless plating, or the like. The conductive material may comprise a metal or a metal alloy, such as copper, titanium, tungsten, aluminum, the like, or combinations thereof.

Conductive connectors 382 are formed on the structure 310. The conductive connectors 382 may be connected to metallization layers 314 of the structure 310. For example, the conductive connectors 382 may be formed on under-bump metallizations (UBMs) 316 of the structure 310. The conductive connectors 382 may comprise solder balls and/or bumps, such as controlled collapse chip connection (C4) bumps, or the like. The conductive connectors 382 may be formed of a conductive material that is reflowable, such as solder, copper, aluminum, gold, nickel, silver, palladium, tin, the like, or a combination thereof. In some embodiments, the conductive connectors 382 are formed by initially forming a layer of solder through methods such as evaporation, electroplating, printing, solder transfer, ball placement, or the like. Once a layer of solder has been formed on the structure, a reflow may be performed in order to shape the conductive connectors 382 into desired bump shapes.

In accordance with an alternate embodiment, the structure 310 may comprise an interposer, and a redistribution structure on the interposer. The stack 200 and HBM device 100 may be bonded to topmost redistribution lines of the redistribution structure using the conductive connectors 270 and the conductive connectors 114, respectively. In this way, the bottom wafer 250A and the top die 250B of the stack 100, and the memory devices 11 of the HBM device 100 may be electrically connected to conductive vias of the interposer through the conductive connectors 270, the conductive connectors 114 and the redistribution structure.

Figure 4I:
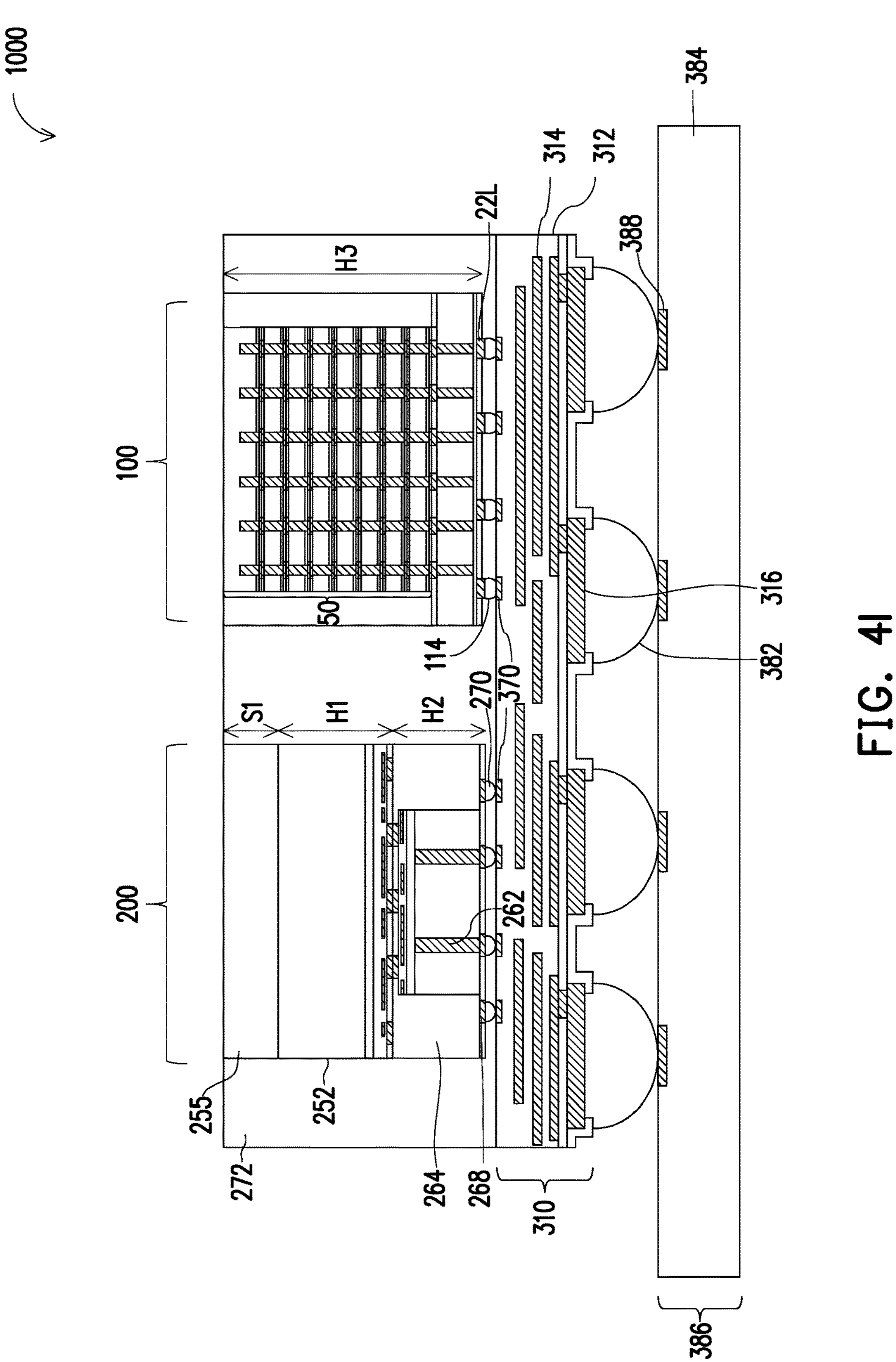

In FIG. 4I, an encapsulant 272 is then formed on and around the various components. After formation, the encapsulant 272 encapsulates the stack 200 and the HBM device 100. The encapsulant 272 also surrounds the conductive connectors 270 and the conductive connectors 114. The encapsulant 272 may be a molding compound, epoxy, or the like. The encapsulant 272 may be applied by compression molding, transfer molding, or the like, and may be formed such that the stack 100 and the HBM device 100 are buried or covered. The encapsulant 272 may be applied in liquid or semi-liquid form and then subsequently cured. A planarization process may then be performed on the encapsulant 272 to expose a top surface of the HBM device 100 and a top surface of the support substrate 255. After the planarization process, top surfaces of the HBM device 100, the support substrate 255 and the encapsulant 272 are coplanar (within process variations). The planarization process may be, for example, a chemical-mechanical polish (CMP), a grinding process, or the like. In an embodiment, a third height H3 of the HBM device 100 may be larger than 900 μm. In an embodiment, the sum of the first height H1, the second height H2, and the first substrate height S1 is equal to or larger than the third height H3. In an embodiment, a top surface of the support substrate 255 is at the same level as a top surface of the HBM device 100. In an embodiment, the top surface of the support substrate 255 is higher than the top surface of the HBM device 100. The support substrate 255 acts as a heat spreader and dissipates heat from the stack 200. Because of the exposed top surface of the support substrate 255, a larger amount of heat can be dissipated through the support substrate 255 and the reliability of the stack 200 is improved.

In accordance with an alternate embodiment, an underfill may formed between the structure 310, and the HBM device 100 and the stack 200 prior to forming the encapsulant 272. The underfill may surround the conductive connectors 270 and the conductive connectors 114 and may reduce stress and protect the joints resulting from the reflowing of the conductive connectors 270 and the conductive connectors 114. The underfill 316 may be formed by a capillary flow process after the HBM device 100 and the stack 100 are attached, or may be formed by a suitable deposition method before the HBM device 100 and the stack 100 are attached. The material of the underfill may be a liquid epoxy, deformable gel, silicon rubber, the like, or a combination thereof. However, any suitable material may be used for the underfill.

Still referring to FIG. 4I, the integrated circuit package 1000 is then mounted on a package substrate 386 using the conductive connectors 382. The package substrate 386 includes a substrate core 384 and bond pads 388 over the substrate core 384. The substrate core 384 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 384 may be a SOI substrate. Generally, an SOI substrate includes a layer of a semiconductor material such as epitaxial silicon, germanium, silicon germanium, SOI, SGOI, or combinations thereof. The substrate core 384 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 384.

The substrate core 384 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 384 may also include metallization layers and vias (not shown), with the bond pads 388 being physically and/or electrically coupled to the metallization layers and vias. The metallization layers may be formed over the active and passive devices and are designed to connect the various devices to form functional circuitry. The metallization layers may be formed of alternating layers of dielectric (e.g. low-k dielectric material) and conductive material (e.g., copper) with vias interconnecting the layers of conductive material and may be formed through any suitable process (such as deposition, damascene, dual damascene, or the like). In some embodiments, the substrate core 384 is substantially free of active and passive devices.

In some embodiments, the conductive connectors 382 are reflowed to attach the conductive connectors 382 to the bond pads 488. The conductive connectors 382 electrically and/or physically couple the package substrate 386, including metallization layers in the substrate core 384, to the integrated circuit package 1000. In some embodiments, a solder resist is formed on the substrate core 384. The conductive connectors 382 may be disposed in openings in the solder resist to be electrically and mechanically coupled to the bond pads 388. The solder resist may be used to protect areas of the substrate core 384 from external damage.

In some embodiments, an underfill may be formed between the integrated circuit package 1000 and the package substrate 386 and surrounding the conductive connectors 382, to reduce stress and protect the joints resulting from the reflowing of the conductive connectors 382. The underfill may be formed by a capillary flow process after the integrated circuit package 1000 is attached or may be formed by a suitable deposition method before the integrated circuit package 1000 is attached. The conductive connectors 382 may have an epoxy flux (not shown) formed thereon before they are reflowed with at least some of the epoxy portion of the epoxy flux remaining after the integrated circuit package 1000 is attached to the package substrate 386. This remaining epoxy portion may act as the underfill.

The integrated circuit package 1000 that comprises the HBM device 100 and the stack 100 is an example a three-dimensional integrated circuit (3DIC) package. The embodiments described herein may be applied to, but are not limited to, embodiments that include a chip-on-wafer (CoW) package, a chip-on-wafer-on-substrate (CoWoS) package, an integrated fan-out (InFO) package, or the like.

Figure 5A:
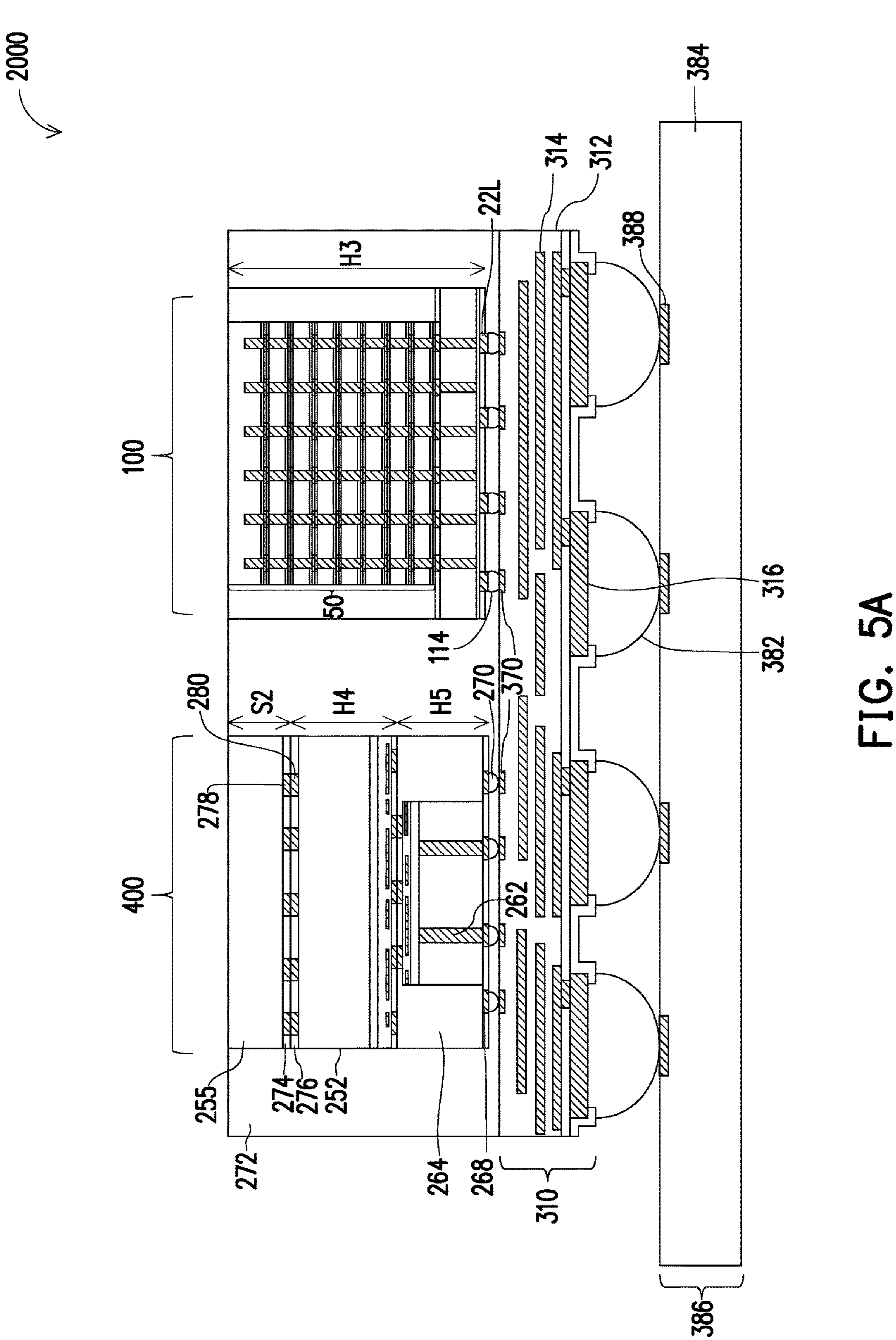
FIG. 5A illustrates a cross-sectional view of an integrated circuit package 2000, in accordance with some embodiments.

FIG. 5A illustrates a cross-sectional view of an integrated circuit package 2000, in which a stack 400 and a HBM device 100 are shown bonded and electrically connected to a structure 310 using conductive connectors 270 and conductive connectors 114, respectively. FIGS. 5B through 5H illustrate cross-sectional views of intermediate steps in the forming of the stack 400, in accordance with an alternate embodiment. Unless specified otherwise, like reference numerals in the integrated circuit package 2000, (and subsequently discussed embodiments) represent like components in the integrated circuit package 1000 of FIGS. 4A through 4I, that are formed by like processes, and unless specified otherwise, like reference numerals in the stack 400, (and subsequently discussed embodiments) represent like components in the stack 200 of FIGS. 4A through 4I, that are formed by like processes. Accordingly, the process steps and applicable materials may not be repeated herein.

Figure 5B:
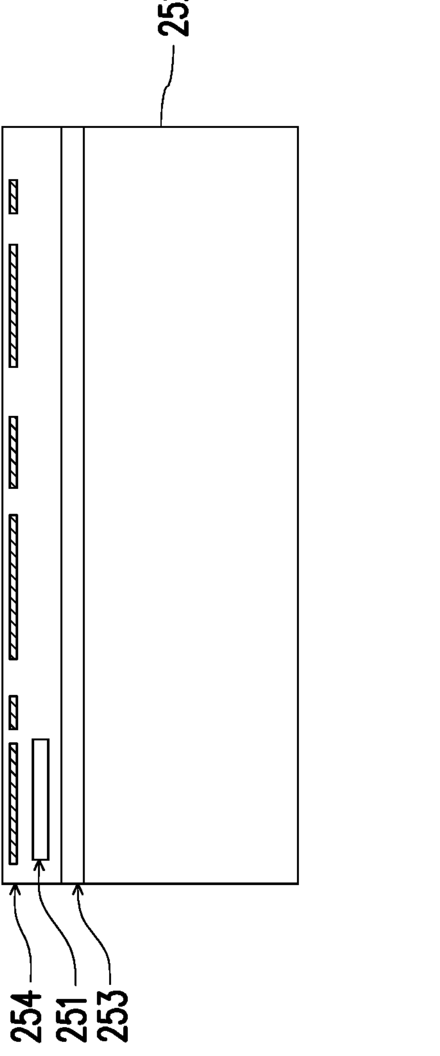
FIGS. 5B through 5H are cross-sectional views of intermediate steps during a process for forming the integrated circuit package 2000, in accordance with some embodiments.
Figure 5C:
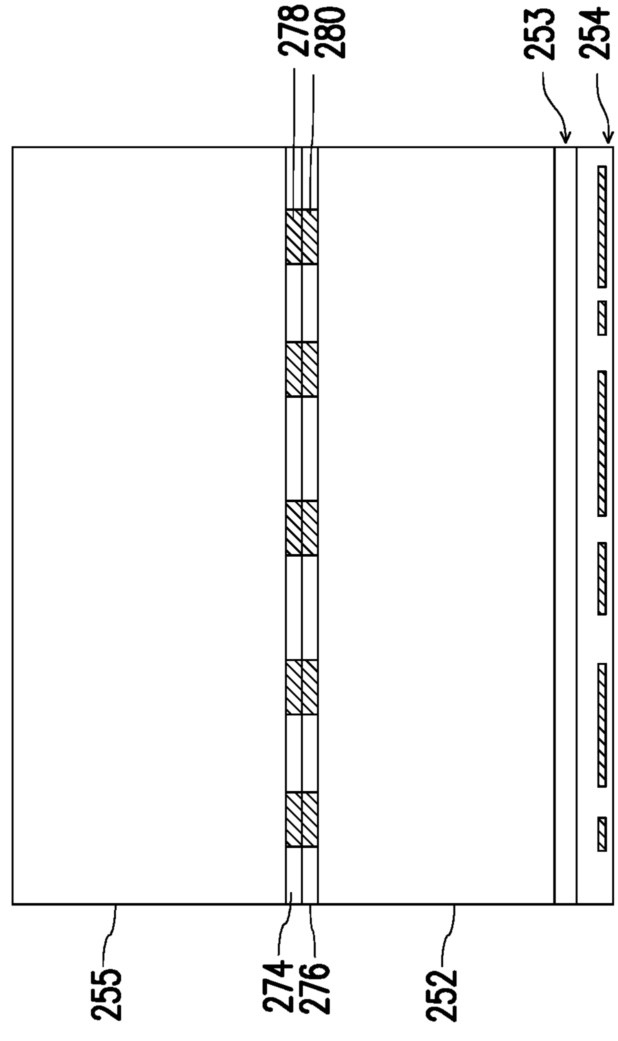

In FIG. 5B, a semiconductor substrate 252, and an interconnect structure 254 over the semiconductor substrate 252 are shown, similar to those shown previously in FIG. 4A. In FIG. 5C, a support substrate 255 is bonded to an inactive surface of the semiconductor substrate 252. The support substrate 255 may include a bulk substrate or a wafer, and may be formed of a material such as silicon, ceramic, heat conductive glass, a metal such as copper or iron, or the like. The support substrate 255 may be free of any active or passive devices. In an embodiment, the support substrate 255 may include metallization layer(s) on a top surface of the support substrate 255. In some embodiments, the support substrate is formed of a material that produces a low amount of residue during CMP, such as silicon.

The support substrate 255 is bonded to the inactive surface of the semiconductor substrate 252 using a suitable technique such as hybrid bonding, or the like. For example, a dielectric layer 274 is formed over the support substrate 255 and a dielectric layer 276 is formed over the semiconductor substrate 252. The dielectric layer 274 and the dielectric layer 276 may be an oxide, a nitride, a carbide, a polymer, the like, or a combination thereof. The dielectric layers 274 and 276 may be formed, for example, by spin coating, lamination, chemical vapor deposition (CVD), or the like. The dielectric layers 274 and 276 may then be patterned and openings formed in the dielectric layers 274 and 276. Conductive connectors 280 are then formed in the dielectric layer 276 and conductive connectors 278 are formed in the dielectric layer 274. The conductive connectors 270 and 280 are formed of a metal, such as copper, aluminum, or the like, and can be formed by, for example, plating, or the like. The conductive connectors 278 and 280 may comprise conductive pillars, pads, or the like, to which external connections are made. The conductive connectors 278 may be exposed through the dielectric layer 274 by a removal process that can be applied to the various layers to remove excess materials over the conductive connectors 278, and the conductive connectors 280 may be exposed through the dielectric layer 276 by a removal process that can be applied to the various layers to remove excess materials over the conductive connectors 280. The removal process may be a planarization process such as a chemical mechanical polish (CMP), an etch-back, combinations thereof, or the like. After the planarization process, top surfaces of the die connectors 278 and the dielectric layer 274 are coplanar (within process variations), and top surfaces of the die connectors 280 and the dielectric layer 276 are coplanar (within process variations).

The hybrid bonding process then directly bonds the dielectric layer 274 of the support substrate 255 to the dielectric layer 276 of the semiconductor substrate 252 through fusion bonding. In an embodiment, the bond between the dielectric layer 274 and the dielectric layer 276 may be an oxide-to-oxide bond. The hybrid bonding process further directly bonds the conductive connectors 278 of the support substrate 255 and the conductive connectors 280 of the semiconductor substrate 252 through direct metal-to-metal bonding. The hybrid bonding process may be similar to that described previously for the bonding of wafer 56A to the wafer 56B in FIG. 2C above.

Figure 5D:
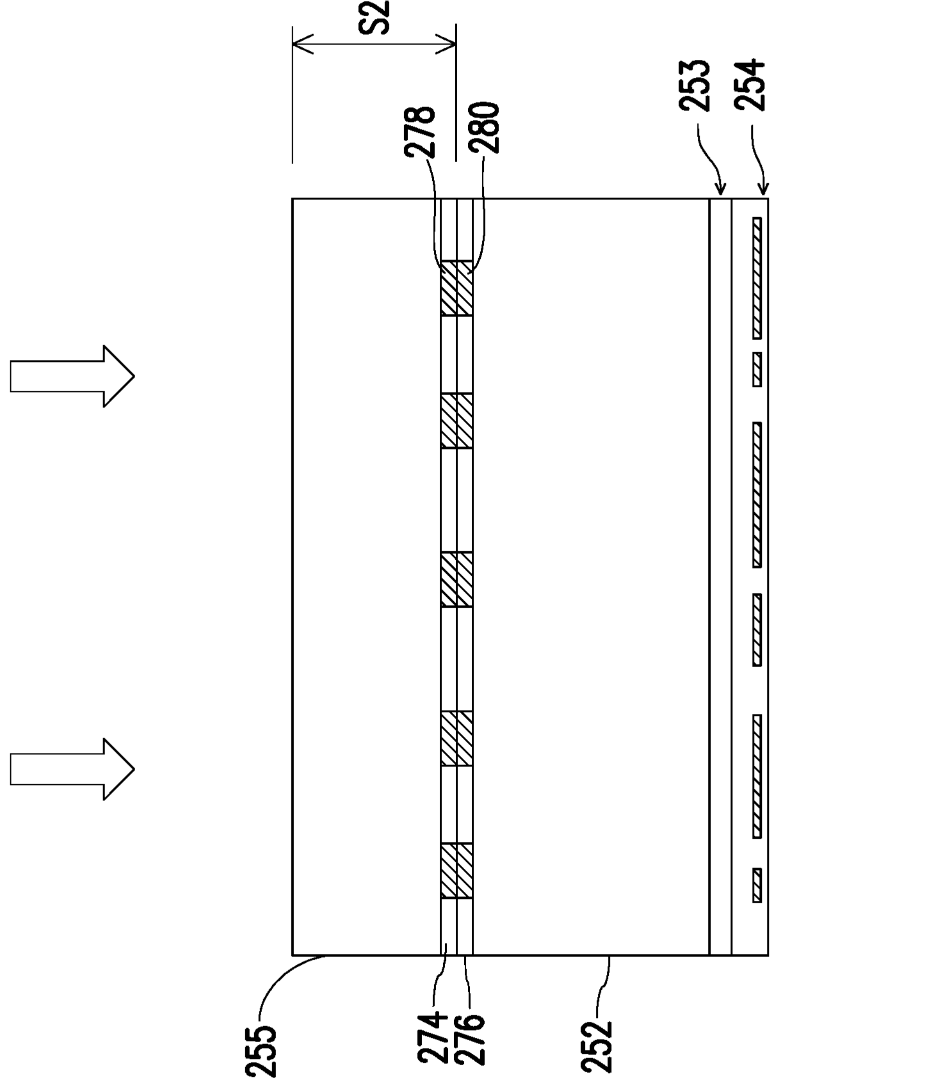

FIG. 5D shows a thinning process applied to the support substrate 255 after the support substrate 255 and the semiconductor substrate 252 are bonded as shown previously in FIG. 5C. The thinning process may include grinding or CMP processes, or other acceptable processes performed on a surface of the support substrate 255 in order to reduce the thickness of the support substrate 255. After the thinning process, the height between a top surface of the support substrate 255 and a bottom surface of the dielectric layer 274 may be a second substrate height S2.

Figure 5E:
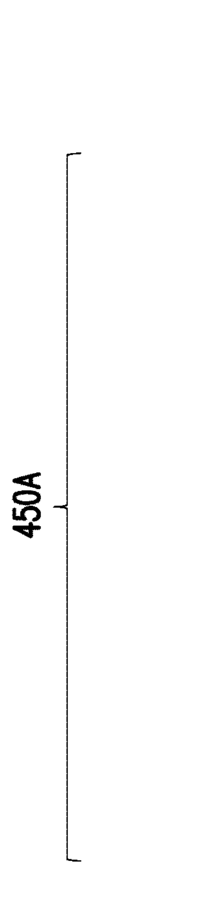
Figure 5E:
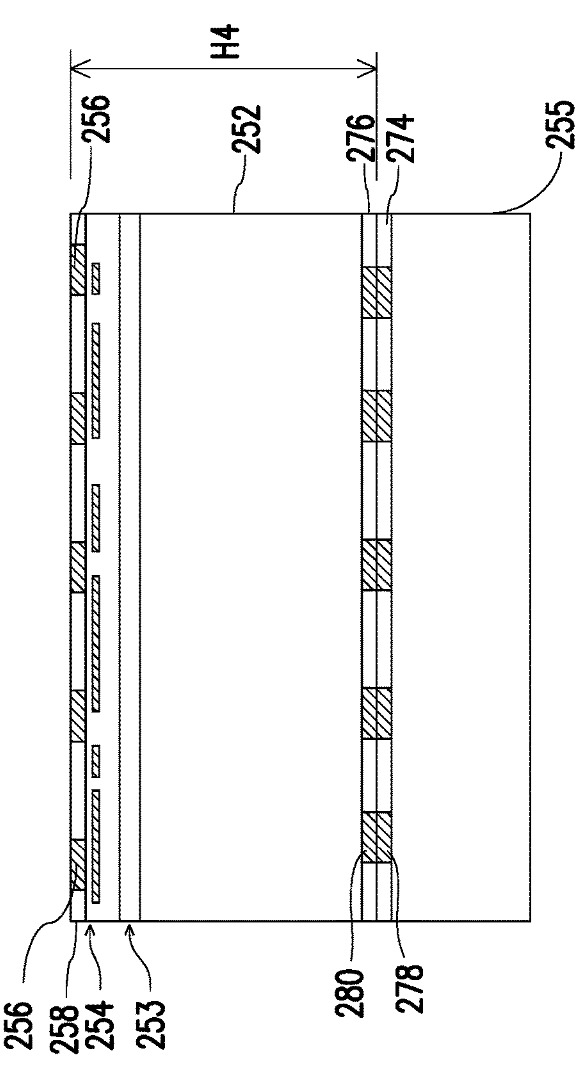

In FIG. 5E, conductive connectors 256 are formed in and/or on the interconnect structure 254 to form a bottom wafer 450A. For example, the conductive connectors 256 may be part of an upper metallization layer of the interconnect structure 254. The conductive connectors 256 can be formed of a metal, such as copper, aluminum, or the like, and can be formed by, for example, plating, or the like. The conductive connectors 256 may be conductive pillars, pads, or the like, to which external connections are made.

A dielectric layer 258 is in and/or on the interconnect structure 254. For example, the dielectric layer 258 may be an upper dielectric layer of the interconnect structure 254. The dielectric layer 258 laterally encapsulates the conductive connectors 256. The dielectric layer 258 may be an oxide, a nitride, a carbide, a polymer, the like, or a combination thereof. The dielectric layer 258 may be formed, for example, by spin coating, lamination, chemical vapor deposition (CVD), or the like. Initially, the dielectric layer 258 may bury the conductive connectors 256, such that the top surface of the dielectric layer 258 is above the top surfaces of the conductive connectors 256. The conductive connectors 256 may be exposed through the dielectric layer 258 by a removal process that can be applied to the various layers to remove excess materials over the conductive connectors 256. The removal process may be a planarization process such as a chemical mechanical polish (CMP), an etch-back, combinations thereof, or the like. After the planarization process, top surfaces of the die connectors 256 and the dielectric layer 258 are coplanar (within process variations). In an embodiment, a fourth height H4 between a top surface of the dielectric layer 258 and a bottom surface of the dielectric layer 276 may be less than or equal to 780 μm.

Figure 5F:
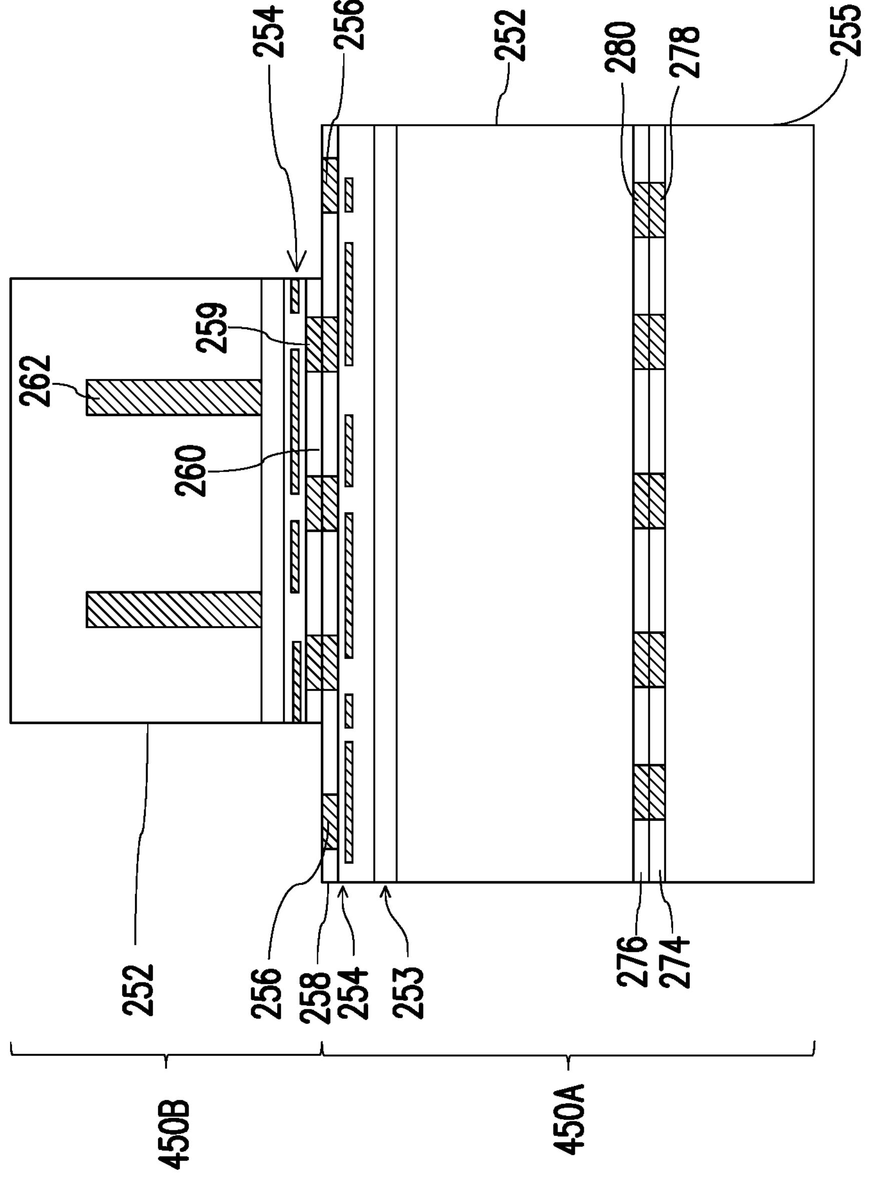

In FIG. 5F, a top die 450B is bonded to the bottom wafer 450A to form a system-on-integrated-chip (SoIC) device. It should be appreciated that embodiments may be applied to other three-dimensional integrated circuit (3DIC) packages. The top die 450B may be formed in a wafer, which may include different die regions that are then singulated to form a plurality of top dies 450B. The top die 450B includes a semiconductor substrate 252, an interconnect structure 254, and may include an active surface 253, which are similar to those described for FIG. 4A. In addition, the top die 450B may comprise conductive connectors 259, and a dielectric layer 260 which may be in and/or on the interconnect structure 254 of the top die 450B. The conductive connectors 259 may be formed using like processes and like materials as the conductive connectors 256. The dielectric layer 260 may be formed using like processes and like materials as the dielectric layer 258.

In some embodiments, the top die 450B is a logic die, and the bottom wafer 450A is used as an interface to bridge the logic die to memory devices (e.g., memory devices 11 of the HBM device 100 shown in FIG. 5A), and to translate commands between the logic die and the memory devices. In some embodiments, the top die 450B and the bottom wafer 450A are bonded such that the active surfaces 253 are facing each other (e.g., are "face-to-face" bonded). Conductive vias 262 may be formed through the top die 450B to allow external connections to be made to the stack 400 (shown subsequently in FIG. 5H). The conductive vias 262 may be through-substrate vias (TSVs), such as through-silicon vias or the like. The conductive vias 262 extend through the semiconductor substrate 252 of the top die 450B, to be physically and electrically connected to the metallization layer(s) of the interconnect structure 254.

The bottom wafer 450A is bonded to the top die 450B, for example, using a hybrid bonding process that may be similar to that described previously for the bonding of wafer 56A to the wafer 56B in FIG. 2C above. The hybrid bonding process directly bonds the dielectric layer 258 of the bottom wafer 450A to the dielectric layer 260 of the top die 450B through fusion bonding. In an embodiment, the bond between the dielectric layer 258 and the dielectric layer 260 may be an oxide-to-oxide bond. The hybrid bonding process further directly bonds the conductive connectors 256 of the bottom wafer 450A and the conductive connectors 259 of the top die 450B through direct metal-to-metal bonding. Thus, the bottom wafer 450A and the top die 450B are electrically connected.

Figure 5G:
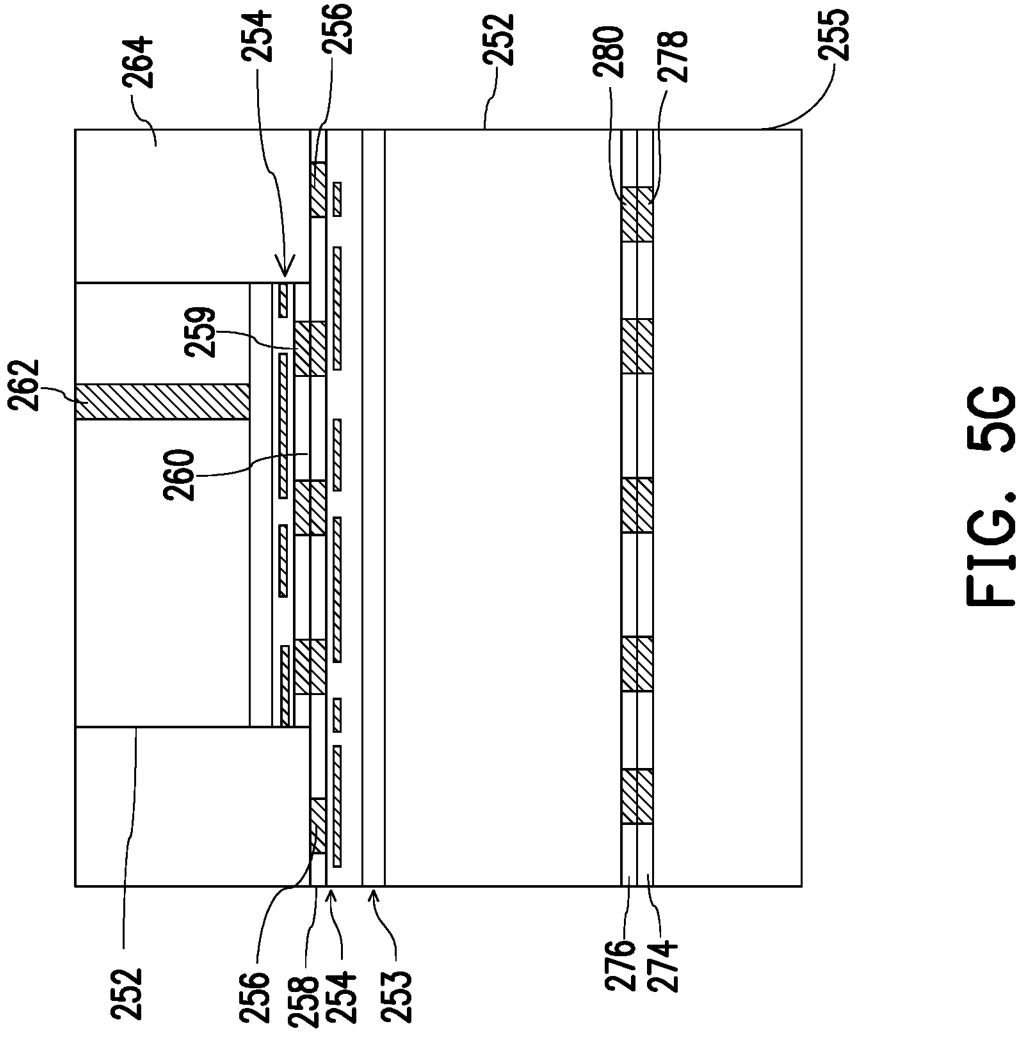

In FIG. 5G, insulating material 264 is formed over the bottom wafer 450A and the top die 450B. The insulating material 264 surrounds the top die 450B and may comprise a dielectric material such as a silicon oxide, or the like, formed by a CVD or PECVD process. A planarization step such as CMP, or the like, may then be performed to level top surfaces of the insulating material 264 with a top surface of the top die 450B. The planarization step may further expose the conductive vias 262 of the top die 450B.

Figure 5H:
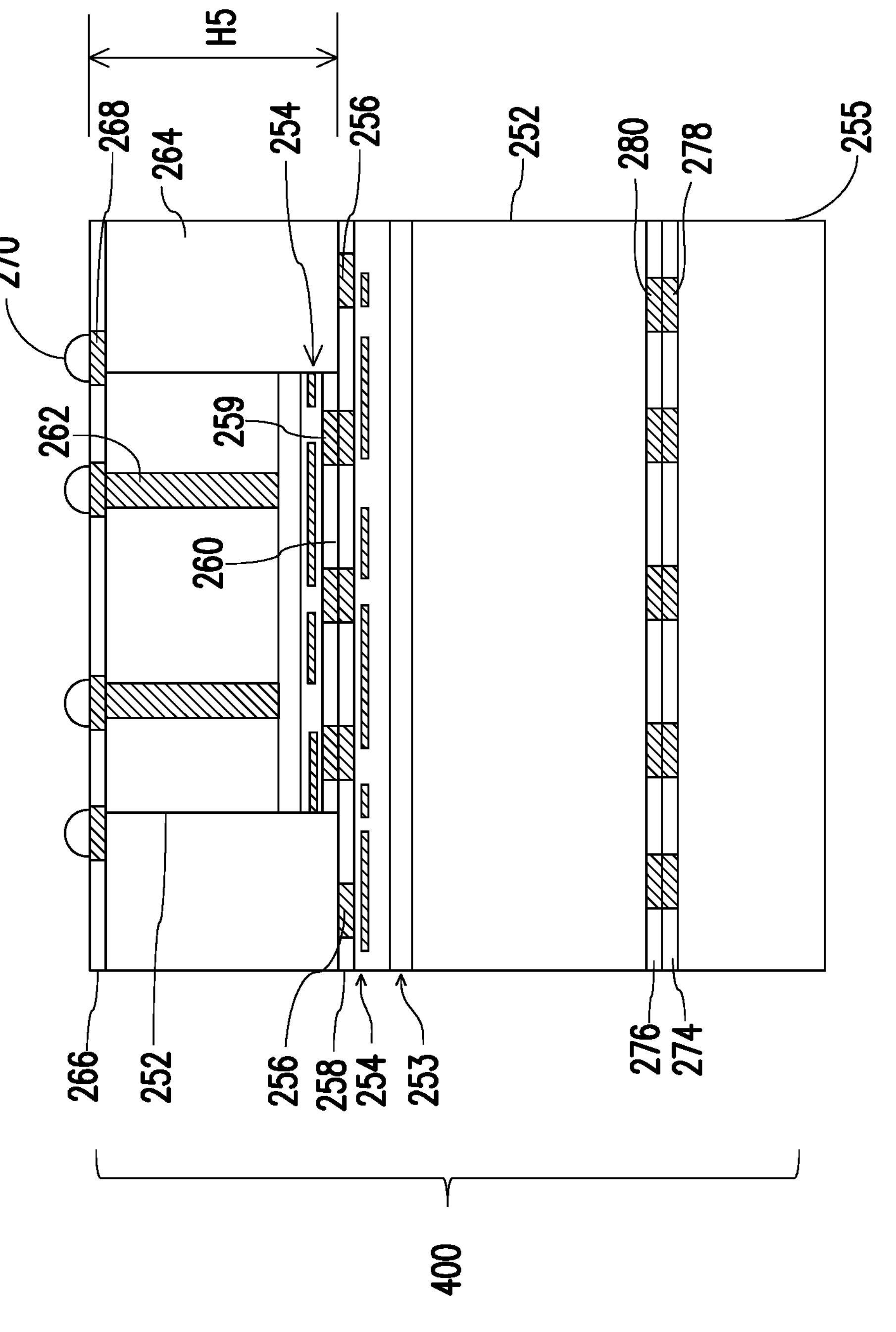

FIG. 5H shows the formation of contact pads 268 and a dielectric layer 266 over the stack 400. The dielectric layer 266 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 266 may be formed, for example, by spin coating, lamination, chemical vapor deposition (CVD), or the like. The contact pads 268 may be used for connections to other devices. In some embodiments, the contact pads are conductive bumps that are suitable for use with reflowable connectors, such as microbumps, extending through the dielectric layer 266. In the illustrated embodiment, the contact pads 268 are formed through the dielectric layer 266. As an example to form the contact pads 268, openings are formed in the dielectric layer 266, and a seed layer is formed over the dielectric layer 266 and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the contact pads 268. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 268. In an embodiment, a fifth height H5 between a top surface of the dielectric layer 266 and a bottom surface of the dielectric layer 260 may be in a range from 15 μm to 30 μm. In an embodiment, the sum of the fourth height H4, the fifth height H5, and the second substrate height S2 is equal to or larger than the third height H3. In an embodiment, a top surface of the support substrate 255 is at the same level as a top surface of the HBM device 100. In an embodiment, the top surface of the support substrate 255 is higher than the top surface of the HBM device 100.

After the formation of the contact pads 268, conductive connectors 270 are formed on the contact pads 268. The conductive connectors 270 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 270 may include a conductive material such as solder, copper, aluminum, gold, nickel, silver, palladium, tin, the like, or a combination thereof. In some embodiments, the conductive connectors 270 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 270 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Advantages can be achieved as a result of the formation of the integrated circuit package 2000 that includes the top die 450B bonded to the bottom wafer 450A (e.g., to form a logic device), and the HBM device 100. The integrated circuit package 2000 further includes the support substrate 255 over the top die 450B and the bottom wafer 450A. The total thickness of the top die 450B, the bottom wafer 450A and the support substrate 255 is equal to or greater than the thickness of the HBM device 100. These advantages include allowing for a more even surface that can be used to implement thermal solutions (e.g. a heat spreader may be attached to top surfaces of the support substrate 255 and the HBM device 100) to help improve heat dissipation efficiency in the integrated circuit package 2000. The support substrate 255 also functions as a heat spreader and dissipates heat from the stack 400. Because of the exposed top surface of the support substrate 255, a larger amount of heat can be dissipated through the support substrate 255 and the reliability of the stack 400 is improved. In addition, the support substrate 255 used can be of any thickness to accommodate different types of memory devices that may have different thicknesses.

Figure 6A:
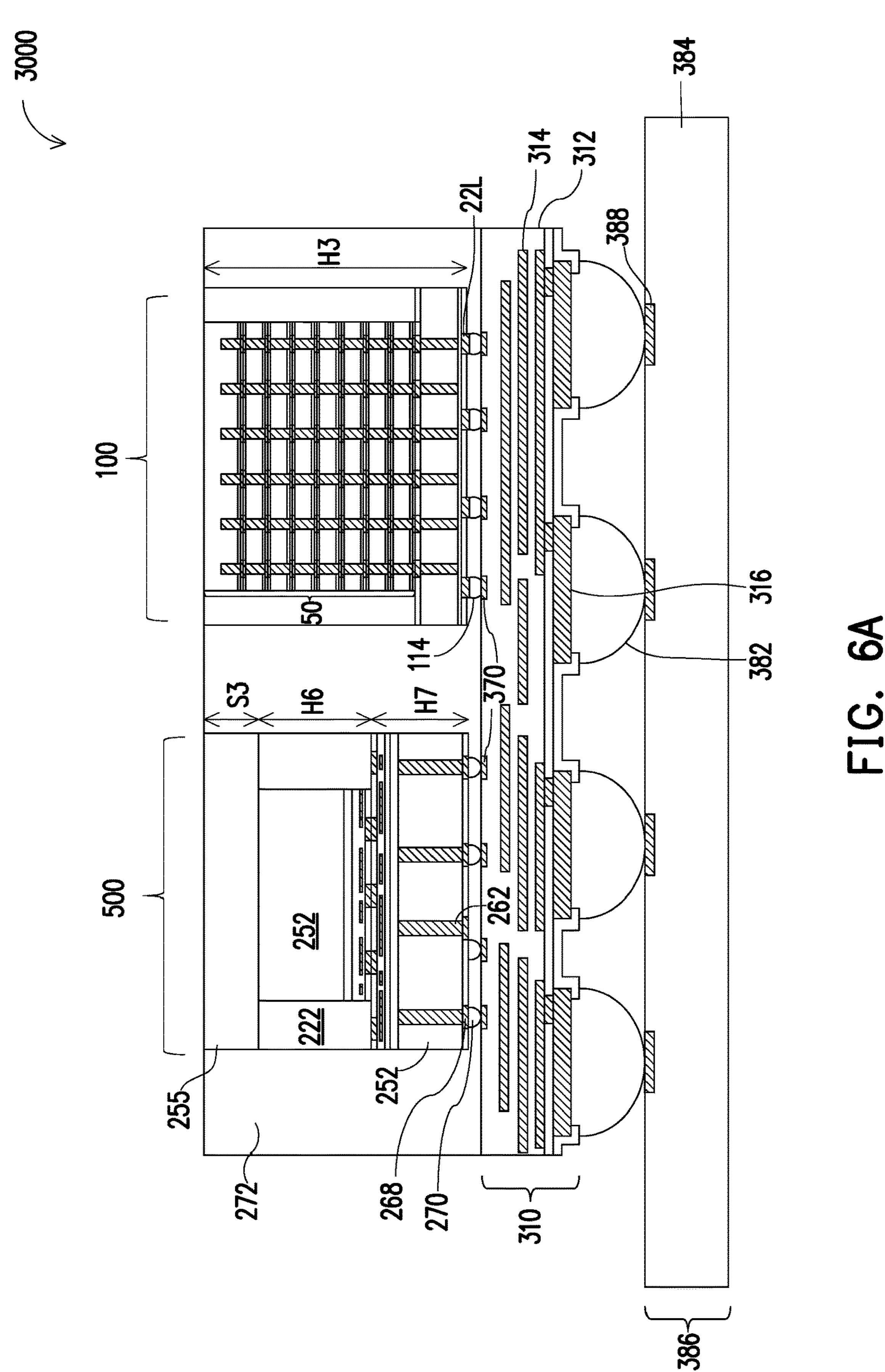
FIG. 6A illustrates a cross-sectional view of an integrated circuit package 3000, in accordance with some embodiments.

FIG. 6A illustrates a cross-sectional view of an integrated circuit package 3000, in which a stack 500 and a HBM device 100 are shown bonded and electrically connected to a structure 310 using conductive connectors 270 and conductive connectors 114, respectively. FIGS. 6B through 6G illustrate cross-sectional views of intermediate steps in the forming of the stack 500, in accordance with an alternate embodiment. Unless specified otherwise, like reference numerals in the integrated circuit package 3000, (and subsequently discussed embodiments) represent like components in the integrated circuit package 1000 of FIGS. 4A through 4I, that are formed by like processes, and unless specified otherwise, like reference numerals in the stack 500, (and subsequently discussed embodiments) represent like components in the stack 200 of FIGS. 4A through 4I, that are formed by like processes. Accordingly, the process steps and applicable materials may not be repeated herein.

Figure 6B:
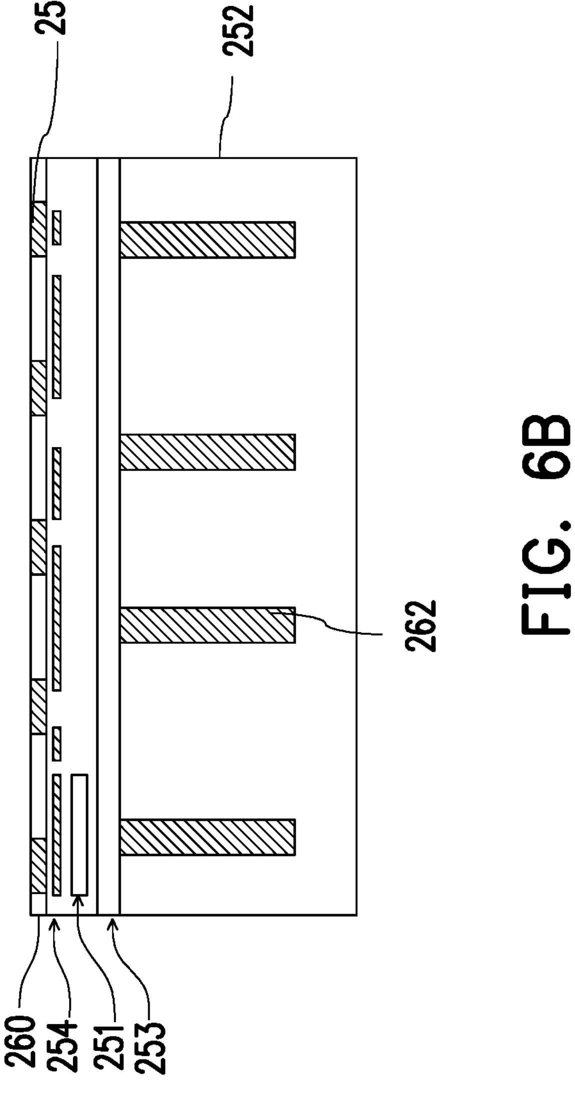
FIGS. 6B through 6G are cross-sectional views of intermediate steps during a process for forming the integrated circuit package 3000, in accordance with some embodiments.

FIG. 6B shows a cross-sectional view of a bottom wafer 550A. Each bottom wafer 550A may comprise a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof (e.g., a system-on-a-chip (SoC) die). The bottom wafer 550A may include different die regions that are singulated in subsequent steps to form a plurality of die regions.

In FIG. 6B, a semiconductor substrate 252, and an interconnect structure 254 over the semiconductor substrate 252 are shown. The semiconductor substrate 252 may be a substrate of silicon, doped or undoped, or an active layer of a semiconductor-on-insulator (SOI) substrate. The semiconductor substrate 252 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 252 has an active surface 253 (e.g., the surface facing upward in FIG. 6B) and an inactive surface (e.g., the surface facing downward in FIG. 6B). The active surface 253 may also be referred to as the active device layer 253. Devices are at the active surface 253 of the semiconductor substrate 252. The devices may be active devices (e.g., transistors, diodes, etc.), capacitors, resistors, etc. The inactive surface may be free from devices.

The interconnect structure 254 is over the active surface 253 of the semiconductor substrate 252, and is used to electrically connect the devices of the semiconductor substrate 252 to form an integrated circuit. The interconnect structure 254 may include one or more dielectric layer(s) and respective metallization layer(s) in the dielectric layer (s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 252. The metallization layer(s) may be formed of a conductive material, such as a metal, such as copper, cobalt, aluminum, gold, combinations thereof, or the like. The interconnect structure 254 may be formed by a damascene process, such as a single damascene process, a dual damascene process, or the like.

In some embodiments, a contact pad 251 may be formed in the interconnect structure 254 to which external connections are made to the interconnect structure 254 and the devices of the active layer 253. The contact pad 251 is disposed over the active surface 253. The contact pad 251 may comprise copper, aluminum (e.g., 28K aluminum), or another conductive material. The contact pad 251 may not be explicitly shown in subsequent figures.

Conductive vias 262 may be formed through the bottom wafer 550A to allow external connections to be made to the stack 500 (shown subsequently in FIG. 6G). The conductive vias 262 may be through-substrate vias (TSVs), such as through-silicon vias or the like. The conductive vias 262 extend through the semiconductor substrate 252 of the bottom wafer 550A, to be physically and electrically connected to the metallization layer(s) of the interconnect structure 254.

Still referring to FIG. 6B, conductive connectors 259 are shown which may be in and/or on the interconnect structure 254 of the bottom wafer 550A. For example, the conductive connectors 259 may be part of an upper metallization layer of the interconnect structure 254. The conductive connectors 259 can be formed of a metal, such as copper, aluminum, or the like, and can be formed by, for example, plating, or the like. The conductive connectors 259 may be conductive pillars, pads, or the like, to which external connections are made.

A dielectric layer 260 is in and/or on the interconnect structure 254. For example, the dielectric layer 260 may be an upper dielectric layer of the interconnect structure 254. The dielectric layer 260 laterally encapsulates the conductive connectors 259. The dielectric layer 260 may be an oxide, a nitride, a carbide, a polymer, the like, or a combination thereof. The dielectric layer 260 may be formed, for example, by spin coating, lamination, chemical vapor deposition (CVD), or the like. Initially, the dielectric layer 260 may bury the conductive connectors 259, such that the top surface of the dielectric layer 260 is above the top surfaces of the conductive connectors 259. The conductive connectors 259 may be exposed through the dielectric layer 260 by a removal process that can be applied to the various layers to remove excess materials over the conductive connectors 259. The removal process may be a planarization process such as a chemical mechanical polish (CMP), an etch-back, combinations thereof, or the like. After the planarization process, top surfaces of the die connectors 259 and the dielectric layer 260 are coplanar (within process variations).

Figure 6C:
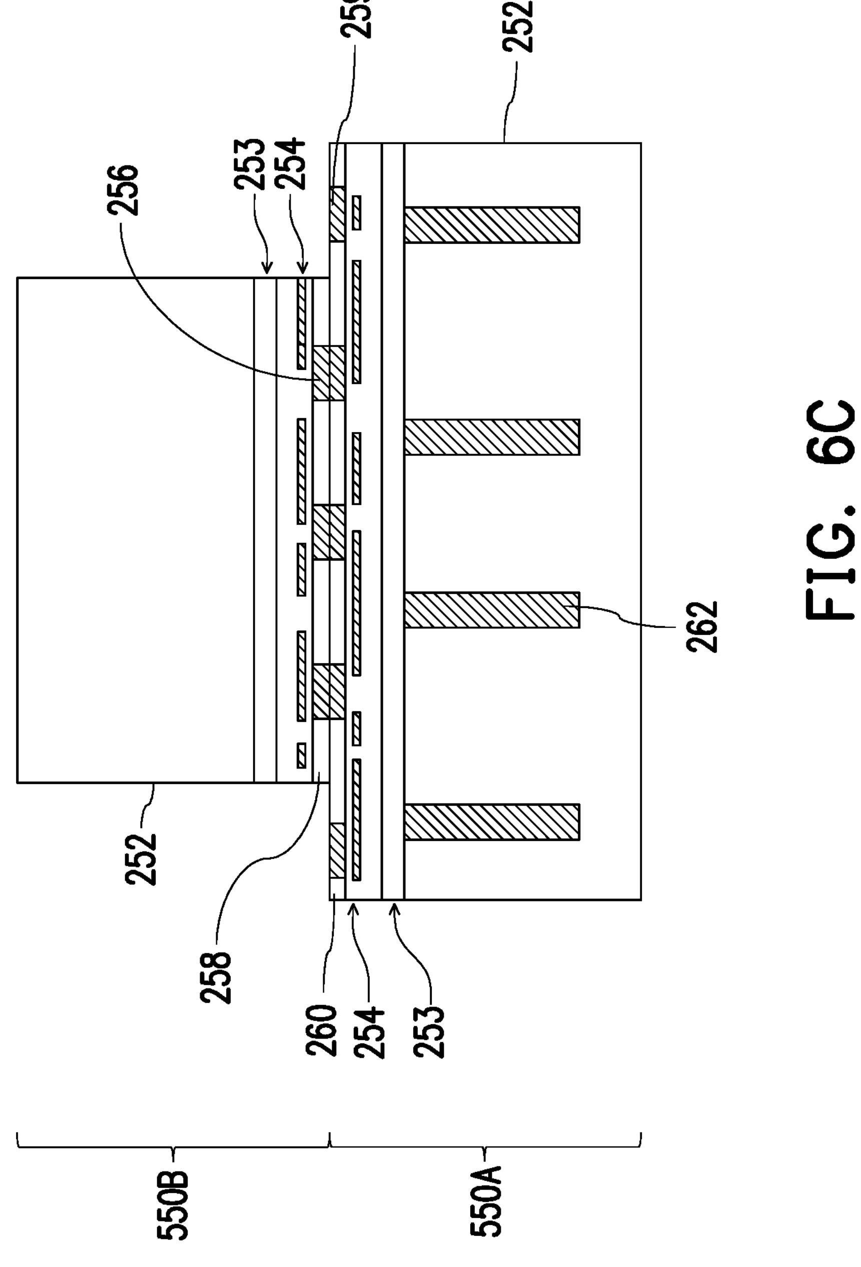

In FIG. 6C, a top die 550B is bonded to the bottom wafer 550A to form a system-on-integrated-chip (SoIC) device. It should be appreciated that embodiments may be applied to other three-dimensional integrated circuit (3DIC) packages. The top die 550B may be formed in a wafer, which may include different die regions that are then singulated to form a plurality of top dies 550B. The top die 550B includes a semiconductor substrate 252, an interconnect structure 254, and may include an active surface 253, which are similar to those described for FIG. 6B. In addition, the top die 550B may comprise conductive connectors 256, and a dielectric layer 258 which may be in and/or on the interconnect structure 254 of the top die 550B. The conductive connectors 256 may be formed using like processes and like materials as the conductive connectors 259 (described previously in FIG. 6B). The dielectric layer 258 may be formed using like processes and like materials as the dielectric layer 260 (described previously in FIG. 6B). In an embodiment, the top die 550B has a sixth height H6 that may be less or equal to 780 μm.

In some embodiments, the top die 550B is a logic die, and the bottom wafer 550A is used as an interface to bridge the logic die to memory devices (e.g., memory devices 11 of the HBM device 100 shown in FIG. 6A), and to translate commands between the logic die and the memory devices.

In some embodiments, the top die 550B and the bottom wafer 550A are bonded such that the active surfaces 253 are facing each other (e.g., are "face-to-face" bonded).

The bottom wafer 550A is bonded to the top die 550B, for example, using a hybrid bonding process that may be similar to that described previously for the bonding of wafer 56A to the wafer 56B in FIG. 2C above. The hybrid bonding process directly bonds the dielectric layer 260 of the bottom wafer 550A to the dielectric layer 258 of the top die 550B through fusion bonding. In an embodiment, the bond between the dielectric layer 260 and the dielectric layer 258 may be an oxide-to-oxide bond. The hybrid bonding process further directly bonds the conductive connectors 259 of the bottom wafer 550A and the conductive connectors 256 of the top die 550B through direct metal-to-metal bonding. Thus, the bottom wafer 550A and the top die 550B are electrically connected.

Figure 6D:
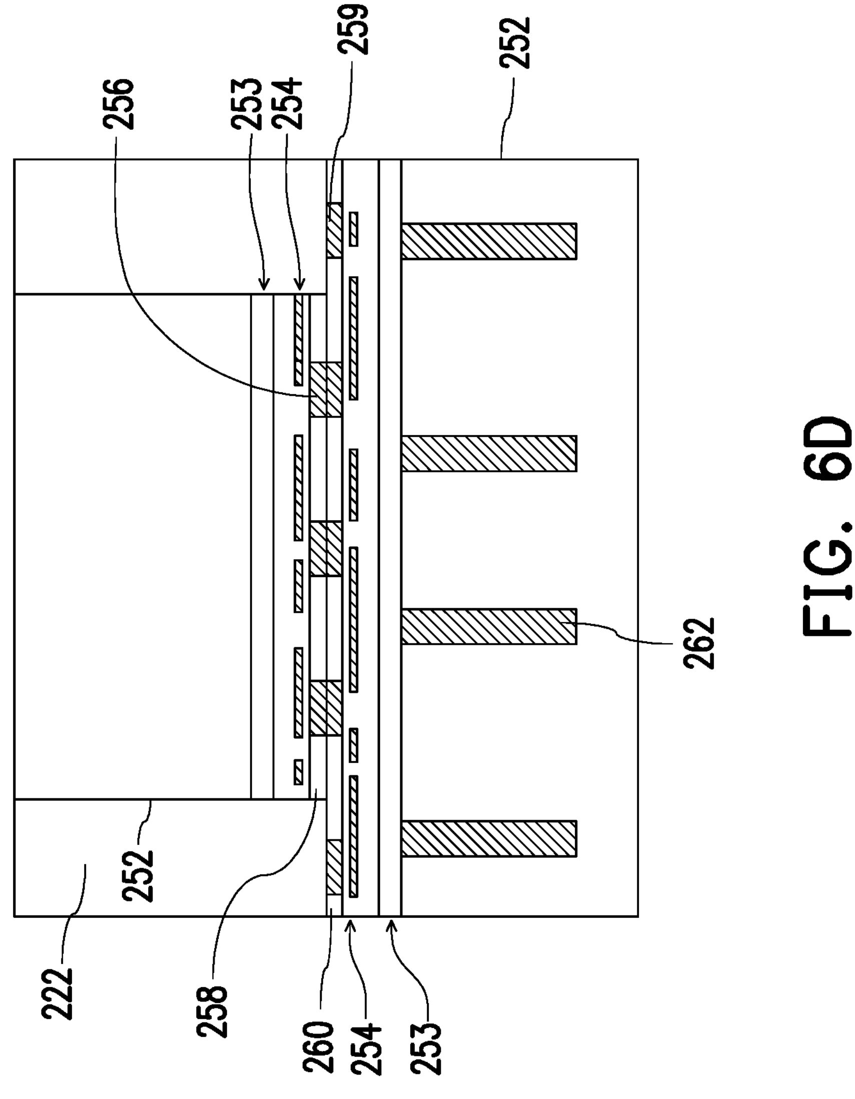

In FIG. 6D, insulating material 222 is formed over the bottom wafer 550A and the top die 550B. The insulating material 222 surrounds the top die 550B and may comprise a dielectric material such as a silicon oxide, or the like, formed by a CVD or PECVD process. A planarization step such as CMP, or the like, may then be performed to level top surfaces of the insulating material 222 with a top surface of the top die 550B.

Figure 6E:
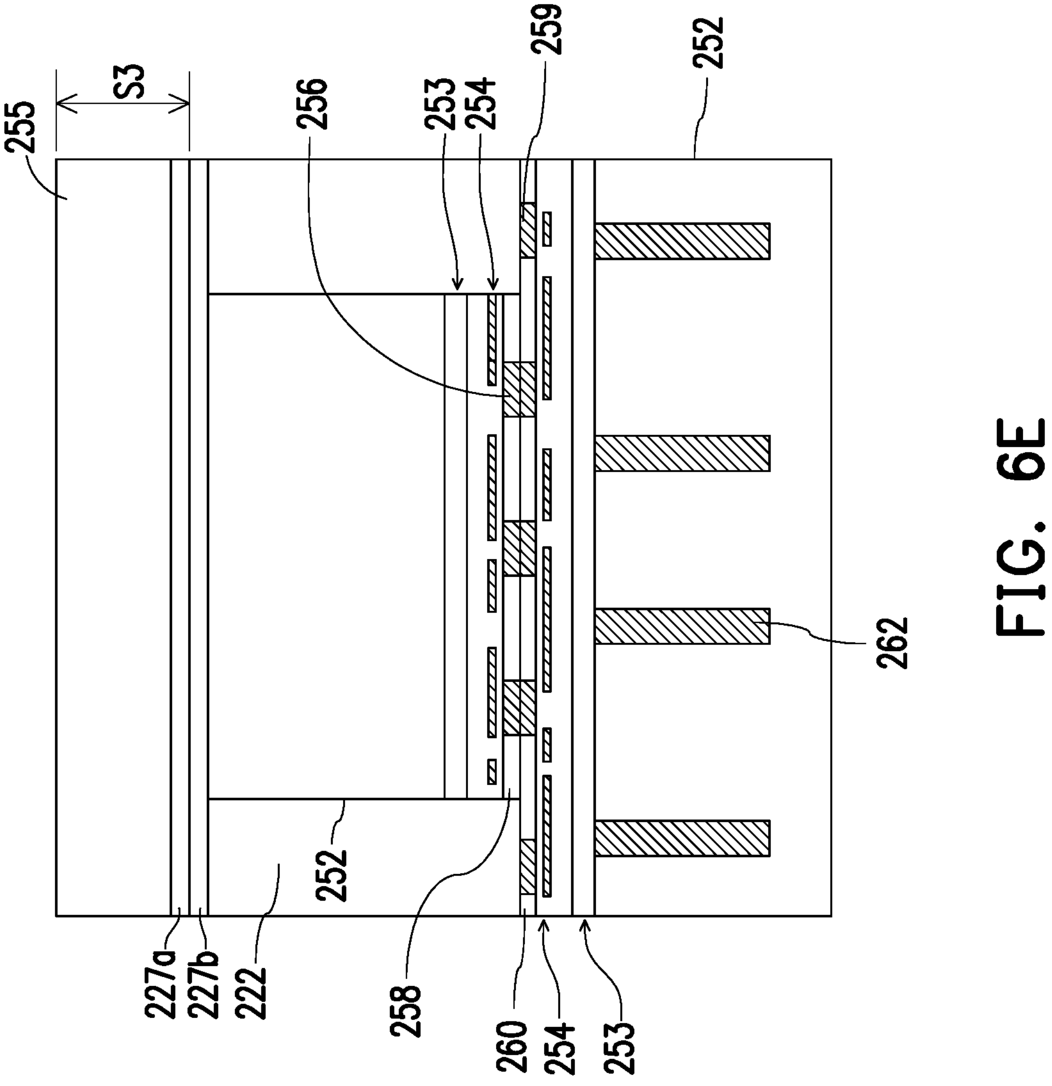

In FIG. 6E, a support substrate 255 is bonded to top surfaces of the insulating material 222, and the inactive surface of the semiconductor substrate 252 of the top die 550B. The support substrate 255 may include a bulk substrate or a wafer, and may be formed of a material such as silicon, ceramic, heat conductive glass, a metal such as copper or iron, or the like. The support substrate 255 may be free of any active or passive devices. In an embodiment, the support substrate 255 may include metallization layer(s) on a top surface of the support substrate 255. In some embodiments, the support substrate is formed of a material that produces a low amount of residue during CMP, such as silicon. In an embodiment, the height of the support substrate 255 may be a third substrate height S3.

The support substrate 255 is bonded to the top surfaces of the insulating material 222, and the inactive surface of the semiconductor substrate 252 of the top die 550B using a suitable technique such as fusion bonding, or the like. For example, in various embodiments, the support substrate 255 may be bonded to the semiconductor substrate 252 and the insulating material 222 using bonding layer 227*a* on the surface of the support substrate 255 and bonding layer 227*b* on the surfaces of the semiconductor substrate 252, and the insulating material 222. In some embodiments, the bonding layers 227*a/b* may each comprise silicon oxide formed on the surfaces of the semiconductor substrate 252, the insulating material 222, and the support substrate 255 by a deposition process, such as chemical vapor deposition (CVD), physical vapor deposition (PVD), or the like. In other embodiments, a portion of the bonding layer 227*b* on the semiconductor substrate 252 and the bonding layer 227*a* on the support substrate 255 may be formed by the thermal oxidation of silicon surfaces on the semiconductor substrate 252 and the support substrate 255, respectively.

Prior to bonding, at least one of the bonding layers 227*a/b* may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to at least one of the bonding layers 227*a/b*. The support substrate 255 is then aligned with the semiconductor substrate 252 and the insulating material 222, and pressed against each other to initiate a pre-bonding of the support substrate 255 to the semiconductor substrate 252 and the insulating material 222. The pre-bonding may be performed at room temperature (between about 21 degrees and about 25 degrees). The bonding time may be shorter than about 1 minute, for example. After the pre-bonding, the semiconductor substrate 252 and the insulating material 222 are bonded to the support substrate 255. The bonding process may be strengthened by a subsequent annealing step. For example, this may be done by heating the semiconductor substrate 252, insulating material 222, and the support substrate 255 to a temperature in a range from 140° C. to 500° C. The bonding layers 227*a/b* may not be shown in subsequent figures.

Figure 6F:
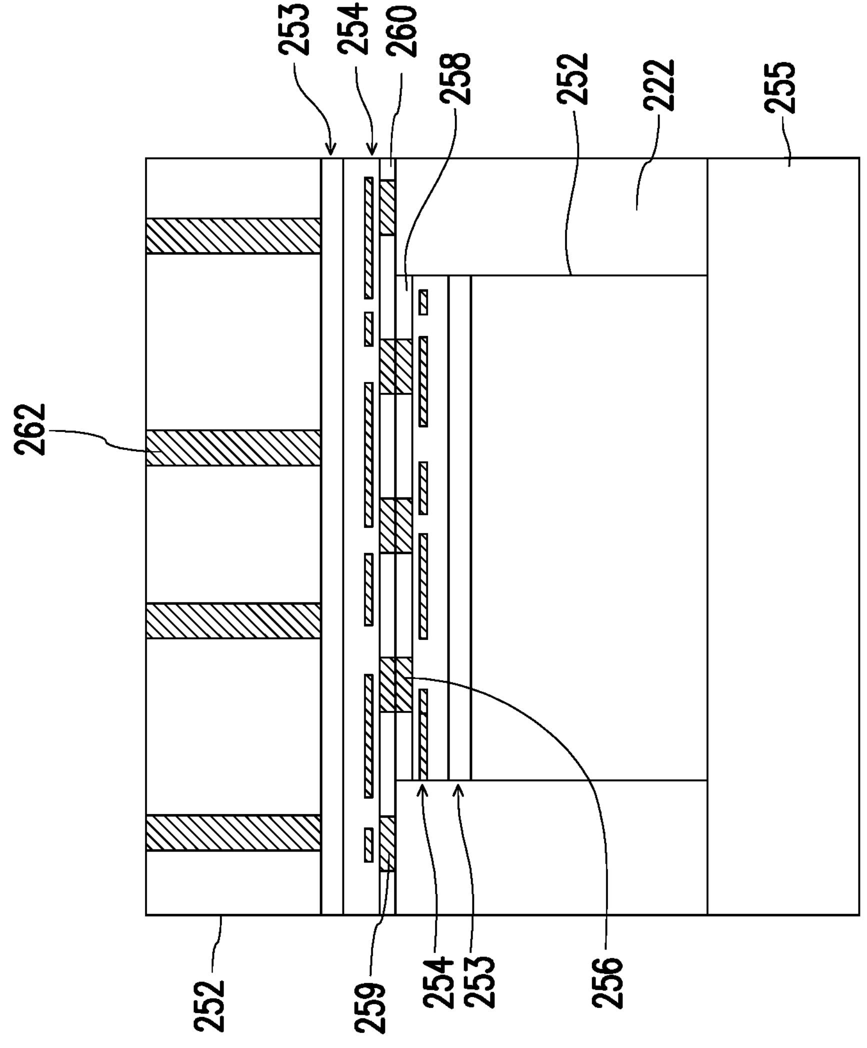

In FIG. 6F, a planarization step such as CMP, or the like, may then be performed to expose the conductive vias 262 of the bottom wafer 550A. After the planarization step, a top surface of the semiconductor substrate 252 of the bottom wafer 550A is level with top surfaces of the conductive vias 262.

Figure 6G:
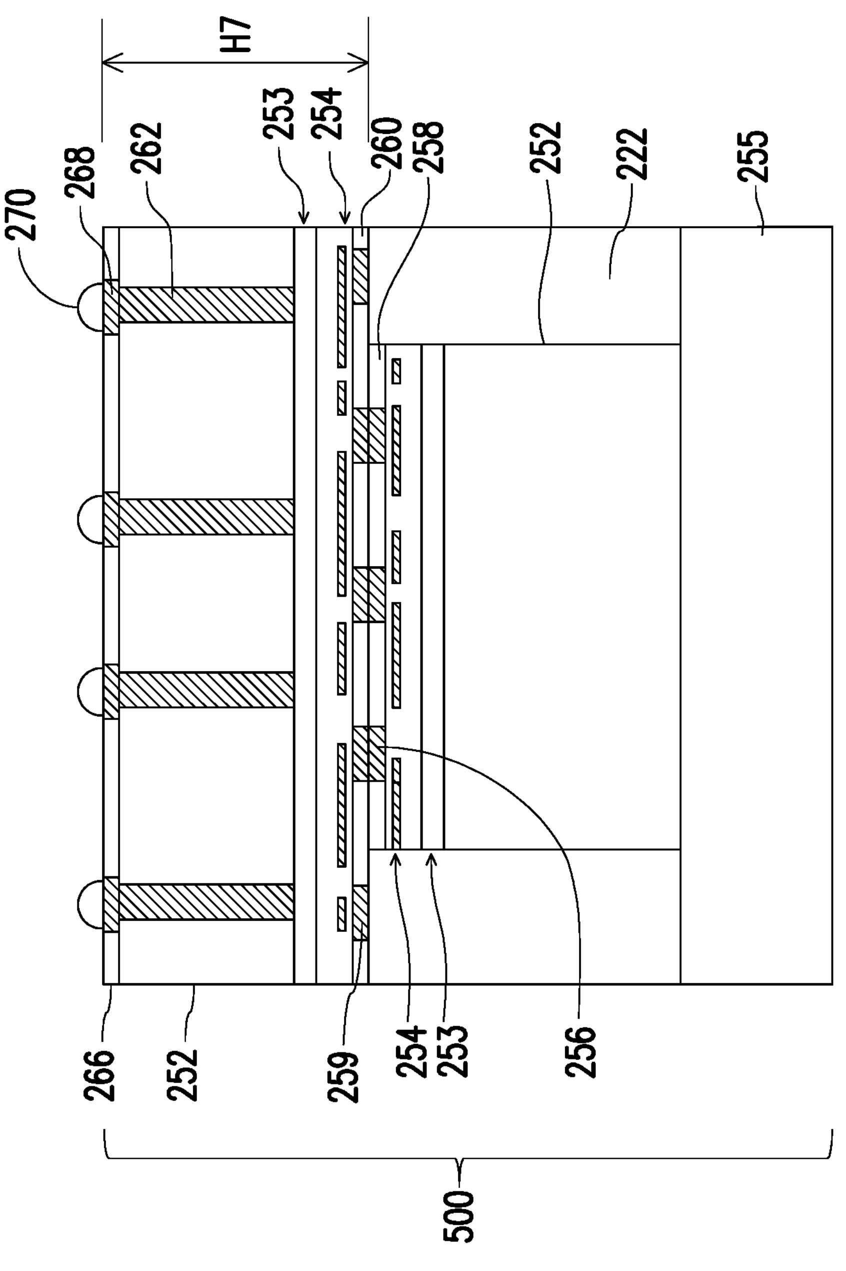

FIG. 6G shows the formation of contact pads 268 and a dielectric layer 266 over the stack 500. The dielectric layer 266 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 266 may be formed, for example, by spin coating, lamination, chemical vapor deposition (CVD), or the like. The contact pads 268 may be used for connections to other devices. In some embodiments, the contact pads are conductive bumps that are suitable for use with reflowable connectors, such as microbumps, extending through the dielectric layer 266. In the illustrated embodiment, the contact pads 268 are formed through the dielectric layer 266. As an example to form the contact pads 268, openings are formed in the dielectric layer 266, and a seed layer is formed over the dielectric layer 266 and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the contact pads 268. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 268. In an embodiment, a seventh height H7 between a bottom surface of the dielectric layer 260 and a top surface of the dielectric layer 266 may be in a range from 15 μm to 30 μm. In an embodiment, the sum of the sixth height H6, the seventh height H7, and the third substrate height S3 is equal to or larger than the third height H3. In an embodiment, a top surface of the support substrate 255 is at the same level as a top surface of the HBM device 100. In an embodiment, the top surface of the support substrate 255 is higher than the top surface of the HBM device 100.

Advantages can be achieved as a result of the formation of the integrated circuit package 3000 that includes the top die 550B bonded to the bottom wafer 550A (e.g., to form a logic device), and the HBM device 100. The integrated circuit package 3000 further includes the support substrate 255 over the top die 550B and the bottom wafer 550A. The total thickness of the top die 550B, the bottom wafer 550A and the support substrate 255 is equal to or greater than the thickness of the HBM device 100. These advantages include allowing for a more even surface that can be used to implement thermal solutions (e.g. a heat spreader may be attached to top surfaces of the support substrate 255 and the HBM device 100) to help improve heat dissipation efficiency in the integrated circuit package 3000. The support substrate 255 also functions as a heat spreader and dissipates heat from the stack 500. Because of the exposed top surface of the support substrate 255, a larger amount of heat can be dissipated through the support substrate 255 and the reliability of the stack 500 is improved. In addition, the support substrate 255 used can be of any thickness to accommodate different types of memory devices that may have different thicknesses.

Figure 7A:
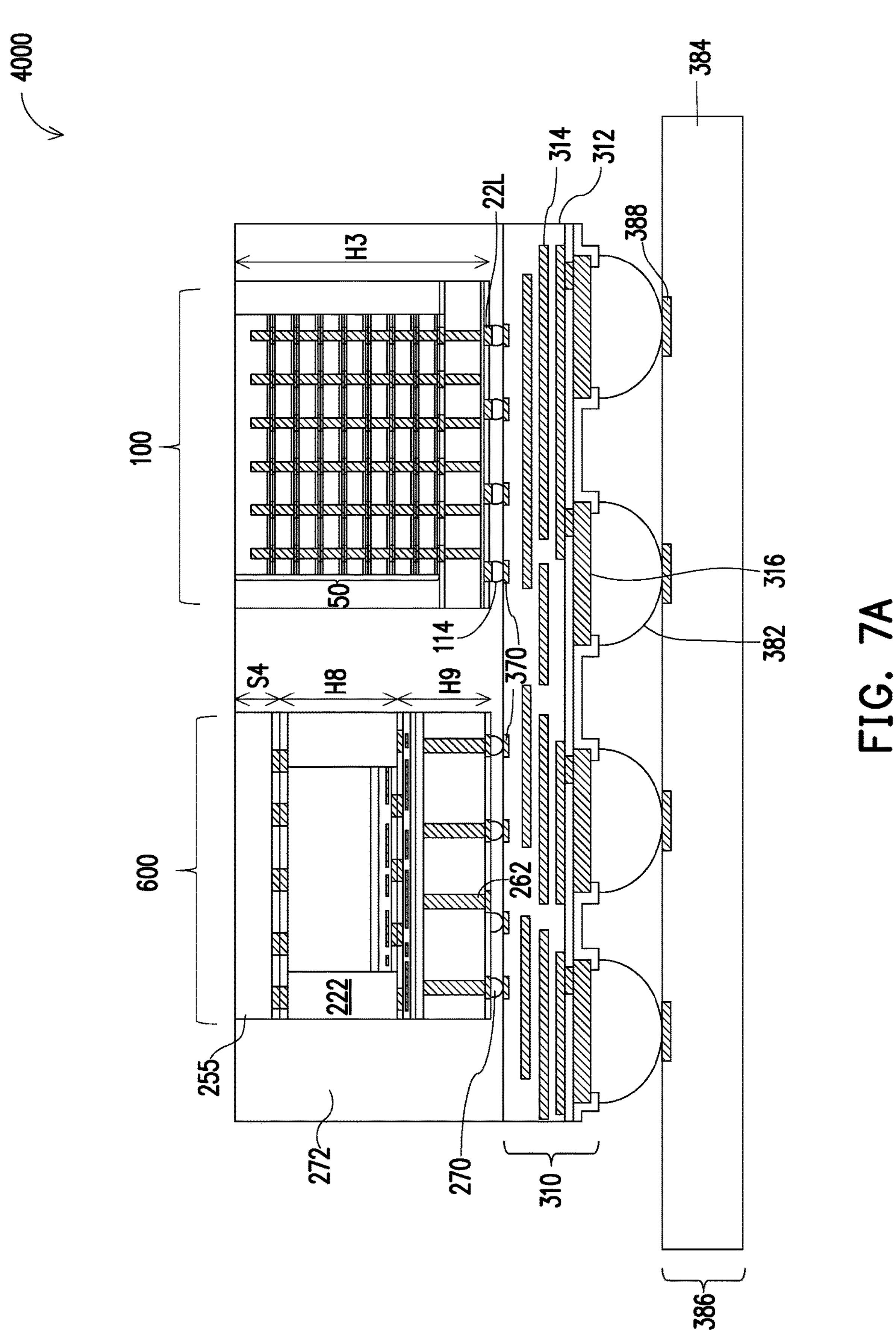
FIG. 7A illustrates a cross-sectional view of an integrated circuit package 4000, in accordance with some embodiments.

FIG. 7A illustrates a cross-sectional view of an integrated circuit package 4000, in which a stack 600 and a HBM device 100 are shown bonded and electrically connected to a structure 310 using conductive connectors 270 and conductive connectors 114, respectively. FIGS. 7B through 7G illustrate cross-sectional views of intermediate steps in the forming of the stack 600, in accordance with an alternate embodiment. Unless specified otherwise, like reference numerals in the integrated circuit package 4000, (and subsequently discussed embodiments) represent like components in the integrated circuit package 1000 of FIGS. 4A through 4I, that are formed by like processes, and unless specified otherwise, like reference numerals in the stack 600, (and subsequently discussed embodiments) represent like components in the stack 200 of FIGS. 4A through 4I, that are formed by like processes. Accordingly, the process steps and applicable materials may not be repeated herein.

Figure 7B:
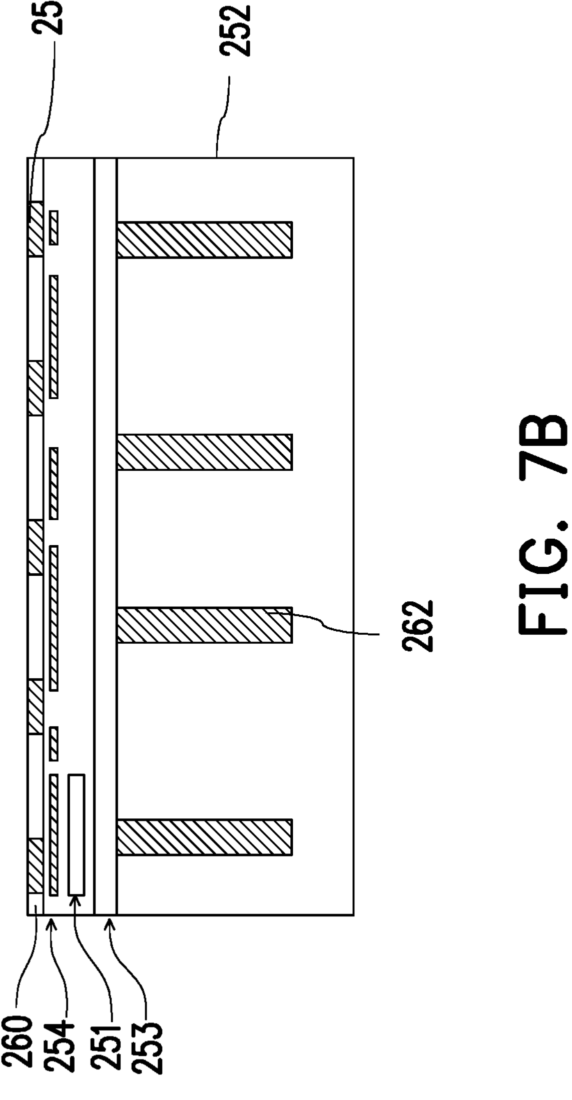
FIGS. 7B through 7G are cross-sectional views of intermediate steps during a process for forming the integrated circuit package 4000, in accordance with some embodiments.

FIG. 7B shows a cross-sectional view of a bottom wafer 650A. The bottom wafer 650A may include different die regions that are singulated in subsequent steps to form a plurality of die regions. The bottom wafer 650A and the bottom wafer 550A shown previously in FIG. 6B may be essentially the same, with like reference numerals representing like components. Accordingly, the process steps and applicable materials may not be repeated herein.

Figure 7C:
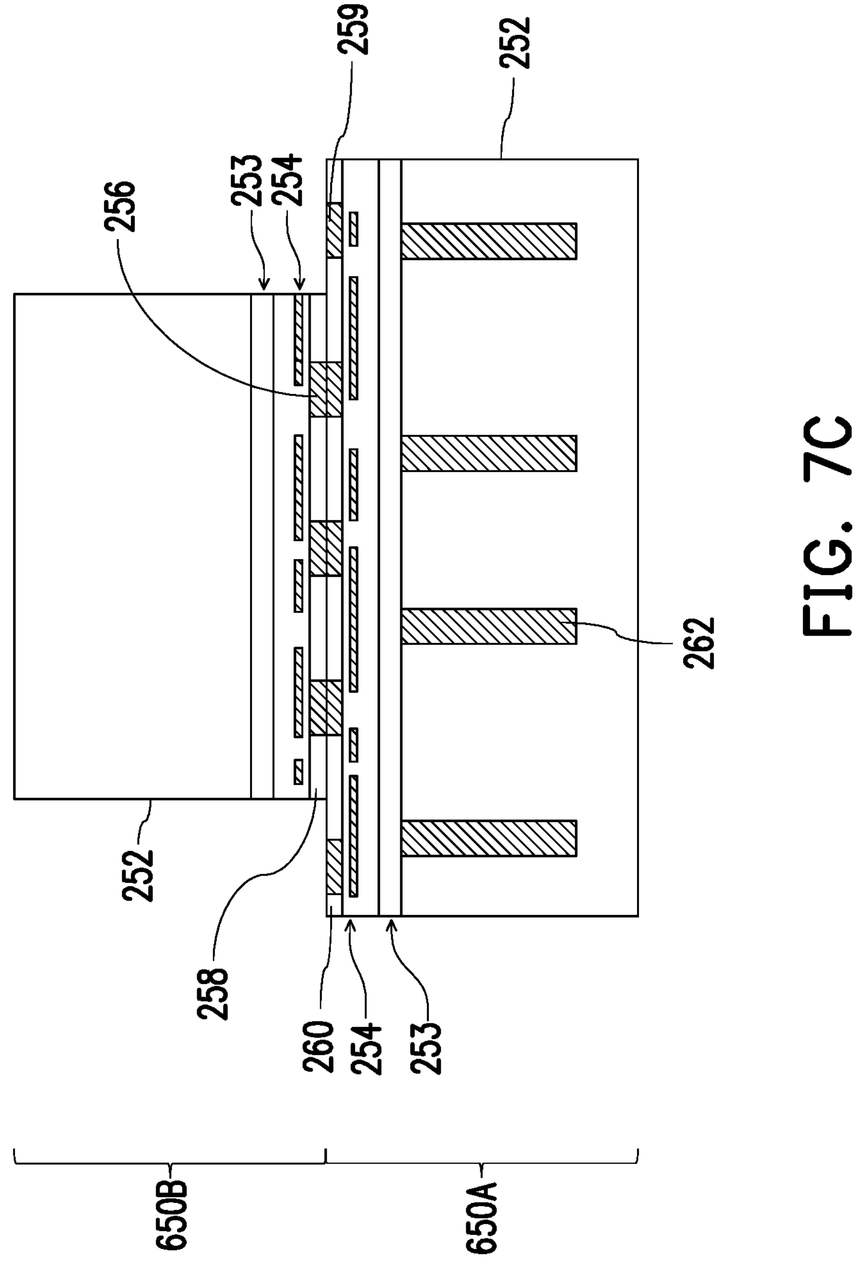

In FIG. 7C, a top die 650B is bonded to the bottom wafer 650A to form a system-on-integrated-chip (SoIC) device. It should be appreciated that embodiments may be applied to other three-dimensional integrated circuit (3DIC) packages. The top die 650B may be formed in a wafer, which may include different die regions that are then singulated to form a plurality of top dies 650B. The top die 650B and the top die 550B shown previously in FIG. 6B may be essentially the same, with like reference numerals representing like components. Accordingly, the process steps and applicable materials may not be repeated herein.

In some embodiments, the top die 650B is a logic die, and the bottom wafer 650A is used as an interface to bridge the logic die to memory devices (e.g., memory devices 11 of the HBM device 100 shown in FIG. 7A), and to translate commands between the logic die and the memory devices. In some embodiments, the top die 650B and the bottom wafer 650A are bonded such that the active surfaces 253 are facing each other (e.g., are "face-to-face" bonded).

The bottom wafer 650A is bonded to the top die 650B, for example, using a hybrid bonding process that may be similar to that described previously for the bonding of wafer 56A to the wafer 56B in FIG. 2C above. The hybrid bonding process directly bonds the dielectric layer 260 of the bottom wafer 650A to the dielectric layer 258 of the top die 650B through fusion bonding. In an embodiment, the bond between the dielectric layer 260 and the dielectric layer 258 may be an oxide-to-oxide bond. The hybrid bonding process further directly bonds the conductive connectors 259 of the bottom wafer 650A and the conductive connectors 256 of the top die 650B through direct metal-to-metal bonding. Thus, the bottom wafer 650A and the top die 650B are electrically connected.

Figure 7D:
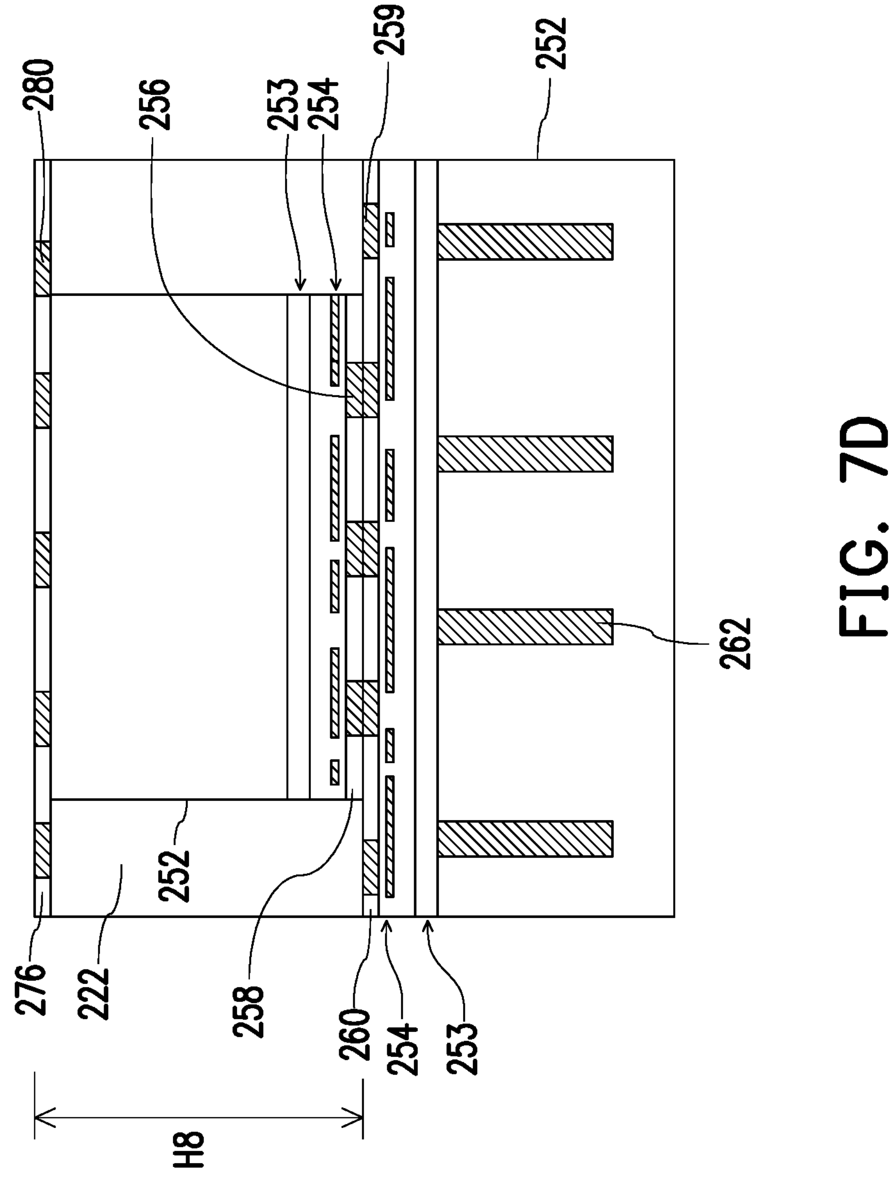

In FIG. 7D, insulating material 222 is formed over the bottom wafer 650A and the top die 650B. The insulating material 222 surrounds the top die 650B and may comprise a dielectric material such as a silicon oxide, or the like, formed by a CVD or PECVD process. A planarization step such as CMP, or the like, may then be performed to level top surfaces of the insulating material 222 with a top surface of the top die 650B.

Still referring to FIG. 7D, a dielectric layer 276 is formed over top surfaces of the insulating material 222 and the top die 650B. The dielectric layer 276 and the may be an oxide, a nitride, a carbide, a polymer, the like, or a combination thereof. The dielectric layer 276 may be formed, for example, by spin coating, lamination, chemical vapor deposition (CVD), or the like. The dielectric layer 276 may then be patterned and openings formed in the dielectric layer 276. Conductive connectors 280 are then formed in the dielectric layer 276. The conductive connectors 280 are formed of a metal, such as copper, aluminum, or the like, and can be formed by, for example, plating, or the like. The conductive connectors 280 may comprise conductive pillars, pads, or the like, to which external connections are made. The conductive connectors 280 may be exposed through the dielectric layer 276 by a removal process that can be applied to the various layers to remove excess materials over the conductive connectors 278. The removal process may be a planarization process such as a chemical mechanical polish (CMP), an etch-back, combinations thereof, or the like. After the planarization process, top surfaces of the die connectors 280 and the dielectric layer 276 are coplanar (within process variations). In an embodiment, an eighth height H8 between a top surface of the dielectric layer 276 and a bottom surface of the dielectric layer 258 may be equal or less than 780 μm.

Figure 7E:
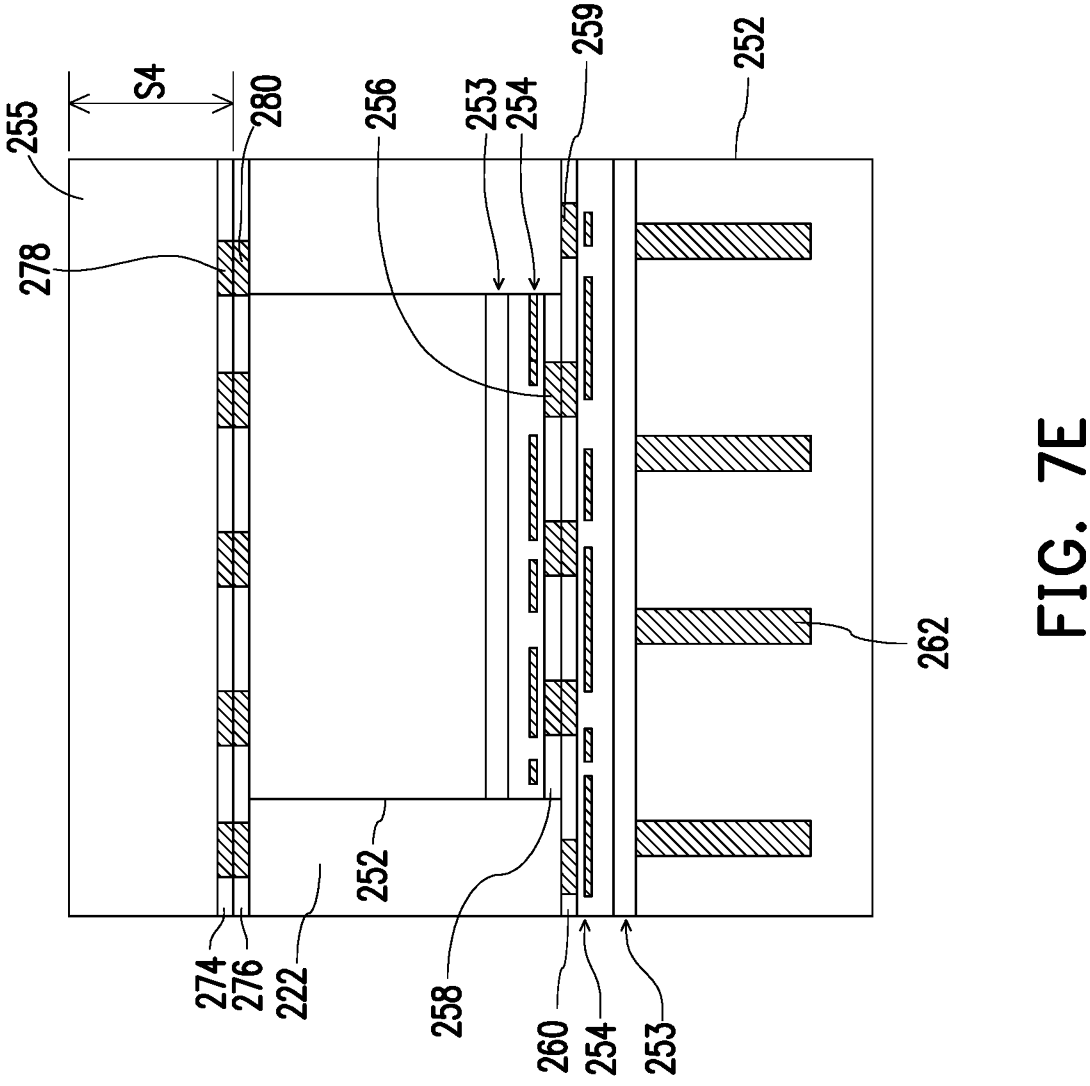

In FIG. 7E, a support substrate 255 is bonded to the insulating material 222 and the inactive surface of the semiconductor substrate 252 of the top die 650B. The support substrate 255 may include a bulk substrate or a wafer, and may be formed of a material such as silicon, ceramic, heat conductive glass, a metal such as copper or iron, or the like. The support substrate 255 may be free of any active or passive devices. In an embodiment, the support substrate 255 may include metallization layer(s) on a top surface of the support substrate 255. In some embodiments, the support substrate is formed of a material that produces a low amount of residue during CMP, such as silicon.

The support substrate 255 is bonded to the inactive surface of the semiconductor substrate 252 of the top die 650B and the insulating material 222 using a suitable technique such as hybrid bonding, or the like. For example, a dielectric layer 274 is formed over the support substrate 255. The dielectric layer 274 may be an oxide, a nitride, a carbide, a polymer, the like, or a combination thereof. The dielectric layer 274 may be formed, for example, by spin coating, lamination, chemical vapor deposition (CVD), or the like. The dielectric layer 274 may then be patterned and openings formed in the dielectric layer 274. Conductive connectors 278 are then formed in the dielectric layer 274. The conductive connectors 278 are formed of a metal, such as copper, aluminum, or the like, and can be formed by, for example, plating, or the like. The conductive connectors 278 may comprise conductive pillars, pads, or the like, to which external connections are made. The conductive connectors 278 may be exposed through the dielectric layer 274 by a removal process that can be applied to the various layers to remove excess materials over the conductive connectors 278. The removal process may be a planarization process such as a chemical mechanical polish (CMP), an etch-back, combinations thereof, or the like. After the planarization process, top surfaces of the die connectors 278 and the dielectric layer 274 are coplanar (within process variations).

The hybrid bonding process then directly bonds the dielectric layer 274 of the support substrate 255 to the dielectric layer 276 of the semiconductor substrate 252 and the insulating material 222 through fusion bonding. In an embodiment, the bond between the dielectric layer 274 and the dielectric layer 276 may be an oxide-to-oxide bond. The hybrid bonding process further directly bonds the conductive connectors 278 of the support substrate 255 to the conductive connectors 280 of the semiconductor substrate 252 and the insulating material 222 through direct metal-to-metal bonding. The hybrid bonding process may be similar to that described previously for the bonding of wafer 56A to the wafer 56B in FIG. 2C above. In an embodiment, the height between a top surface of the support substrate 255 and a bottom surface of the dielectric layer 274 may be a fourth substrate height S4.

Figure 7F:
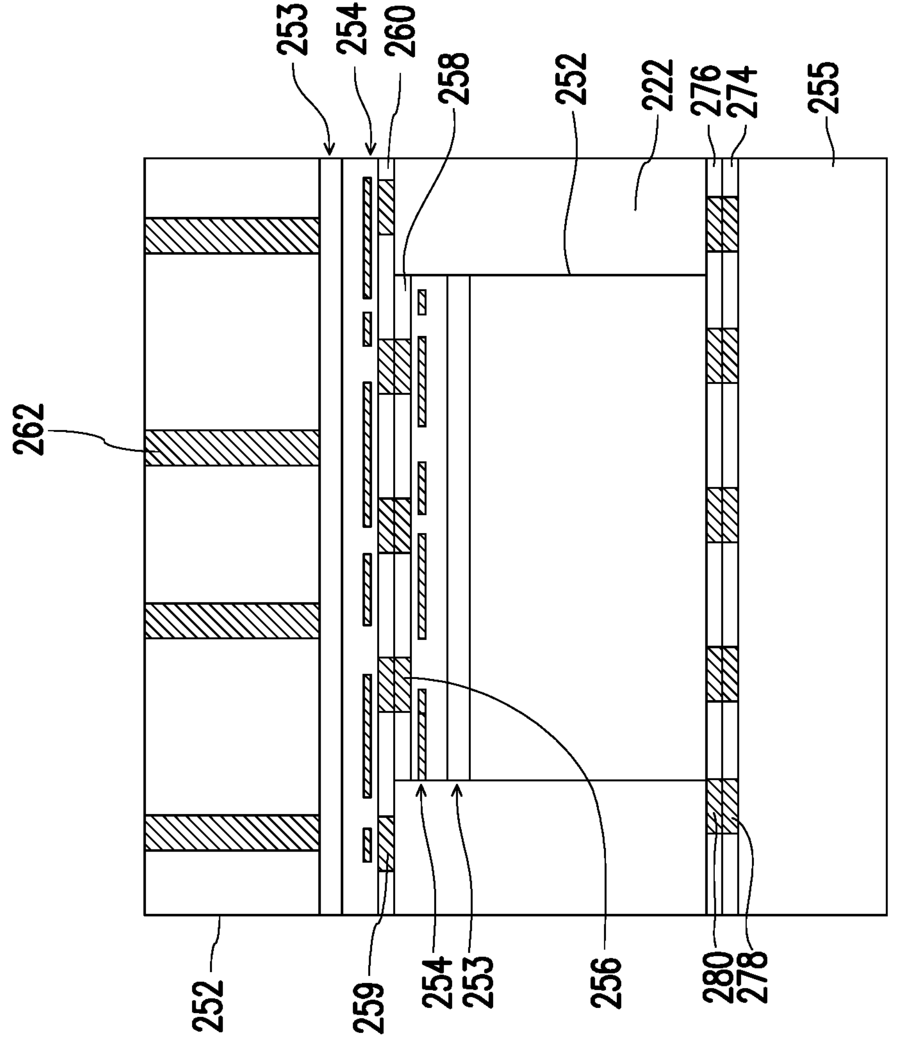

In FIG. 7F, a planarization step such as CMP, or the like, may then be performed to expose the conductive vias 262 of the bottom wafer 650A. After the planarization step, a top surface of the semiconductor substrate 252 of the bottom wafer 650A is level with top surfaces of the conductive vias 262.

Figure 7G:
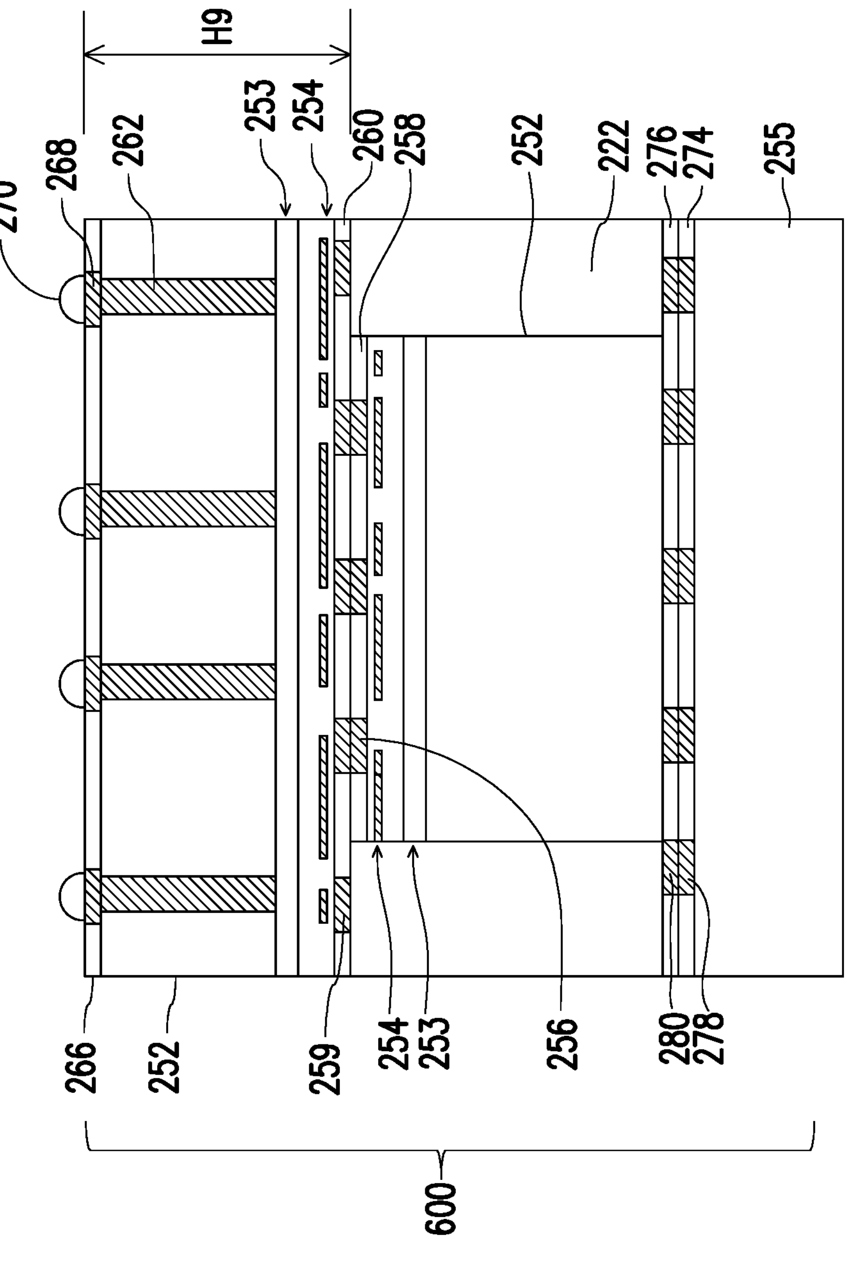

FIG. 7G shows the formation of contact pads 268 and a dielectric layer 266 over the stack 600. The dielectric layer 266 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 266 may be formed, for example, by spin coating, lamination, chemical vapor deposition (CVD), or the like. The contact pads 268 may be used for connections to other devices. In some embodiments, the contact pads are conductive bumps that are suitable for use with reflowable connectors, such as microbumps, extending through the dielectric layer 266. In the illustrated embodiment, the contact pads 268 are formed through the dielectric layer 266. As an example to form the contact pads 268, openings are formed in the dielectric layer 266, and a seed layer is formed over the dielectric layer 266 and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the contact pads 268. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 268. In an embodiment, a ninth height H9 between a bottom surface of the dielectric layer 260 and a top surface of the dielectric layer 266 may be in a range from 15 μm to 30 μm. In an embodiment, the sum of the eighth height H8, the ninth height H9, and the fourth substrate height S4 is equal to or larger than the third height H3. In an embodiment, a top surface of the support substrate 255 is at the same level as a top surface of the HBM device 100. In an embodiment, the top surface of the support substrate 255 is higher than the top surface of the HBM device 100.

Advantages can be achieved as a result of the formation of the integrated circuit package 4000 that includes the top die 650B bonded to the bottom wafer 650A (e.g., to form a logic device), and the HBM device 100. The integrated circuit package 4000 further includes the support substrate 255 over the top die 650B and the bottom wafer 650A. The total thickness of the top die 650B, the bottom wafer 650A, and the support substrate 255 is equal to or greater than the thickness of the HBM device 100. These advantages include allowing for a more even surface that can be used to implement thermal solutions (e.g. a heat spreader may be attached to top surfaces of the support substrate 255 and the HBM device 100) to help improve heat dissipation efficiency in the integrated circuit package 4000. The support substrate 255 also functions as a heat spreader and dissipates heat from the stack 600. Because of the exposed top surface of the support substrate 255, a larger amount of heat can be dissipated through the support substrate 255 and the reliability of the stack 600 is improved. In addition, the support substrate 255 used can be of any thickness to accommodate different types of memory devices that may have different thicknesses.

Figure 8A:
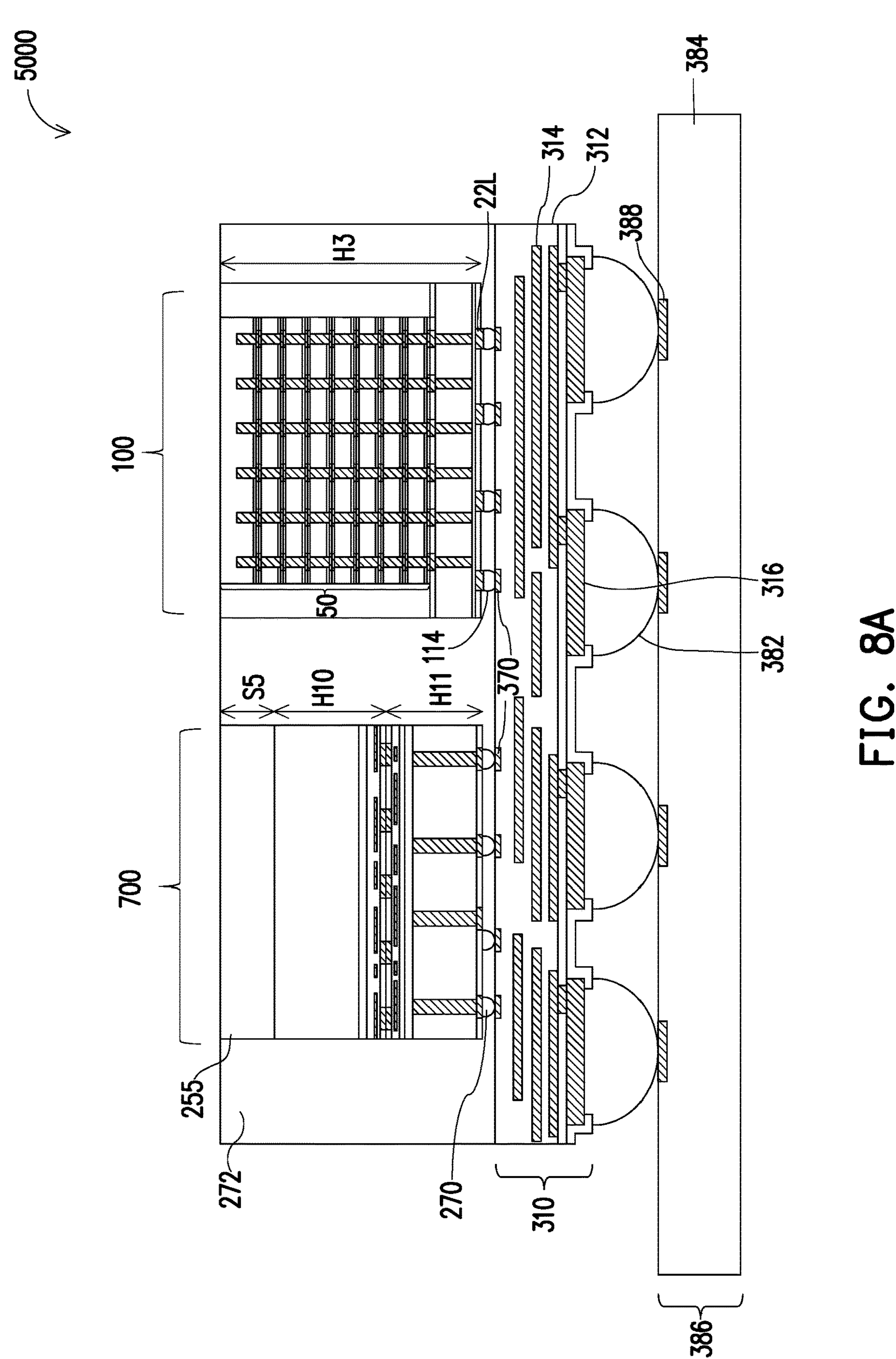
FIG. 8A illustrates a cross-sectional view of an integrated circuit package 5000, in accordance with some embodiments.

FIG. 8A illustrates a cross-sectional view of an integrated circuit package 5000, in which a stack 700 and a HBM device 100 are shown bonded and electrically connected to a structure 310 using conductive connectors 270 and conductive connectors 114, respectively. FIGS. 8B through 8F illustrate cross-sectional views of intermediate steps in the forming of the stack 700, in accordance with an alternate embodiment. Unless specified otherwise, like reference numerals in the integrated circuit package 5000, (and subsequently discussed embodiments) represent like components in the integrated circuit package 1000 of FIGS. 4A through 4I, that are formed by like processes, and unless specified otherwise, like reference numerals in the stack 700, (and subsequently discussed embodiments) represent like components in the stack 200 of FIGS. 4A through 4I, that are formed by like processes. Accordingly, the process steps and applicable materials may not be repeated herein.

Figure 8B:
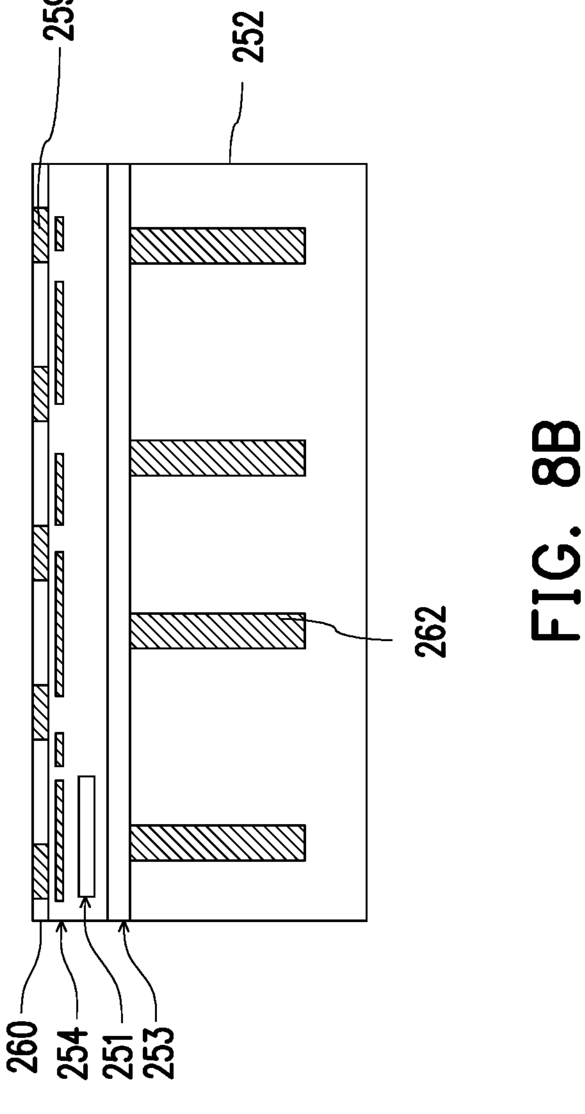
FIGS. 8B through 8F are cross-sectional views of intermediate steps during a process for forming the integrated circuit package 5000, in accordance with some embodiments.

FIG. 8B shows a cross-sectional view of a bottom wafer 750A. Each bottom wafer 750A may comprise a logic die (e.g., central processing unit (CPU), graphics processing unit (GPU), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, an interface die, a sensor die, a micro-electro-mechanical-system (MEMS) die, a signal processing die (e.g., digital signal processing (DSP) die), a front-end die (e.g., analog front-end (AFE) dies), the like, or combinations thereof (e.g., a system-on-a-chip (SoC) die). The bottom wafer 750A may include different die regions that are singulated in subsequent steps to form a plurality of die regions.

In FIG. 8B, a semiconductor substrate 252, and an interconnect structure 254 over the semiconductor substrate 252 are shown. The semiconductor substrate 252 may be a substrate of silicon, doped or undoped, or an active layer of a semiconductor-on-insulator (SOI) substrate. The semiconductor substrate 252 may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The semiconductor substrate 252 has an active surface 253 (e.g., the surface facing upward in FIG. 8B) and an inactive surface (e.g., the surface facing downward in FIG. 8B). The active surface 253 may also be referred to as the active device layer 253. Devices are at the active surface 253 of the semiconductor substrate 252. The devices may be active devices (e.g., transistors, diodes, etc.), capacitors, resistors, etc. The inactive surface may be free from devices.

The interconnect structure 254 is over the active surface 253 of the semiconductor substrate 252, and is used to electrically connect the devices of the semiconductor substrate 252 to form an integrated circuit. The interconnect structure 254 may include one or more dielectric layer(s) and respective metallization layer(s) in the dielectric layer (s). Acceptable dielectric materials for the dielectric layers include oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The metallization layer(s) may include conductive vias and/or conductive lines to interconnect the devices of the semiconductor substrate 252. The metallization layer(s) may be formed of a conductive material, such as a metal, such as copper, cobalt, aluminum, gold, combinations thereof, or the like. The interconnect structure 254 may be formed by a damascene process, such as a single damascene process, a dual damascene process, or the like.

In some embodiments, a contact pad 251 may be formed in the interconnect structure 254 to which external connections are made to the interconnect structure 254 and the devices of the active layer 253. The contact pad 251 is disposed over the active surface 253. The contact pad 251 may comprise copper, aluminum (e.g., 28K aluminum), or another conductive material. The contact pad 251 may not be explicitly shown in subsequent figures.

Conductive vias 262 may be formed through the bottom wafer 750A to allow external connections to be made to the stack 700 (shown subsequently in FIG. 8F). The conductive vias 262 may be through-substrate vias (TSVs), such as through-silicon vias or the like. The conductive vias 262 extend through the semiconductor substrate 252 of the bottom wafer 750A, to be physically and electrically connected to the metallization layer(s) of the interconnect structure 254.

Still referring to FIG. 8B, conductive connectors 259 are shown which may be in and/or on the interconnect structure 254 of the bottom wafer 750A. For example, the conductive connectors 259 may be part of an upper metallization layer of the interconnect structure 254. The conductive connectors 259 can be formed of a metal, such as copper, aluminum, or the like, and can be formed by, for example, plating, or the like. The conductive connectors 259 may be conductive pillars, pads, or the like, to which external connections are made.

A dielectric layer 260 is in and/or on the interconnect structure 254. For example, the dielectric layer 260 may be an upper dielectric layer of the interconnect structure 254. The dielectric layer 260 laterally encapsulates the conductive connectors 259. The dielectric layer 260 may be an oxide, a nitride, a carbide, a polymer, the like, or a combination thereof. The dielectric layer 260 may be formed, for example, by spin coating, lamination, chemical vapor deposition (CVD), or the like. Initially, the dielectric layer 260 may bury the conductive connectors 259, such that the top surface of the dielectric layer 260 is above the top surfaces of the conductive connectors 259. The conductive connectors 259 may be exposed through the dielectric layer 260 by a removal process that can be applied to the various layers to remove excess materials over the conductive connectors 259. The removal process may be a planarization process such as a chemical mechanical polish (CMP), an etch-back, combinations thereof, or the like. After the planarization process, top surfaces of the die connectors 259 and the dielectric layer 260 are coplanar (within process variations).

Figure 8C:
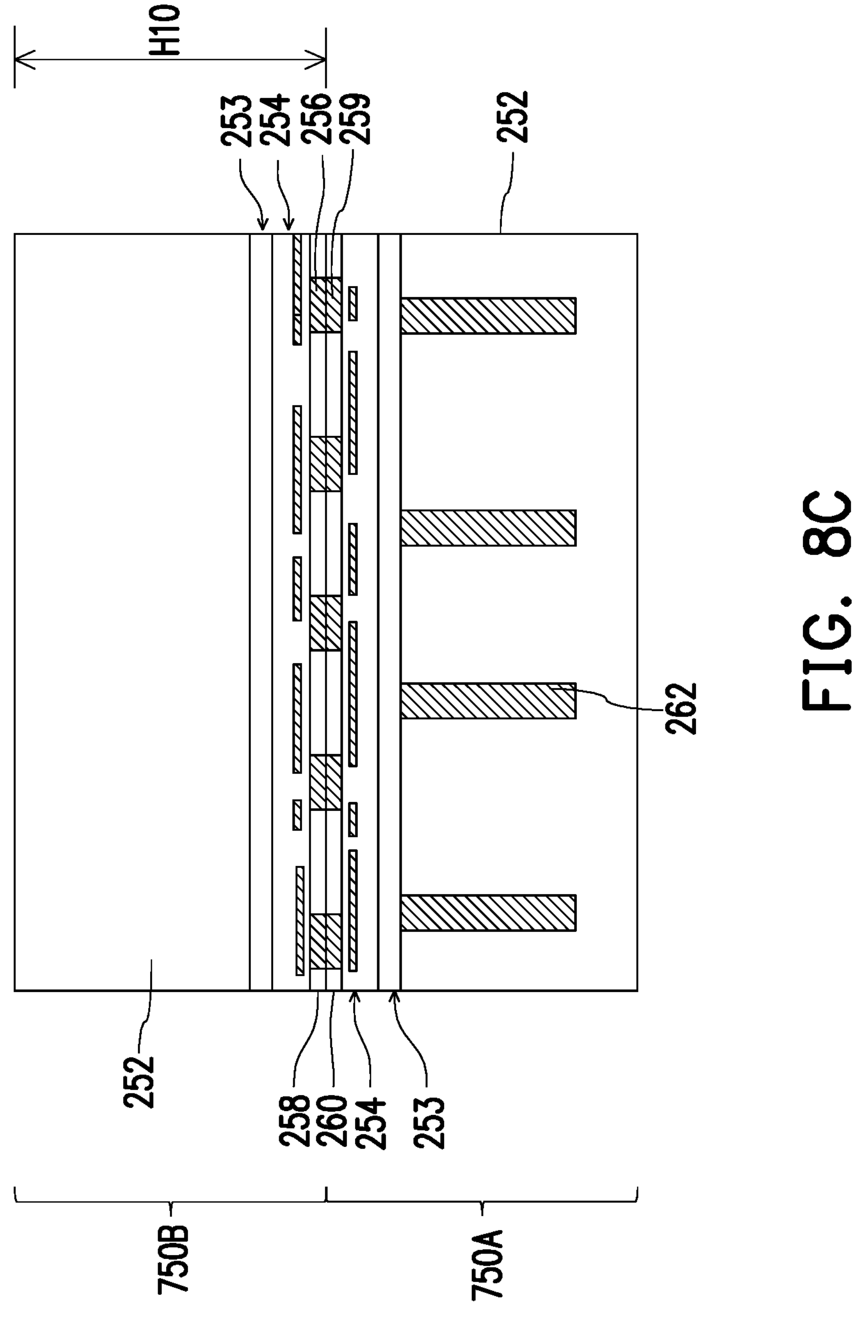

In FIG. 8C, a top wafer 750B is bonded to the bottom wafer 750A to form a system-on-integrated-chip (SoIC) device. It should be appreciated that embodiments may be applied to other three-dimensional integrated circuit (3DIC) packages. The top wafer 750B may include different die regions that are singulated in subsequent steps to form a plurality of die regions. The top wafer 750B includes a semiconductor substrate 252, an interconnect structure 254, and may include an active surface 253, which are similar to those described for FIG. 8B. In addition, the top wafer 750B may comprise conductive connectors 256, and a dielectric layer 258 which may be in and/or on the interconnect structure 254 of the top wafer 750B. The conductive connectors 256 may be formed using like processes and like materials as the conductive connectors 259 (described previously in FIG. 8B). The dielectric layer 258 may be formed using like processes and like materials as the dielectric layer 260 (described previously in FIG. 8B). In an embodiment, the top wafer 750B has a tenth height H10 that may be equal to or less than 780 μm.

In some embodiments, the top wafer 750B comprises a logic die, and the bottom wafer 750A is used as an interface to bridge the logic die to memory devices (e.g., memory devices 11 of the HBM device 100 shown in FIG. 8A), and to translate commands between the logic die and the memory devices. In some embodiments, the top wafer 750B and the bottom wafer 750A are bonded such that the active surfaces 253 are facing each other (e.g., are "face-to-face" bonded).

The bottom wafer 750A is bonded to the top wafer 750B, for example, using a hybrid bonding process that may be similar to that described previously for the bonding of wafer 56A to the wafer 56B in FIG. 2C above. The hybrid bonding process directly bonds the dielectric layer 260 of the bottom wafer 750A to the dielectric layer 258 of the top wafer 750B through fusion bonding. In an embodiment, the bond between the dielectric layer 260 and the dielectric layer 258 may be an oxide-to-oxide bond. The hybrid bonding process further directly bonds the conductive connectors 259 of the bottom wafer 750A and the conductive connectors 256 of the top wafer 750B through direct metal-to-metal bonding. Thus, the bottom wafer 750A and the top wafer 750B are electrically connected.

Figure 8D:
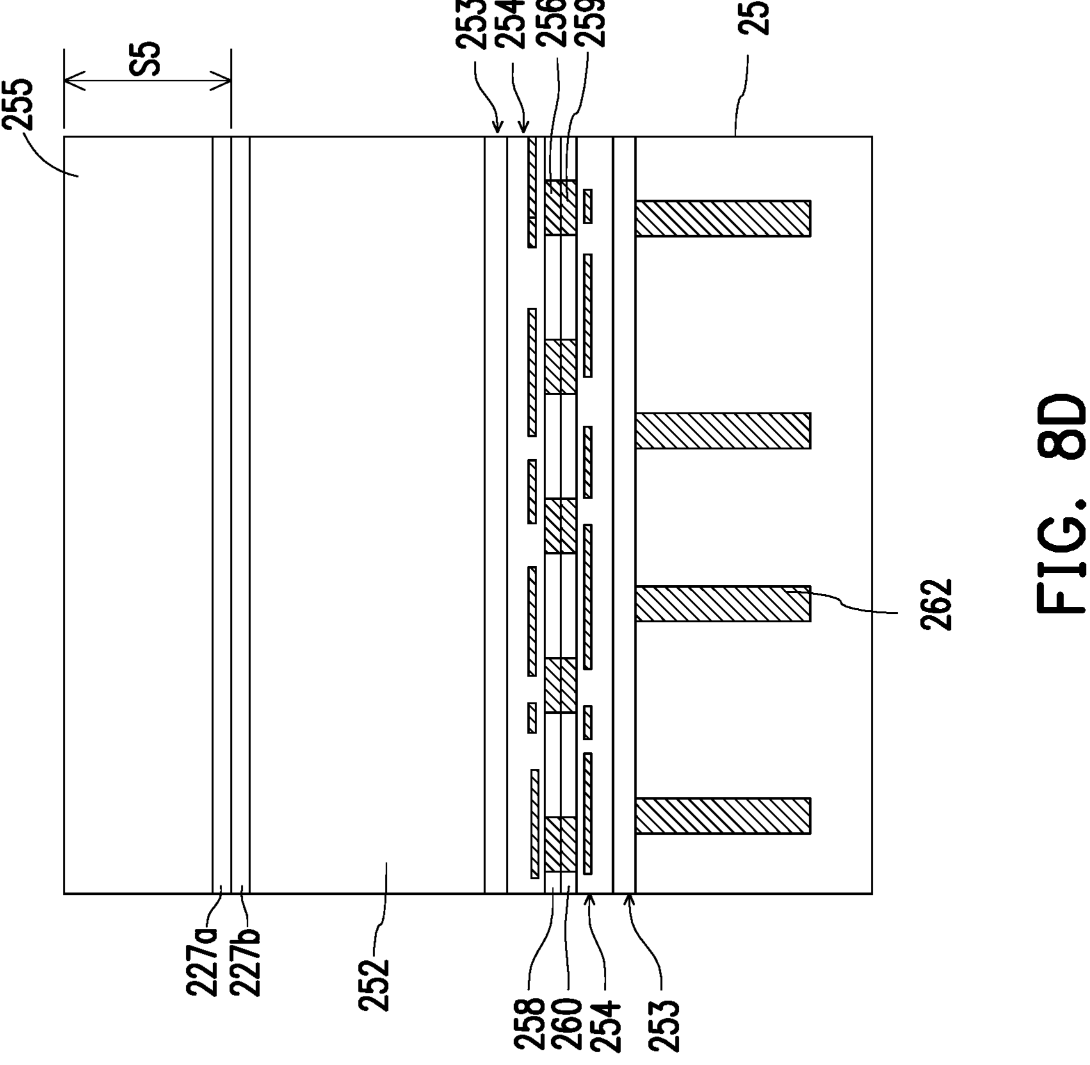

In FIG. 8D, a support substrate 255 is bonded to a top surface of the inactive surface of the semiconductor substrate 252 of the top wafer 750B. The support substrate 255 may include a bulk substrate or a wafer, and may be formed of a material such as silicon, ceramic, heat conductive glass, a metal such as copper or iron, or the like. The support substrate 255 may be free of any active or passive devices. In an embodiment, the support substrate 255 may include metallization layer(s) on a top surface of the support substrate 255. In some embodiments, the support substrate is formed of a material that produces a low amount of residue during CMP, such as silicon. In an embodiment, the height of the support substrate 255 may be a fifth substrate height S5.

The support substrate 255 is bonded to the top surfaces of the inactive surface of the semiconductor substrate 252 of the top wafer 750B using a suitable technique such as fusion bonding, or the like. For example, in various embodiments, the support substrate 255 may be bonded to the semiconductor substrate 252 using bonding layers 227_a/b_ on the surfaces of the support substrate 255 and the semiconductor substrate 252, respectively. In some embodiments, the bonding layers 227_a/b_ may each comprise silicon oxide formed on the surfaces of the support substrate 255 and the semiconductor substrate 252, respectively by a deposition process, such as chemical vapor deposition (CVD), physical vapor deposition (PVD), or the like. In other embodiments, the bonding layers 227_a/b_ on the support substrate 255 and the semiconductor substrate 252 may be formed by the thermal oxidation of silicon surfaces on the support substrate 255 and the semiconductor substrate 252, respectively.

Prior to bonding, one or more of the bonding layers 227_a/b_ may be subjected to a surface treatment. The surface treatment may include a plasma treatment. The plasma treatment may be performed in a vacuum environment. After the plasma treatment, the surface treatment may further include a cleaning process (e.g., a rinse with deionized water, or the like) that may be applied to at least one of the bonding layers 227_a/b_. The support substrate 255 is then aligned with the semiconductor substrate 252, and pressed against each other to initiate a pre-bonding of the support substrate 255 to the semiconductor substrate 252. The pre-bonding may be performed at room temperature (between about 21 degrees and about 25 degrees). The bonding time may be shorter than about 1 minute, for example. After the pre-bonding, the semiconductor substrate 252 is bonded to the support substrate 255. The bonding process may be strengthened by a subsequent annealing step. For example, this may be done by heating the semiconductor substrate 252 and the support substrate 255 to a temperature in a range from 140° C. to 500° C. The bonding layers 227_a/b_ may not be shown in subsequent figures.

Figure 8E:
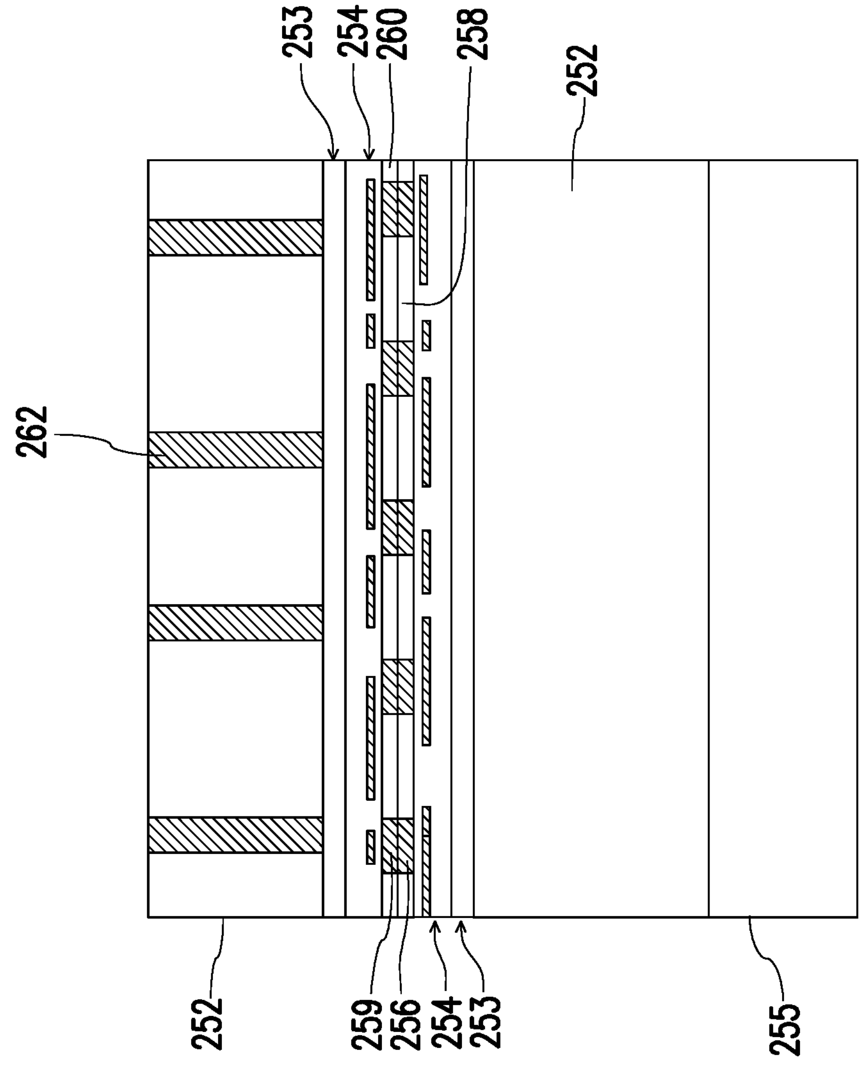

In FIG. 8E, a planarization step such as CMP, or the like, may then be performed to expose the conductive vias 262 of the bottom wafer 750A. After the planarization step, a top surface of the semiconductor substrate 252 of the bottom wafer 750A is level with top surfaces of the conductive vias 262.

Figure 8F:
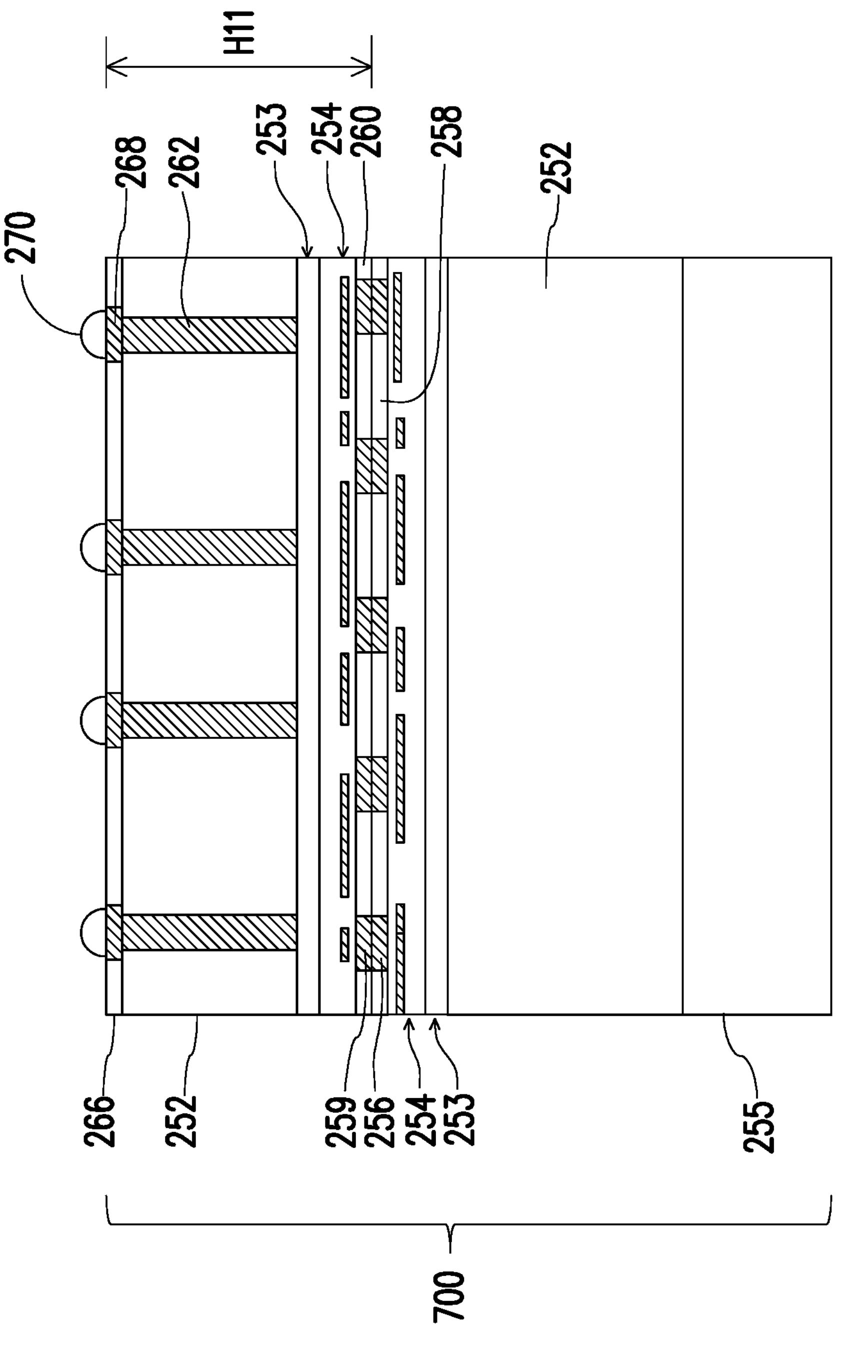

FIG. 8F shows the formation of contact pads 268 and a dielectric layer 266 over the stack 700. The dielectric layer 266 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 266 may be formed, for example, by spin coating, lamination, chemical vapor deposition (CVD), or the like. The contact pads 268 may be used for connections to other devices. In some embodiments, the contact pads are conductive bumps that are suitable for use with reflowable connectors, such as microbumps, extending through the dielectric layer 266. In the illustrated embodiment, the contact pads 268 are formed through the dielectric layer 266. As an example to form the contact pads 268, openings are formed in the dielectric layer 266, and a seed layer is formed over the dielectric layer 266 and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the contact pads 268. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 268. In an embodiment, an eleventh height H11 between a bottom surface of the dielectric layer 260 and a top surface of the dielectric layer 266 may be in a range from 15 μm to 30 μm. In an embodiment, the sum of the tenth height H10, the eleventh height H11, and the fifth substrate height S5 is equal to or larger than the third height H3. In an embodiment, a top surface of the support substrate 255 is at the same level as a top surface of the HBM device 100. In an embodiment, the top surface of the support substrate 255 is higher than the top surface of the HBM device 100.

Advantages can be achieved as a result of the formation of the integrated circuit package 5000 that includes the top wafer 750B bonded to the bottom wafer 750A (e.g., to form a logic device), and the HBM device 100. The integrated circuit package 5000 further includes the support substrate 255 over the top wafer 750B and the bottom wafer 750A. The total thickness of the top wafer 750B, the bottom wafer 750A, and the support substrate 255 is equal to or greater than the thickness of the HBM device 100. These advantages include allowing for a more even surface that can be used to implement thermal solutions (e.g. a heat spreader may be attached to top surfaces of the support substrate 255 and the HBM device 100) to help improve heat dissipation efficiency in the integrated circuit package 5000. The support substrate 255 also functions as a heat spreader and dissipates heat from the stack 700. Because of the exposed top surface of the support substrate 255, a larger amount of heat can be dissipated through the support substrate 255 and the reliability of the stack 700 is improved. In addition, the support substrate 255 used can be of any thickness to accommodate different types of memory devices that may have different thicknesses.

Figure 9A:
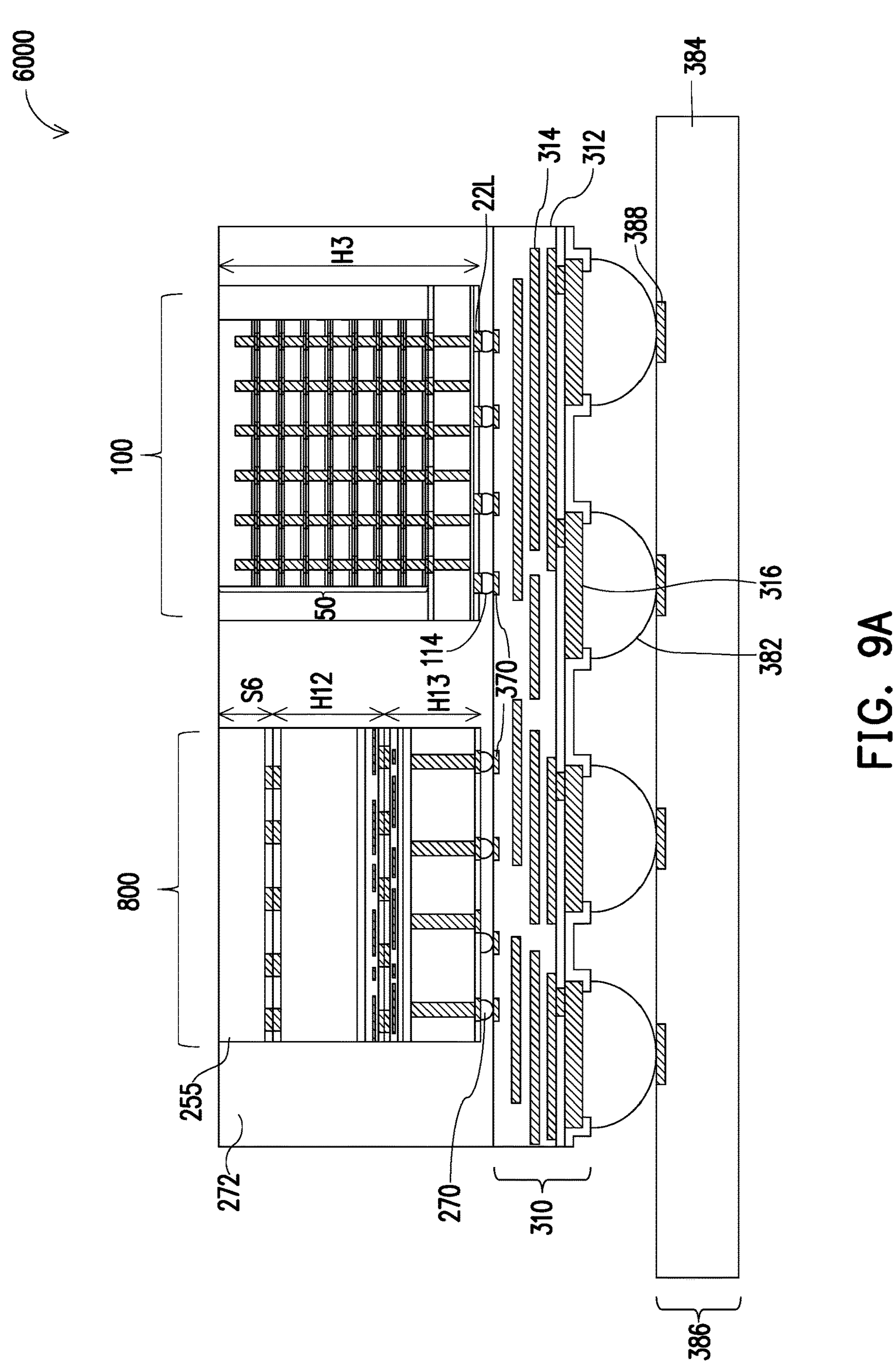
FIG. 9A illustrates a cross-sectional view of an integrated circuit package 6000, in accordance with some embodiments.

FIG. 9A illustrates a cross-sectional view of an integrated circuit package 6000, in which a stack 800 and a HBM device 100 are shown bonded and electrically connected to a structure 310 using conductive connectors 270 and conductive connectors 114, respectively. FIGS. 9B through 9G illustrate cross-sectional views of intermediate steps in the forming of the stack 800, in accordance with an alternate embodiment. Unless specified otherwise, like reference numerals in the integrated circuit package 6000, (and subsequently discussed embodiments) represent like components in the integrated circuit package 1000 of FIGS. 4A through 4I, that are formed by like processes, and unless specified otherwise, like reference numerals in the stack 800, (and subsequently discussed embodiments) represent like components in the stack 200 of FIGS. 4A through 4I, that are formed by like processes. Accordingly, the process steps and applicable materials may not be repeated herein.

Figure 9B:
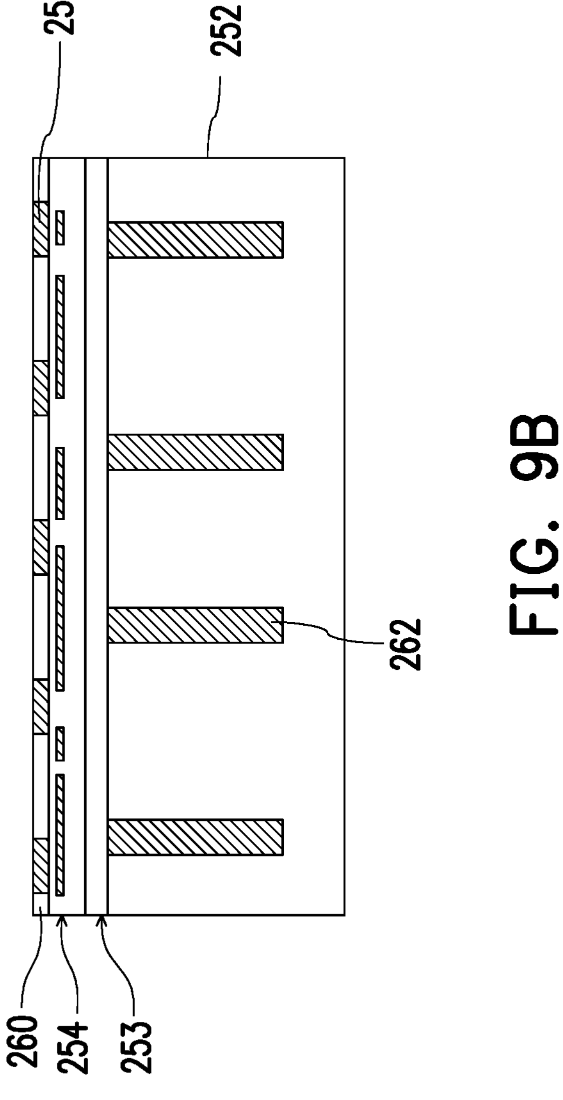
FIGS. 9B through 9G are cross-sectional views of intermediate steps during a process for forming the integrated circuit package 6000, in accordance with some embodiments.

FIG. 9B shows a cross-sectional view of a bottom wafer 850A. The bottom wafer 850A may include different die regions that are singulated in subsequent steps to form a plurality of die regions. The bottom wafer 850A and the bottom wafer 750A shown previously in FIG. 8B may be essentially the same, with like reference numerals representing like components. Accordingly, the process steps and applicable materials may not be repeated herein.

Figure 9C:
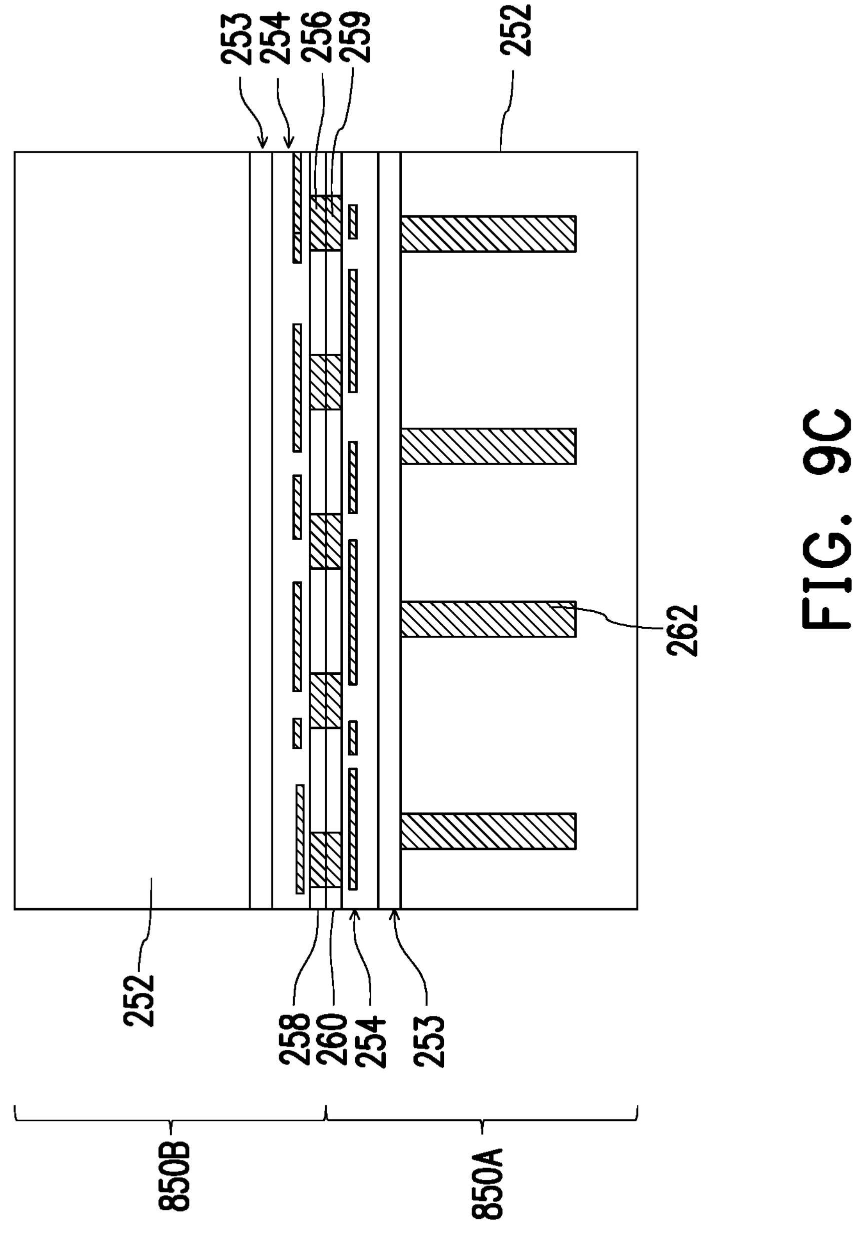

In FIG. 9C, a top wafer 850B is bonded to the bottom wafer 850A to form a system-on-integrated-chip (SoIC) device. It should be appreciated that embodiments may be applied to other three-dimensional integrated circuit (3DIC) packages. The top wafer 850B may include different die regions that are singulated in subsequent steps to form a plurality of die regions. The top wafer 850B and the top wafer 750B shown previously in FIG. 8C may be essentially the same, with like reference numerals representing like components. Accordingly, the process steps and applicable materials may not be repeated herein.

In some embodiments, the top wafer 850B comprises a logic die, and the bottom wafer 850A is used as an interface to bridge the logic die to memory devices (e.g., memory devices 11 of the HBM device 100 shown in FIG. 9A), and to translate commands between the logic die and the memory devices. In some embodiments, the top wafer 850B and the bottom wafer 850A are bonded such that active surfaces 253 are facing each other (e.g., are "face-to-face" bonded).

The bottom wafer 850A is bonded to the top wafer 850B, for example, using a hybrid bonding process that may be similar to that described previously for the bonding of wafer 56A to the wafer 56B in FIG. 2C above. The hybrid bonding process directly bonds the dielectric layer 260 of the bottom wafer 850A to the dielectric layer 258 of the top wafer 850B through fusion bonding. In an embodiment, the bond between the dielectric layer 260 and the dielectric layer 258 may be an oxide-to-oxide bond. The hybrid bonding process further directly bonds the conductive connectors 259 of the bottom wafer 850A and the conductive connectors 256 of the top wafer 850B through direct metal-to-metal bonding. Thus, the bottom wafer 850A and the top wafer 850B are electrically connected.

Figure 9D:
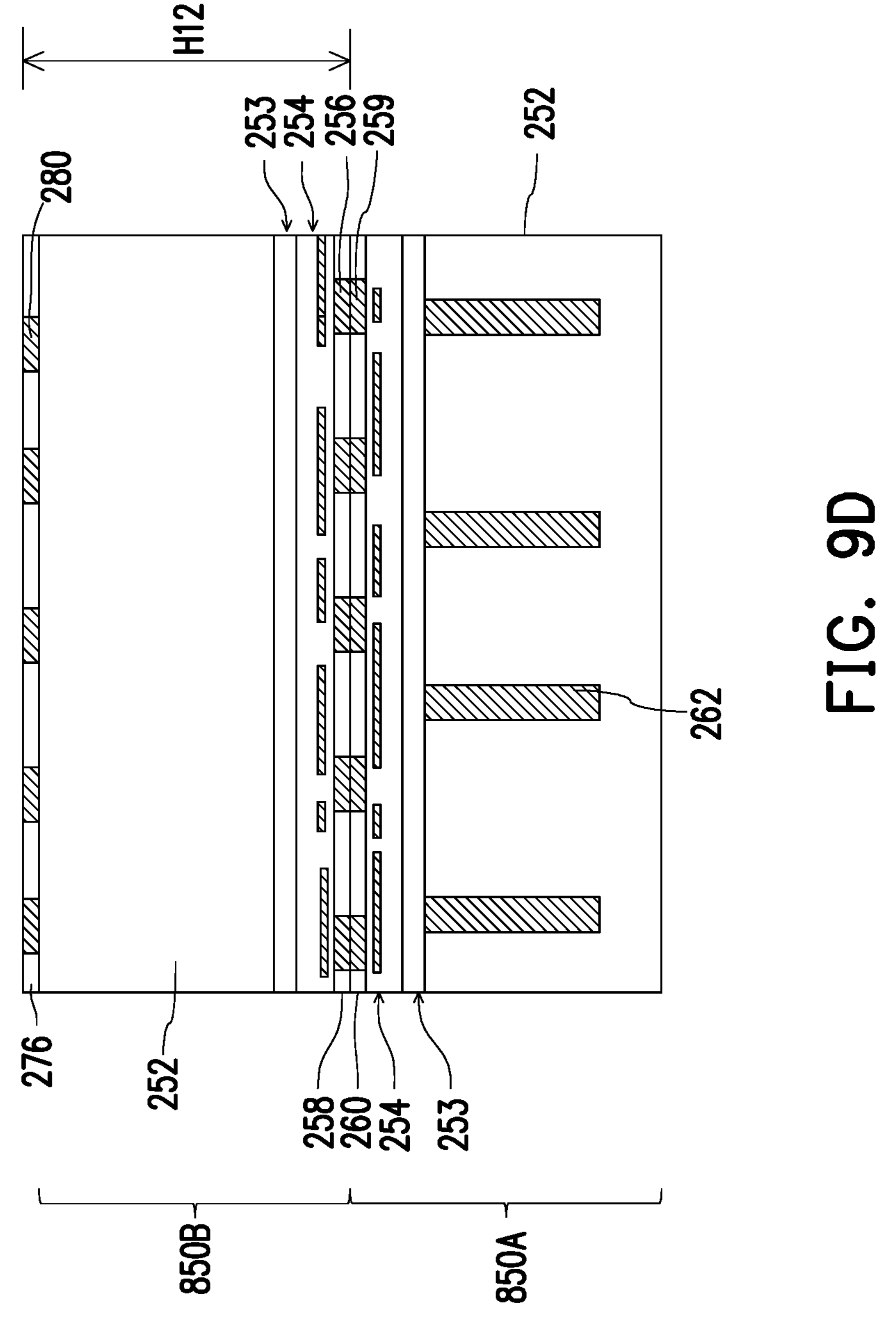

In FIG. 9D, a dielectric layer 276 is formed over top surfaces of the top wafer 850B. The dielectric layer 276 and the may be an oxide, a nitride, a carbide, a polymer, the like, or a combination thereof. The dielectric layer 276 may be formed, for example, by spin coating, lamination, chemical vapor deposition (CVD), or the like. The dielectric layer 276 may then be patterned and openings formed in the dielectric layer 276. Conductive connectors 280 are then formed in the dielectric layer 276. The conductive connectors 280 are formed of a metal, such as copper, aluminum, or the like, and can be formed by, for example, plating, or the like. The conductive connectors 280 may comprise conductive pillars, pads, or the like, to which external connections are made. The conductive connectors 280 may be exposed through the dielectric layer 276 by a removal process that can be applied to the various layers to remove excess materials over the conductive connectors 278. The removal process may be a planarization process such as a chemical mechanical polish (CMP), an etch-back, combinations thereof, or the like. After the planarization process, top surfaces of the die connectors 280 and the dielectric layer 276 are coplanar (within process variations). In an embodiment, a twelfth height H12 between a top surface of the dielectric layer 276 and a bottom surface of the dielectric layer 258 may be less than or equal to 780 μm.

Figure 9E:
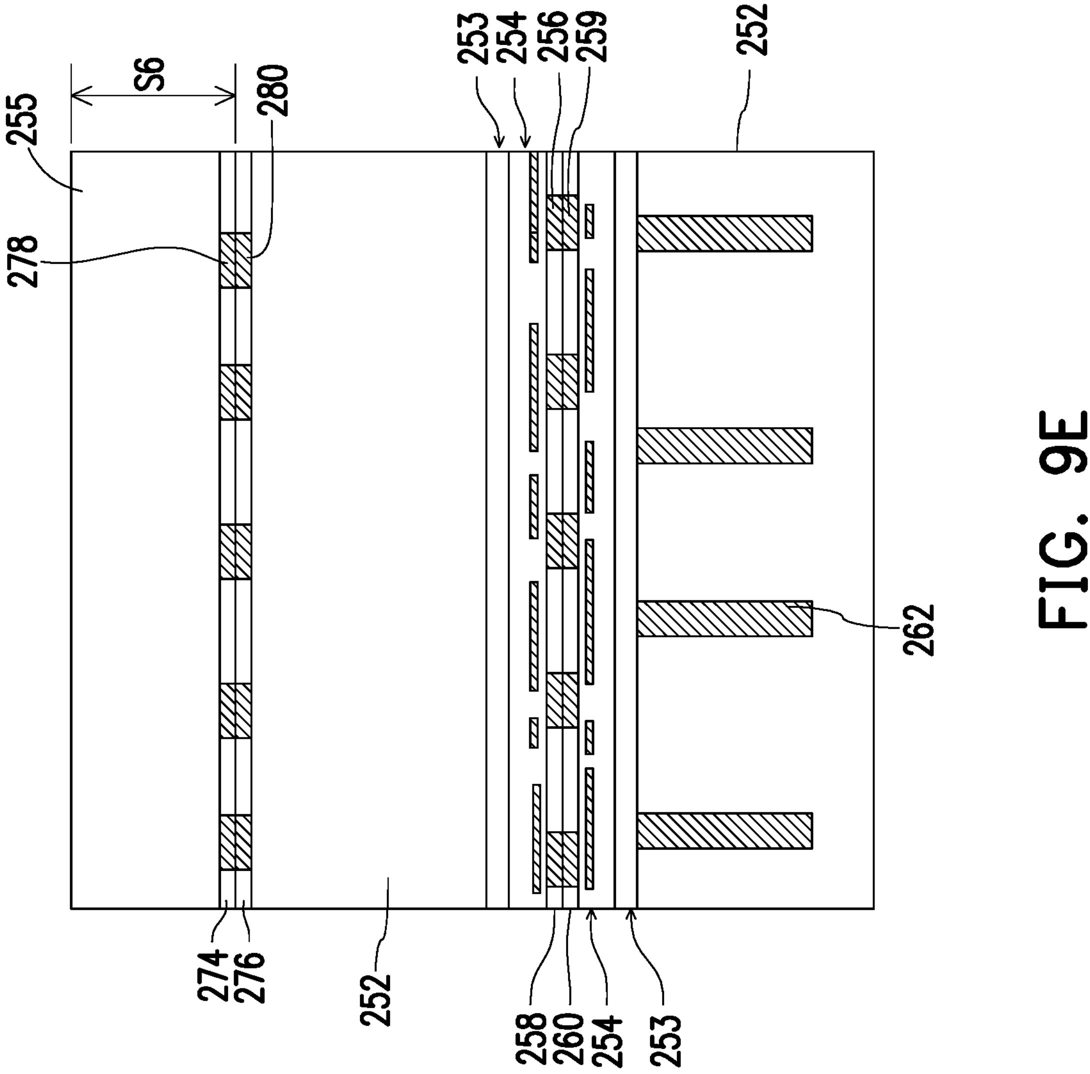

In FIG. 9E, a support substrate 255 is bonded to an inactive surface of the semiconductor substrate 252 of the top wafer 850B. The support substrate 255 may include a bulk substrate or a wafer, and may be formed of a material such as silicon, ceramic, heat conductive glass, a metal such as copper or iron, or the like. The support substrate 255 may be free of any active or passive devices. In an embodiment, the support substrate 255 may include metallization layer(s) on a top surface of the support substrate 255. In some embodiments, the support substrate is formed of a material that produces a low amount of residue during CMP, such as silicon.

The support substrate 255 is bonded to the inactive surface of the semiconductor substrate 252 of the top wafer 850B using a suitable technique such as hybrid bonding, or the like. For example, a dielectric layer 274 is formed over the support substrate 255. The dielectric layer 274 may be an oxide, a nitride, a carbide, a polymer, the like, or a combination thereof. The dielectric layer 274 may be formed, for example, by spin coating, lamination, chemical vapor deposition (CVD), or the like. The dielectric layer 274 may then be patterned and openings formed in the dielectric layer 274. Conductive connectors 278 are then formed in the dielectric layer 274. The conductive connectors 278 are formed of a metal, such as copper, aluminum, or the like, and can be formed by, for example, plating, or the like. The conductive connectors 278 may comprise conductive pillars, pads, or the like, to which external connections are made. The conductive connectors 278 may be exposed through the dielectric layer 274 by a removal process that can be applied to the various layers to remove excess materials over the conductive connectors 278. The removal process may be a planarization process such as a chemical mechanical polish (CMP), an etch-back, combinations thereof, or the like. After the planarization process, top surfaces of the die connectors 278 and the dielectric layer 274 are coplanar (within process variations).

The hybrid bonding process then directly bonds the dielectric layer 274 of the support substrate 255 to the dielectric layer 276 of the semiconductor substrate 252 through fusion bonding. In an embodiment, the bond between the dielectric layer 274 and the dielectric layer 276 may be an oxide-to-oxide bond. The hybrid bonding process further directly bonds the conductive connectors 278 of the support substrate 255 to the conductive connectors 280 of the semiconductor substrate 252 through direct metal-to-metal bonding. The hybrid bonding process may be similar to that described previously for the bonding of wafer 56A to the wafer 56B in FIG. 2C above.

In an embodiment, the height between a top surface of the support substrate 255 and a bottom surface of the dielectric layer 274 may be a sixth substrate height S6.

Figure 9F:
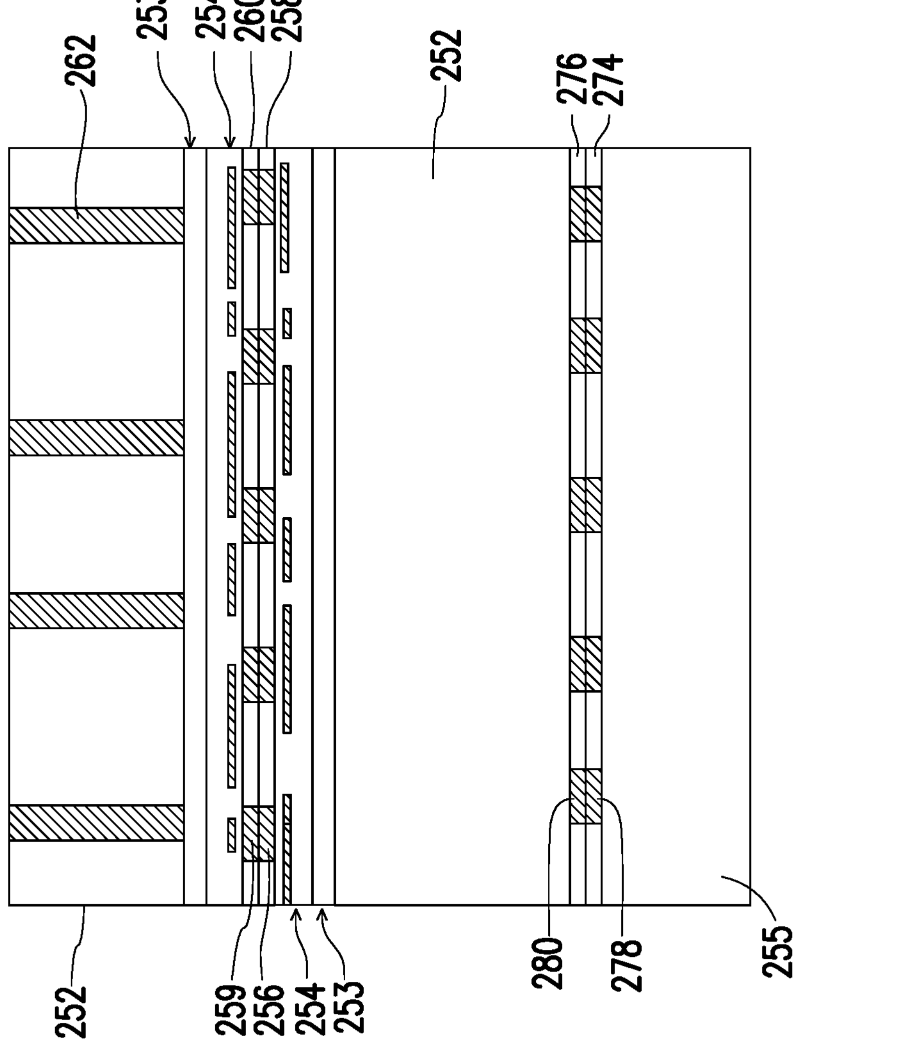

In FIG. 9F, a planarization step such as CMP, or the like, may then be performed to expose the conductive vias 262 of the bottom wafer 850A. After the planarization step, a top surface of the semiconductor substrate 252 of the bottom wafer 850A is level with top surfaces of the conductive vias 262.

Figure 9G:
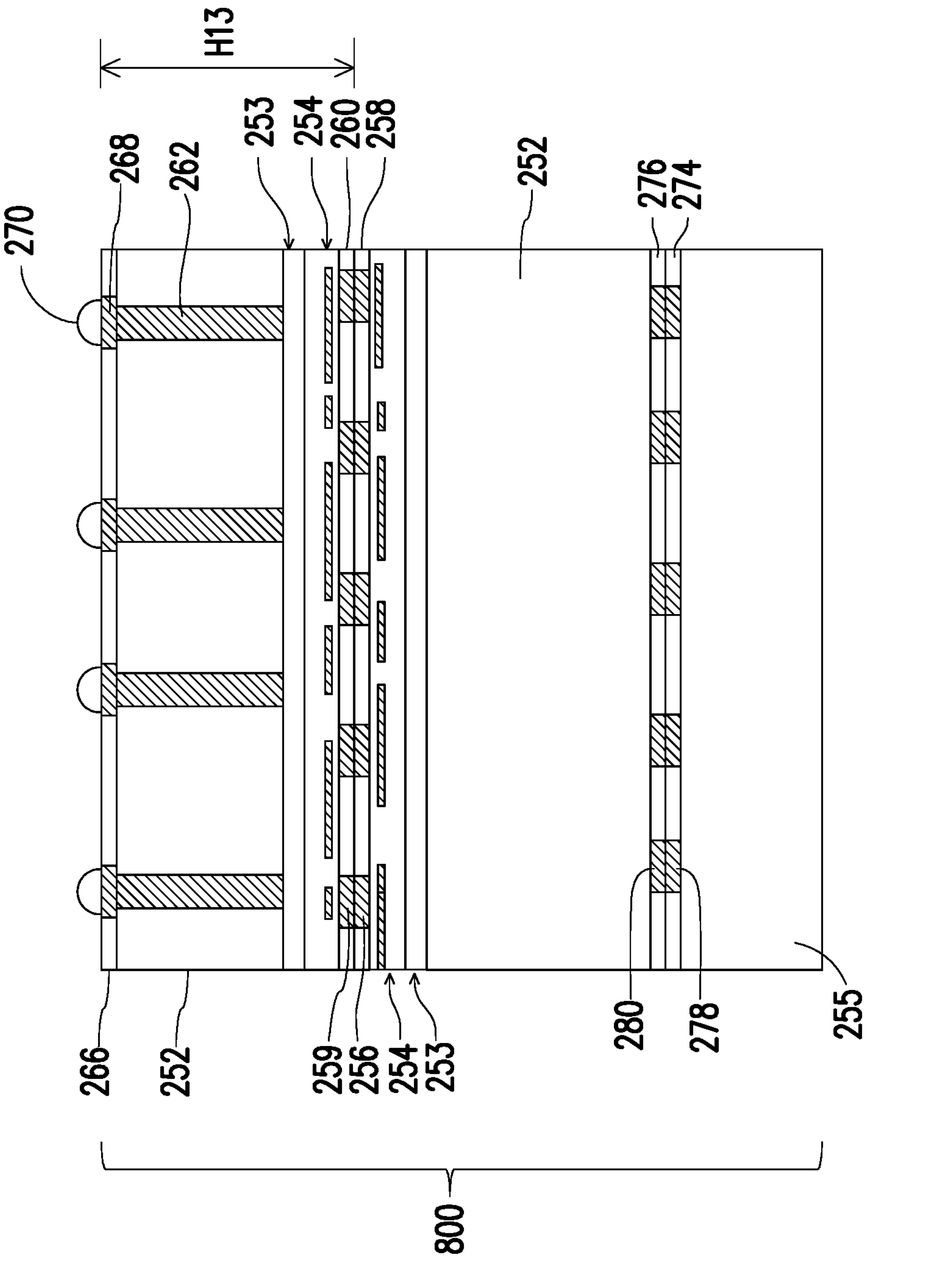

FIG. 9G shows the formation of contact pads 268 and a dielectric layer 266 over the stack 800. The dielectric layer 266 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 266 may be formed, for example, by spin coating, lamination, chemical vapor deposition (CVD), or the like. The contact pads 268 may be used for connections to other devices. In some embodiments, the contact pads are conductive bumps that are suitable for use with reflowable connectors, such as microbumps, extending through the dielectric layer 266. In the illustrated embodiment, the contact pads 268 are formed through the dielectric layer 266. As an example to form the contact pads 268, openings are formed in the dielectric layer 266, and a seed layer is formed over the dielectric layer 266 and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the contact pads 268. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the contact pads 268. In an embodiment, a thirteenth height H13 between a bottom surface of the dielectric layer 260 and a top surface of the dielectric layer 266 may be in a range from 15 μm to 30 μm. In an embodiment, the sum of the twelfth height H12, the thirteenth height H13, and the sixth substrate height S6 is equal to or larger than the third height H3. In an embodiment, a top surface of the support substrate 255 is at the same level as a top surface of the HBM device 100. In an embodiment, the top surface of the support substrate 255 is higher than the top surface of the HBM device 100.

Advantages can be achieved as a result of the formation of the integrated circuit package 6000 that includes the top wafer 850B bonded to the bottom wafer 850A (e.g., to form a logic device), and the HBM device 100. The integrated circuit package 6000 further includes the support substrate 255 over the top wafer 850B and the bottom wafer 850A. The total thickness of the top wafer 850B, the bottom wafer 850A, and the support substrate 255 is equal to or greater than the thickness of the HBM device 100. These advantages include allowing for a more even surface that can be used to implement thermal solutions (e.g. a heat spreader may be attached to top surfaces of the support substrate 255 and the HBM device 100) to help improve heat dissipation efficiency in the integrated circuit package 6000. The support substrate 255 also functions as a heat spreader and dissipates heat from the stack 800. Because of the exposed top surface of the support substrate 255, a larger amount of heat can be dissipated through the support substrate 255 and the reliability of the stack 800 is improved. In addition, the support substrate 255 used can be of any thickness to accommodate different types of memory devices that may have different thicknesses.

The embodiments of the present disclosure have some advantageous features. The embodiments include the formation of an integrated circuit package that includes a first integrated circuit device bonded to a second integrated circuit device (e.g., to form a logic device), and a memory device. A total thickness of the first integrated circuit device and the second integrated circuit device is smaller than a thickness of the memory device, and the integrated circuit package further includes a support substrate over the first integrated circuit device and the second integrated circuit device. The total thickness of the first integrated circuit device, the second integrated circuit device and the support substrate is equal to or greater than the thickness of the memory device. one or more embodiments disclosed herein may include allowing for a more even surface that can be used to implement thermal solutions (e.g. a heat spreader may be attached to top surfaces of the support substrate and the memory device) to help improve heat dissipation efficiency in the integrated circuit package. In addition, the support substrate used can be of any thickness to accommodate different types of memory devices that may have different thicknesses.

In accordance with an embodiment, a semiconductor package includes a redistribution structure; a first device and a second device attached to the redistribution structure, the first device includes a first die; a substrate bonded to a first surface of the first die; and a second die bonded to a second surface of the first die opposite the first surface, includes a total height of the first die and the second die is less than a first height of the second device, and includes a top surface of the substrate is at least as high as a top surface of the second device; and an encapsulant over the redistribution structure and surrounding the first device and the second device. In an embodiment, the bond between the substrate and the first die includes a fusion bond between a first bonding layer on the substrate and a second bonding layer on the first die. In an embodiment, the substrate includes silicon, ceramic, heat conductive glass, or a metal. In an embodiment, the second device includes a memory device. In an embodiment, a top surface of the encapsulant is coplanar with the top surface of the substrate. In an embodiment, a second height of the first device is larger than 900 μm. In an embodiment, the substrate includes a metallization layer on the top surface of the substrate. In an embodiment, the semiconductor package further includes a package substrate attached to an opposite side of the redistribution structure as the first device and the second device; and an underfill between the redistribution structure and the package substrate.

In accordance with an embodiment, a method includes forming a first device, where forming the first device includes bonding a first surface of a first die to a substrate; thinning the substrate to reduce the thickness of the substrate to a first thickness; and bonding a second surface of the first die to a second die; attaching the first device and a second device to a redistribution structure; encapsulating the first device and the second device with an encapsulant; and thinning the encapsulant until a top surface of the encapsulant is coplanar with a top surface of the substrate. In an embodiment, the substrate includes silicon, ceramic, heat conductive glass, or a metal. In an embodiment, the top surface of the substrate is at the same height or higher than a top surface of the second device. In an embodiment, the first device is a logic device and the second device is a memory device. In an embodiment, bonding the first surface of the first die to the substrate includes fusion bonding a first bonding layer on the substrate to a second bonding layer on the first die. In an embodiment, bonding the first surface of the first die to the substrate includes directly bonding a first dielectric layer on the first die to a second dielectric layer on the substrate; and directly bonding first conductive connectors on the first die to second conductive connectors on the substrate.

In accordance with an embodiment, a method includes forming a first device, where forming the first device includes bonding a first surface of a first die to a second die; bonding a substrate to a top surface of the second die, where the substrate is free of active or passive devices; and attaching the first device and a second device to a redistribution structure; encapsulating the first device and the second device with an encapsulant; and thinning the encapsulant until a top surface of the substrate is exposed. In an embodiment, the method further includes thinning a second surface of the first die to expose conductive vias; surrounding the second die with an insulating material; and bonding the substrate to a top surface of the insulating material. In an embodiment, bonding the substrate to top surfaces of the insulating material and the second die includes directly bonding a first bonding layer on the substrate to a second bonding layer on the insulating material and the second die. In an embodiment, bonding the substrate to top surfaces of the insulating material and the second die includes directly bonding a first dielectric layer on the substrate to a second dielectric layer on the insulating material and the second die, and directly bonding first conductive connectors on the substrate to second conductive connectors on the insulating material and the second die. In an embodiment, the method further includes thinning the substrate to reduce the thickness of the substrate. In an embodiment, the method further includes attaching a package substrate to an opposite side of the redistribution structure as the first device and the second device; and forming an underfill between the redistribution structure and the package substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:

a redistribution structure;

a first device and a second device attached to the redistribution structure, the first device comprising:

a first die;

a substrate bonded to a first surface of the first die; and a second die bonded to a second surface of the first die opposite the first surface, wherein a total height of the first die and the second die is less than a first height of the second device, and wherein a top surface of the substrate is at least as high as a top surface of the second device; and an encapsulant over the redistribution structure and surrounding the first device and the second device, wherein the second device comprises a memory device.

2. The semiconductor package of claim 1, wherein the bond between the substrate and the first die comprises a fusion bond between a first bonding layer on the substrate and a second bonding layer on the first die.

3. The semiconductor package of claim 1, wherein the substrate comprises silicon, ceramic, heat conductive glass, or a metal.

4. The semiconductor package of claim 1, wherein a top surface of the encapsulant is coplanar with the top surface of the substrate.

5. The semiconductor package of claim 1, wherein a second height of the first device is larger than 900 μm.

6. The semiconductor package of claim 1, wherein the substrate comprises a metallization layer on the top surface of the substrate.

7. The semiconductor package of claim 1, further comprising:

a package substrate attached to an opposite side of the redistribution structure as the first device and the second device; and an underfill between the redistribution structure and the package substrate.

8. The semiconductor package of claim 1, wherein the substrate is free of any active or passive devices.

9. A semiconductor package comprising:

a first device and a second device coupled to a redistribution structure, the first device comprising:

a top die;

a bottom die bonded to a first surface of the top die;

a substrate bonded to a second surface of the top die opposite the first surface, wherein a width of the top die is smaller than widths of the substrate and the bottom die; and an insulating material surrounding the top die and disposed between the substrate and the bottom die.

10. The semiconductor package of claim 9, wherein the substrate comprises copper or iron.

11. The semiconductor package of claim 9, wherein a first bond between the substrate and the top die comprises an oxide-to-oxide bond between a first dielectric layer on the substrate and a second dielectric layer on the top die, and a second bond between the substrate and the top die comprises a metal-to-metal bond between a first conductive connector on the substrate and a second conductive connector on the top die.

12. The semiconductor package of claim 9, wherein a height of the second device is greater than a combined height of the top die and the bottom die.

13. The semiconductor package of claim 9, wherein the redistribution structure is coupled to the first device using third conductive connectors disposed on a surface of the bottom die.

14. The semiconductor package of claim 13, further comprising:

an encapsulant surrounding the first device and the second device, wherein a material of the encapsulant is different from the insulating material.

15. A semiconductor package comprising:

a redistribution structure;

a logic device coupled to the redistribution structure; and a memory device coupled to the redistribution structure and adjacent to the logic device, the logic device comprising:

a top die;

a bottom die bonded to a first surface of the top die; and a substrate bonded to a second surface of the top die, wherein a top surface of the logic device and a top surface of the memory device are level.

16. The semiconductor package of claim 15, wherein the substrate is free of any active or passive devices.

17. The semiconductor package of claim 15, wherein bonds between the substrate and the top die comprise an oxide to oxide bond between a first bonding layer on the substrate and a second bonding layer on the top die.

18. The semiconductor package of claim 17, wherein the first bonding layer and the second bonding layer comprise silicon oxide.

19. The semiconductor package of claim 15, further comprising:

a package substrate attached to the redistribution structure, wherein the redistribution structure is disposed between the package substrate, and the logic device and the memory device.

20. The semiconductor package of claim 15, further comprising:

an underfill disposed between the redistribution structure, and the logic device and the memory device; and an encapsulant over the underfill, wherein the encapsulant surrounds the memory device and the logic device.

* * * * *